(12) United States Patent
Patrick et al.

(10) Patent No.: US 12,198,896 B2
(45) Date of Patent: Jan. 14, 2025

(54) COMPACT HIGH DENSITY PLASMA SOURCE

(71) Applicant: Lam Research Corporation, Fremont, CA (US)

(72) Inventors: Roger Patrick, Mountain View, CA (US); Neil M. P. Benjamin, Palo Alto, CA (US); Lee Chen, Cedar Creek, TX (US); Alan Schoepp, Ben Lomond, CA (US); Clint Edward Thomas, Newark, CA (US); Thomas W. Anderson, Hayward, CA (US); Sang Heon Song, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 250 days.

(21) Appl. No.: 17/263,539

(22) PCT Filed: Jul. 26, 2019

(86) PCT No.: PCT/US2019/043659
§ 371 (c)(1),
(2) Date: Jan. 26, 2021

(87) PCT Pub. No.: WO2020/023874
PCT Pub. Date: Jan. 30, 2020

(65) Prior Publication Data
US 2021/0183619 A1    Jun. 17, 2021

Related U.S. Application Data

(60) Provisional application No. 62/832,191, filed on Apr. 10, 2019, provisional application No. 62/703,856, filed on Jul. 26, 2018.

(51) Int. Cl.
*H01J 37/32* (2006.01)
*H01L 21/02* (2006.01)

(52) U.S. Cl.
CPC ..... *H01J 37/3211* (2013.01); *H01J 37/32137* (2013.01); *H01J 37/32174* (2013.01); *H01L 21/0228* (2013.01)

(58) Field of Classification Search
CPC ........ H01Q 1/36; H01Q 9/42; H01L 21/0228; H01L 21/67063; C23C 16/505;
(Continued)

(56) References Cited

U.S. PATENT DOCUMENTS 5,309,063 A * 5/1994 Singh .................... H01J 37/321
                                                              315/111.41
5,587,038 A * 12/1996 Cecchi .................. H01J 37/321
                                                                  427/571

(Continued)

FOREIGN PATENT DOCUMENTS

| JP | 2007220594 | 8/2007 |
|----|------------|--------|
| JP | 2013161715 | 8/2013 |
| WO | 2015050782 | 4/2015 |

OTHER PUBLICATIONS

PCT International Search Report and Written Opinion of the International Searching Authority issued in corresponding International Patent Application No. PCT/2019/043659 on Jul. 26, 2019 (PCT Forms ISA 220, 210, 237 (12 total pages).

*Primary Examiner* — Benjamin Kendall
*Assistant Examiner* — Joshua Reyes
(74) *Attorney, Agent, or Firm* — PENILLA IP, APC

(57) ABSTRACT

An RF antenna is configured, when powered, to inductively generate plasma in a process region of a chamber, including: an array of parallel conductive lines that are oriented along a plane, the array including a first conductive line, a second conductive line, a third conductive line, and a fourth conductive line; wherein the first and second conductive lines are adjacent, wherein the second and third conductive lines are adjacent, and wherein the third and fourth conductive (Continued)

lines are adjacent; wherein when the RF antenna is powered, current flow in the adjacent first and second conductive lines occurs in an opposite direction, current flow in the adjacent second and third conductive lines occurs in a same direction, current flow in the adjacent third and fourth conductive lines occurs in an opposite direction.

11 Claims, 54 Drawing Sheets

(58) Field of Classification Search
CPC ......... C23C 16/45525; C23C 16/45565; H01J 37/321; H01J 37/3211; H01J 37/32119; H01J 37/32137; H01J 37/32165; H01J 37/32174

See application file for complete search history.

(56) References Cited

U.S. PATENT DOCUMENTS

| | | | |
|---|---|---|---|
| 6,155,199 A * | 12/2000 | Chen | H01J 37/32174 |
| | | | 118/723 R |
| 9,472,378 B2 * | 10/2016 | Knyazik | H01J 37/3211 |
| 10,083,817 B1 * | 9/2018 | Godyak | H01S 3/0975 |
| 2001/0022158 A1 * | 9/2001 | Brcka | H01J 37/321 |
| | | | 156/345.48 |
| 2004/0060662 A1 * | 4/2004 | Yeom | H01J 37/3266 |
| | | | 156/345.48 |
| 2004/0083971 A1 * | 5/2004 | Holland | H01J 37/321 |
| | | | 118/721 |
| 2004/0221814 A1 * | 11/2004 | Yeom | H01J 37/321 |
| | | | 118/723 I |
| 2005/0103443 A1 * | 5/2005 | Ishii | H01J 37/321 |
| | | | 156/345.48 |
| 2005/0252610 A1 * | 11/2005 | Miyagawa | H01J 37/321 |
| | | | 156/345.44 |
| 2008/0223521 A1 * | 9/2008 | Kim | H01J 37/321 |
| | | | 156/345.1 |
| 2010/0066251 A1 * | 3/2010 | Nakagami | H01J 37/32174 |
| | | | 315/111.51 |
| 2010/0156300 A1 * | 6/2010 | Lin | H01J 37/321 |
| | | | 315/111.51 |
| 2011/0297089 A1 * | 12/2011 | Ueda | H01L 31/1804 |
| | | | 118/620 |
| 2015/0129133 A1 * | 5/2015 | Suh | H01J 37/32568 |
| | | | 118/723 R |
| 2016/0099130 A1 * | 4/2016 | Ando | H01J 37/32522 |
| | | | 315/111.21 |

* cited by examiner

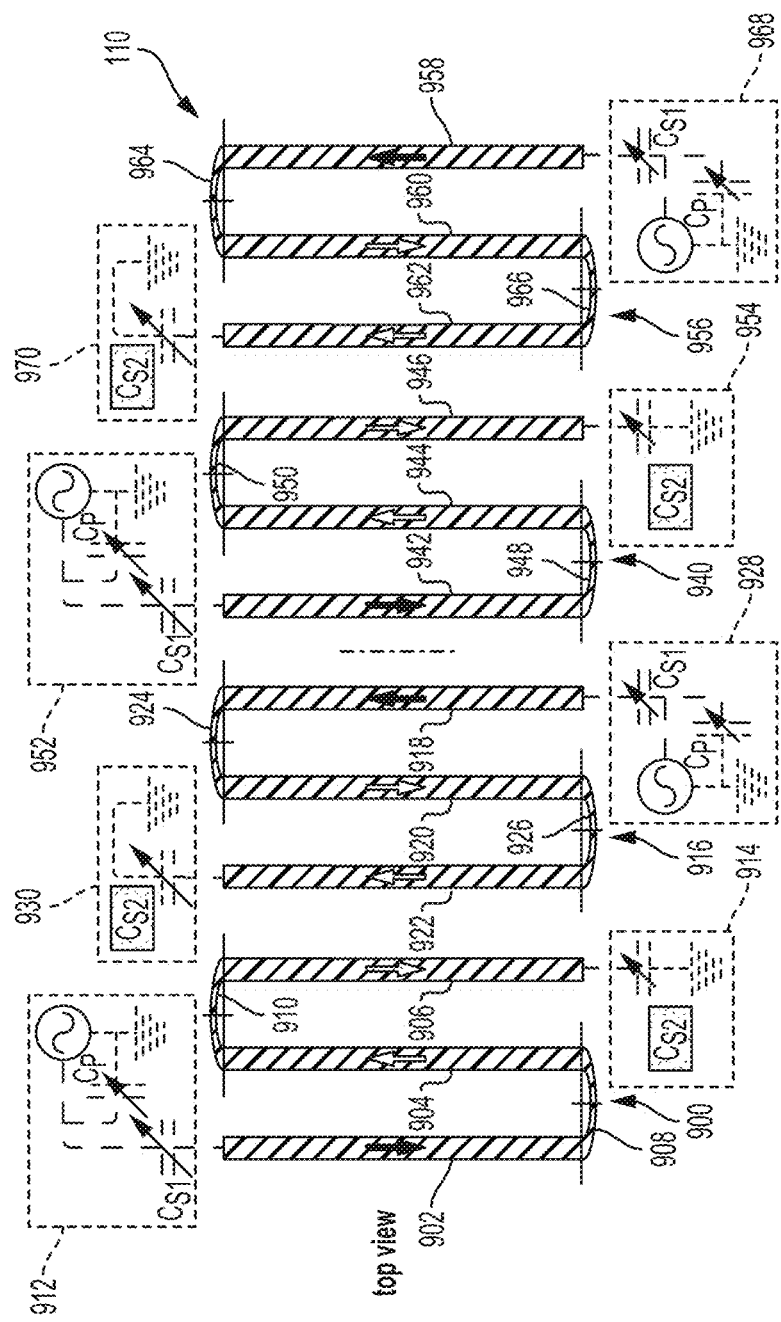
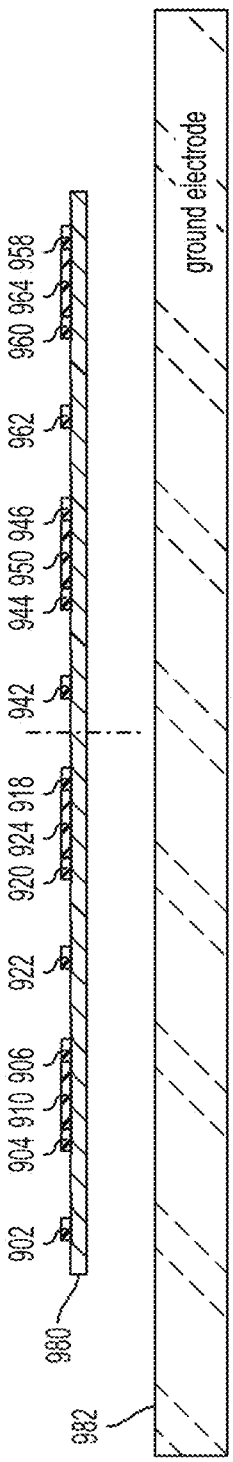
FIG. 9A
FIG. 9B

Proto-0: 2.4µH, 1" pitch, 0.25"-width

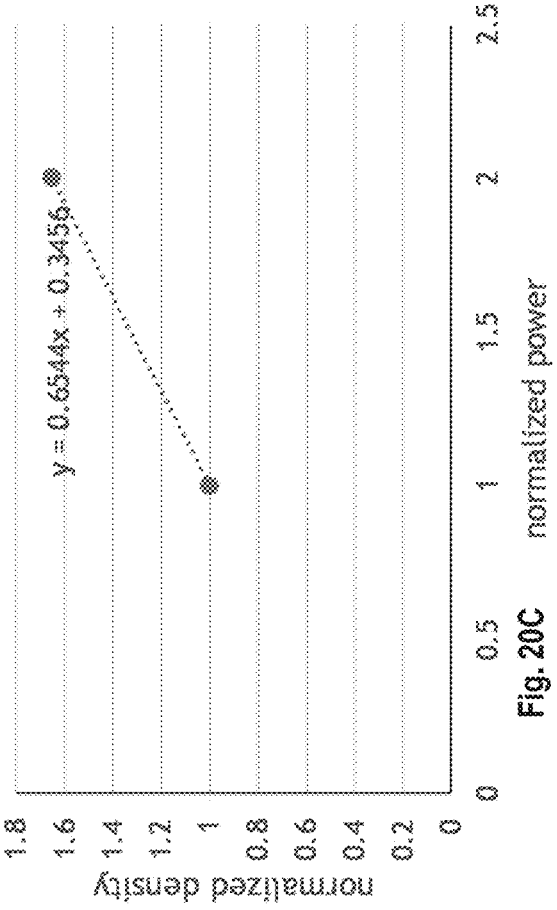
Fig. 20B
Fig. 20C
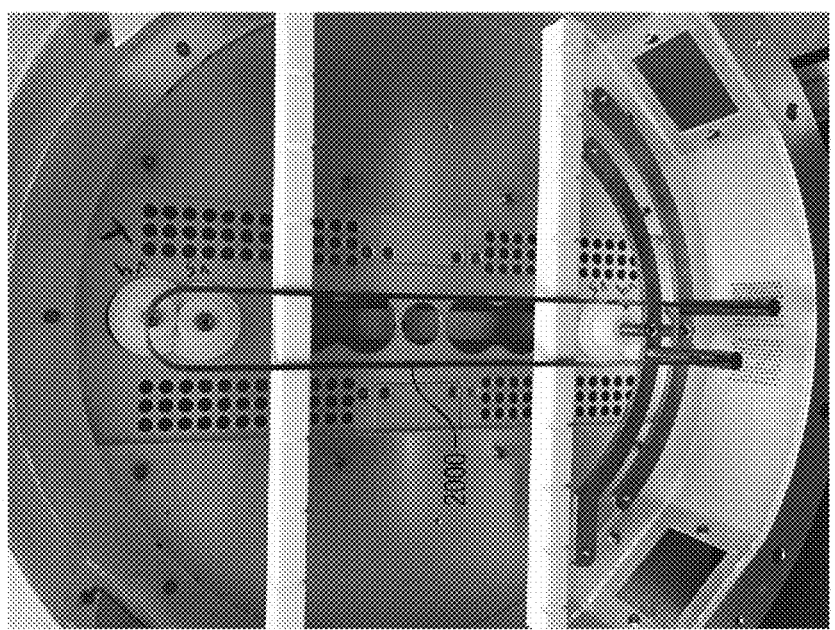
Fig. 20A

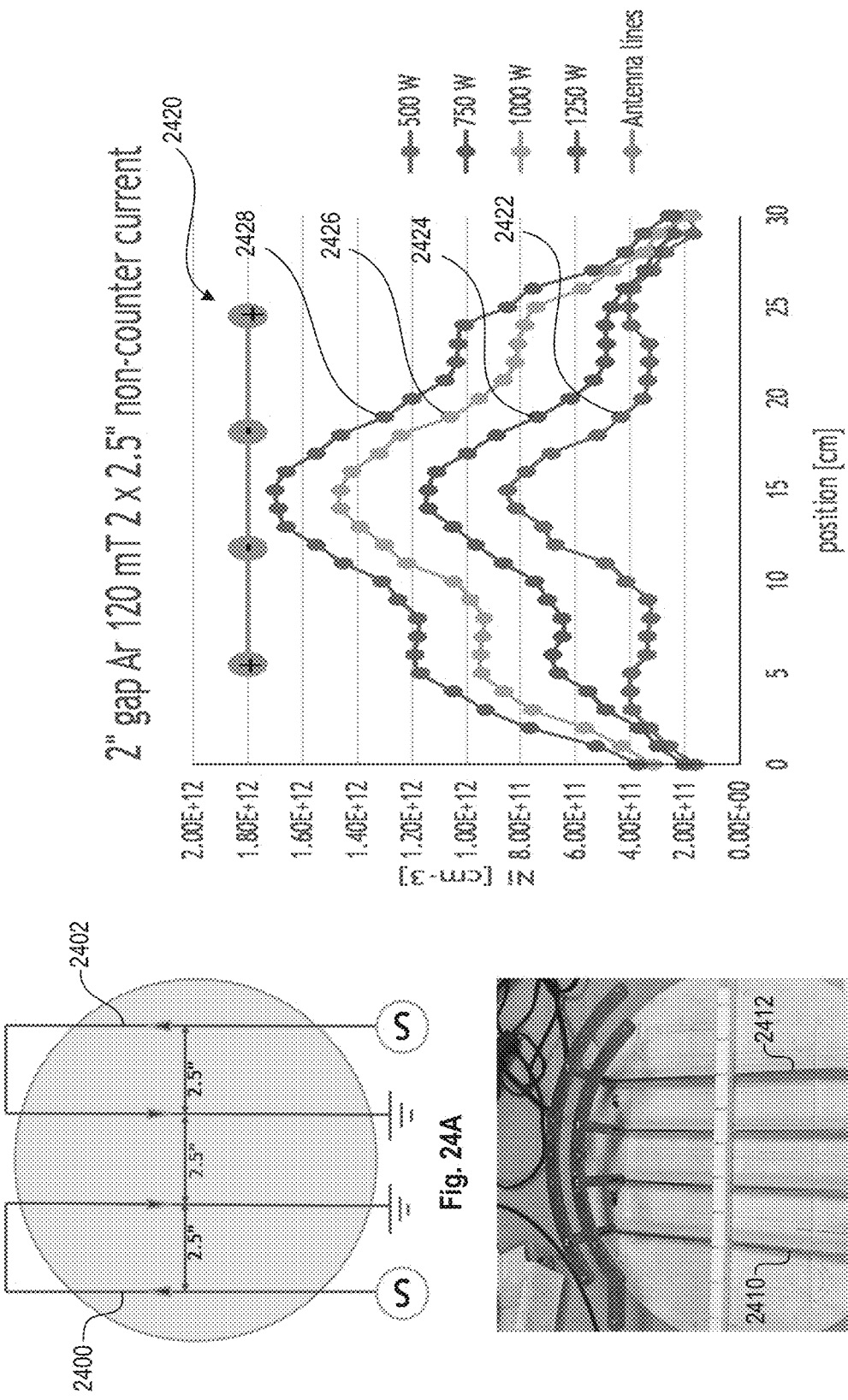

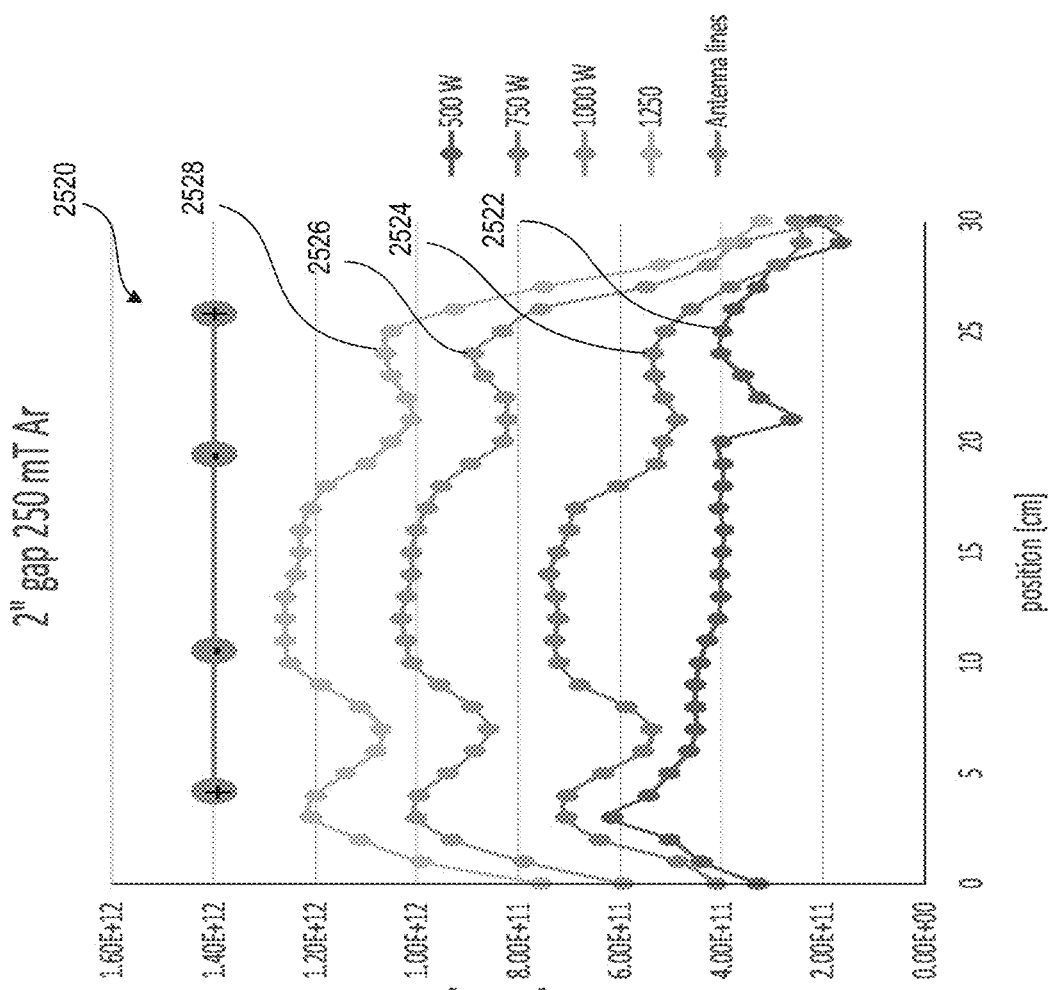
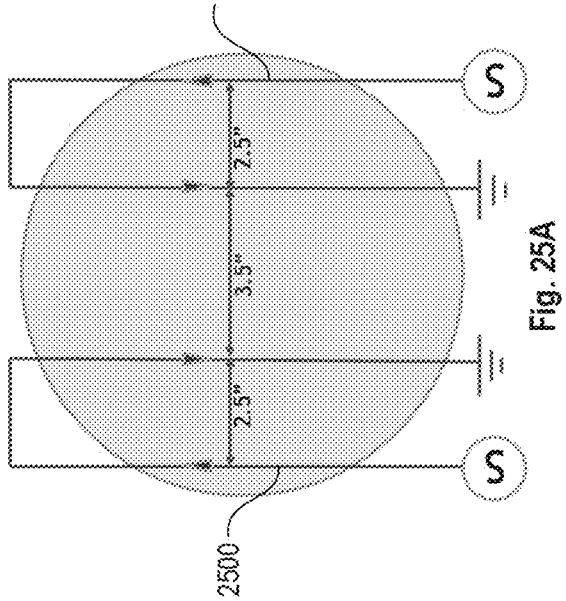
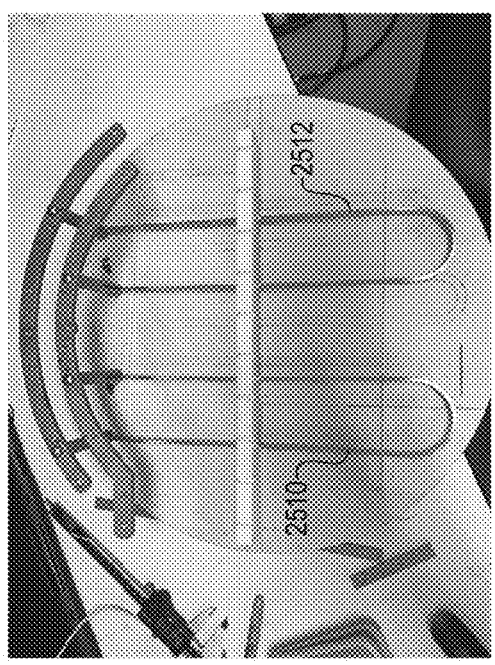

COMPACT HIGH DENSITY PLASMA SOURCE

CLAIM OF PRIORITY

This application is a national stage filing of and claims priority, under 35 U.S.C. § 371, to PCT/US2019/043659, filed on Jul. 26, 2019, and titled "COMPACT HIGH DENSITY PLASMA SOURCE," which claims the benefit of and priority, under 35 U.S.C. § 119 (e), to U.S. Provisional Patent Application No. 62/703,856, filed on Jul. 26, 2018, and titled "COMPACT HIGH DENSITY PLASMA SOURCE," and U.S. Provisional Patent Application No. 62/832,191, filed on Apr. 10, 2019, and titled "COMPACT HIGH DENSITY PLASMA SOURCE," both of which are incorporated by reference herein in their entirety.

BACKGROUND

Atomic layer deposition (ALD) is a vapor deposition technique capable of providing highly conformal thin films with atomic scale control. A typical ALD process involves a series of two half-reactions that are separated by purge operations. Thus, one cycle of an ALD process can include the following steps: (1) exposure of a substrate surface to a first reactant, wherein the exposure is self-limiting so as to deposit a single atomic layer of the first reactant; (2) purging of the process chamber with an inert gas to remove any remaining quantities of the first reactant and/or byproducts; (3) exposure of the substrate surface to a second reactant that reacts with the deposited first reactant to form the thin film product; (4) purging of the process chamber with an inert gas to remove any remaining quantities of the second reactant and/or byproducts. The ALD cycle can be repeated for a desired number of iterations to build up the thickness of the thin film product. Because a single ALD cycle typically deposits a single atomic layer of the product material, ALD is capable of providing highly controlled thicknesses of conformal thin film.

In some ALD processes, a plasma is employed for either of the half-reactions. It is desirable to use high density plasma in order to achieve high quality film deposition by ALD. However, existing chambers do not provide high density plasma in a small volume process space conducive for ALD. Current inductively coupled plasma (ICP) systems (or transformer coupled plasma (TCP) systems) are designed with a large process space over the substrate (e.g. on the order of a 6 inch (approximately 15 cm) vertical gap over the substrate). The large process space is necessary to accommodate the reach of the global magnetic field generated by the TCP coil, and to minimize the effects of non-uniformity of the plasma distribution. However, such a large process space is not conducive for ALD processes due to the amount of time required to cycle gases into and out of the process chamber, which negatively impacts throughput, especially when the ALD cycle is repeated many times.

Also, similar challenges apply to atomic layer etch (ALE) processes.

It is in this context that implementations of the disclosure arise.

SUMMARY

In some implementations, an RF antenna is configured, when powered, to inductively generate plasma in a process region of a chamber, including: an array of parallel conductive lines that are oriented along a plane, the array including a first conductive line, a second conductive line, a third conductive line, and a fourth conductive line; wherein the first and second conductive lines are adjacent, wherein the second and third conductive lines are adjacent, and wherein the third and fourth conductive lines are adjacent; wherein when the RF antenna is powered, current flow in the adjacent first and second conductive lines occurs in an opposite direction, current flow in the adjacent second and third conductive lines occurs in a same direction, current flow in the adjacent third and fourth conductive lines occurs in an opposite direction.

In some implementations, the RF antenna includes a first segment that includes the first and second conductive lines connected to each other in series; wherein the RF antenna includes a second segment that includes the third and fourth conductive lines connected to each other in series.

In some implementations, the first segment is not connected to the second segment, so that conductive lines of the first segment are not connected to conductive lines of the second segment.

In some implementations, each of the first and second segments includes a first end configured to receive RF power and a second end configured to be connected to ground.

In some implementations, adjacent conductive lines of a given segment are connected to each other in series by an end connector.

In some implementations, the end connector is configured to produce a change in direction of current flow by enabling current flow between the adjacent conductive lines of the given segment.

In some implementations, each given segment has a unitary structure formed as a single piece that includes the end connector and the adjacent conductive lines of the given segment.

In some implementations, the current flow in the adjacent first and second conductive lines occurring in opposite directions defines a first local counter current inductive array; wherein the current flow in the adjacent third and fourth conductive lines occurring in opposite directions defines a second local counter current inductive array.

In some implementations, the conductive lines are configured to occupy an area that covers a surface of a substrate when present in the chamber.

In some implementations, the area occupied by the conductive lines is a substantially circular area.

In some implementations, the conductive lines are substantially straight.

In some implementations, the conductive lines have a vertical thickness in the range of approximately 0.1 to 1 inch.

In some implementations, the conductive lines have a horizontal width in the range of approximately 0.1 to 0.5 inches.

In some implementations, the first and second conductive lines are spaced at approximately 2 to 3 inches, wherein the second and third conductive lines are spaced at approximately 3 to 4 inches, and wherein the third and fourth conductive lines are spaced at approximately 2 to 3 inches.

In some implementations, a radio frequency (RF) antenna for use in an inductive plasma chamber is provided, including: a first hairpin-shaped conductive line having a powered end and a grounded end; a second hairpin-shaped conductive line having a powered end and a grounded end; wherein an RF power source is connectable to the powered end of the first and second hairpin-shaped conductive lines and said grounded ends are connectable to ground; wherein the first hairpin-shaped conductive line is arranged adjacent to and in a parallel orientation to the second hairpin-shaped conductive line, such that the RF antenna is configured to be disposed over a processing region of the chamber.

In some implementations, the powered ends and grounded ends of the first and second hairpin-shaped conductive lines are connected to said RF power source to produce a current in each of the first and second hairpin-shaped conductive lines, the current in adjacent segments of the first and second hairpin-shaped conductive lines flowing in either a same direction or an opposite direction, when said RF power source is active to produce said current.

In some implementations, the powered ends and grounded ends of the first and second hairpin-shaped conductive lines are connected to said RF power source to produce a current in each of the first and second hairpin-shaped conductive lines, the current in inner adjacent segments of the first and second hairpin-shaped conductive lines flowing in a same direction, when said RF power source is active to produce said current.

In some implementations, opposite segments to the inner adjacent segments of the first and second hairpin-shaped conductive lines flow said current in a same direction, when said RF power source is active to produce said current.

In some implementations, the first hairpin-shaped conductive line defines a first pair of parallel segments that are spaced apart by about 5 to 8 centimeters (about 2 to 3 inches); wherein the second hairpin-shaped conductive line defines a second pair of parallel segments that are spaced apart by about 5 to 8 centimeters (about 2 to 3 inches).

In some implementations, inner adjacent segments of the first and second hairpin-shaped conductive lines are spaced apart by about 7 to 10 centimeters (about 3 to 4 inches).

In some implementations, a radio frequency (RF) antenna for use in an inductive plasma chamber is provided, comprising: a first hairpin-shaped conductive line having a powered end and a grounded end; a second hairpin-shaped conductive line having a powered end and a grounded end; a third hairpin-shaped conductive line having a powered end and a grounded end; wherein at least one RF power source is connectable to the powered end of the first, second, and third hairpin-shaped conductive lines and said grounded ends are connectable to ground; wherein the first hairpin-shaped conductive line is arranged adjacent to and in a parallel orientation to the second hairpin-shaped conductive line, and the second hairpin-shaped conductive line is arranged adjacent to and in a parallel orientation to the third hairpin-shaped conductive line, such that the RF antenna is configured to be disposed over a processing region of the chamber.

In some implementations, the powered ends and grounded ends of the first, second, and third hairpin-shaped conductive lines are connected to said at least one RF power source to produce a current in each of the first, second, and third hairpin-shaped conductive lines, the current in adjacent segments of the first, second, and third hairpin-shaped conductive lines flowing in either a same direction or an opposite direction, when said at least one RF power source is active to produce said current.

In some implementations, the powered ends and grounded ends of the first, second, and third hairpin-shaped conductive lines are connected to said at least one RF power source to produce a current in each of the first, second, and third hairpin-shaped conductive lines, the current in inner adjacent segments of the first and second hairpin-shaped conductive lines flowing in a same direction, the current in inner adjacent segments of the second and third hairpin-shaped conductive lines flowing in a same direction, when said RF power source is active to produce said current.

In some implementations, opposite segments to the inner adjacent segments of the first and second hairpin-shaped conductive lines flow said current in a same direction, wherein opposite segments to the inner adjacent segments of the second and third hairpin-shaped conductive lines flow said current in a same direction, when said RF power source is active to produce said current.

In some implementations, the powered ends and grounded ends of the first, second, and third hairpin-shaped conductive lines are connected to said at least one RF power source to produce a current in each of the first, second, and third hairpin-shaped conductive lines, the current in inner adjacent segments of the first and second hairpin-shaped conductive lines flowing in opposite directions, the current in inner adjacent segments of the second and third hairpin-shaped conductive lines flowing in opposite directions, when said RF power source is active to produce said current.

In some implementations, opposite segments to the inner adjacent segments of the first and second hairpin-shaped conductive lines flow said current in opposite directions, wherein opposite segments to the inner adjacent segments of the second and third hairpin-shaped conductive lines flow said current in opposite directions, when said RF power source is active to produce said current.

In some implementations, the first hairpin-shaped conductive line defines a first pair of parallel segments that are spaced apart by about 2 to 8 centimeters (about 1 to 3 inches); wherein the second hairpin-shaped conductive line defines a second pair of parallel segments that are spaced apart by about 2 to 8 centimeters (about 1 to 3 inches); wherein the third hairpin-shaped conductive line defines a third pair of parallel segments that are spaced apart by about 2 to 8 centimeters (about 1 to 3 inches).

In some implementations, adjacent segments of the first, second, and third hairpin-shaped conductive lines are spaced apart by about 2 to 8 centimeters (about 1 to 3 inches).

In one embodiment, a radio frequency (RF) antenna for use in an inductive a chamber is disclosed. The RF antenna includes a first hairpin-shaped conductive line having a powered end and a grounded end, and a second hairpin-shaped conductive line having a powered end and a grounded end. An RF power source is connectable to the powered end of the first and second hairpin-shaped conductive lines and said grounded ends are connectable to ground. The first hairpin-shaped conductive line is arranged adjacent to and in a parallel orientation to the second hairpin-shaped conductive line. The RF antenna is configured to be disposed over a processing region of the chamber.

In some embodiments, the powered ends and grounded ends of the first and second hairpin-shaped conductive lines are connected to said RF power source to produce a current in each of the first and second hairpin-shaped conductive lines, and the current in adjacent segments of the first and second hairpin-shaped conductive lines is configured to flow in either a same direction or an opposite direction, when said RF power source is active to produce said current.

In some embodiments, the powered ends and grounded ends of the first and second hairpin-shaped conductive lines are connected to said RF power source to produce a current in each of the first and second hairpin-shaped conductive lines. The current in inner adjacent segments of the first and second hairpin-shaped conductive lines is configured to flow in a same direction, when said RF power source is active to produce said current. In one embodiment, opposite segments to the inner adjacent segments of the first and second hairpin-shaped conductive lines flow said current in a same direction, when said RF power source is active to produce said current.

In some implementations, an RF antenna is configured, when powered, to inductively generate plasma in a process region of a chamber, including: an array of parallel conductive lines that are oriented along a plane; wherein the RF antenna includes two or more discrete segments, each segment including two or more of the conductive lines that are connected to each other in series 2. The RF antenna of claim 1, wherein when the RF antenna is powered, current flow in adjacent conductive lines occurs in one of a same direction or an opposite direction to form a local same-direction current or a local counter current.

In some implementations, the current flow in adjacent conductive lines occurring in opposite directions defines a counter current inductive array, such that magnetic fields generated by each of the conductive lines are respectively localized to each of the conductive lines.

In some implementations, when the RF antenna is powered, current flow in at least two adjacent conductive lines occurs in a same direction.

In some implementations, when the RF antenna is powered, current flow in at least two adjacent conductive lines occurs in opposite directions.

In some implementations, each segment is not connected to another segment, so that conductive lines of a given segment are not connected to conductive lines of another segment.

In some implementations, each segment includes a first end configured to receive RF power and a second end configured to be connected to ground.

In some implementations, adjacent conductive lines of a given segment are connected to each other in series by an end connector.

In some implementations, the end connector is configured to produce a change in direction of current flow by enabling current flow between the adjacent conductive lines of the given segment.

In some implementations, the given segment has a unitary structure formed as a single piece that includes the end connector and the adjacent conductive lines of the given segment.

In some implementations, the conductive lines are configured to occupy an area that covers a surface of a substrate when present in the chamber.

In some implementations, the area occupied by the conductive lines is a substantially circular area.

In some implementations, the conductive lines are substantially straight.

In some implementations, the conductive lines have a vertical thickness in the range of approximately 0.01 to 0.02 inches.

In some implementations, the conductive lines have a horizontal width in the range of approximately 0.1 to 0.5 inches.

In some implementations, the conductive lines are equally spaced at a pitch of approximately 0.5 to 2 inches, and wherein the conductive lines are embedded within an insulating material.

In some implementations, an RF antenna is configured, when powered, to inductively generate plasma in a process region of a chamber, including: an array of equally spaced parallel conductive lines that are oriented along a plane; wherein each pair of adjacent conductive lines of the array is connected in series by a connector, so that when the RF antenna is powered, current flow in adjacent conductive lines of each pair occurs in opposite directions to form a local counter current; wherein for a given connector, at least a portion of the given connector is not oriented along the plane along which the conductive lines are oriented.

In some implementations, the each pair of adjacent conductive lines being connected in series by a connector defines a plurality of connectors, including a first set of connectors along a first side of the RF antenna, and a second set of connectors along a second side of the RF antenna opposite the first side, the connectors of the first set being staggered with the connectors of the second set to enable connection of the conductive lines in series.

In some implementations, the first set of connectors are substantially oriented along one or more second planes that are not parallel to the plane along which the conductive lines are oriented; wherein the second set of connectors are substantially oriented along one or more third planes that are not parallel to the plane along which the conductive lines are oriented.

In some implementations, the one or more second planes are each substantially perpendicular to the plane along which the conductive lines are oriented; wherein the one or more third planes are each substantially perpendicular to the plane along which the conductive lines are oriented.

In some implementations, each connector has a curved or semicircular shape.

In some implementations, the RF antenna includes a first end configured to receive RF power and a second end configured to be connected to ground.

In some implementations, the given connector is configured to produce a change in direction of current flow by enabling current flow between the adjacent conductive lines that are connected by the given connector.

In some implementations, the RF antenna has a unitary structure formed as a single piece that includes the conductive lines.

In some implementations, the conductive lines are configured to occupy an area that covers a surface of a substrate when present in the chamber.

In some implementations, the area occupied by the conductive lines is a substantially circular area.

In some implementations, the conductive lines are substantially straight.

In some implementations, the conductive lines have a vertical thickness in the range of approximately 0.01 to 0.02 inches.

In some implementations, the conductive lines have a horizontal width in the range of approximately 0.1 to 0.5 inches.

In some implementations, the conductive lines are equally spaced at a pitch of approximately 0.5 to 2 inches.

In some implementations, the conductive lines are embedded within an insulating material.

In some implementations, a plasma chamber is provided, including: an RF antenna having a plurality of equally spaced parallel conductive lines that are oriented along a plane, wherein when the RF antenna is powered, current flow in adjacent conductive lines occurs in opposite directions, the RF antenna being positioned above a process space of the plasma chamber in which plasma is generated; a plurality of grounded induction lines disposed within the process space, wherein each of the grounded induction lines is positioned below a corresponding one of the conductive lines, the grounded induction lines being configured to be inductively powered when the RF antenna is powered, and the grounded induction lines further being configured to inductively generate plasma within the process space when inductively powered.

In some implementations, the grounded induction lines are connected to each other, forming a one-piece structure that is connected to ground.

In some implementations, the plasma chamber further includes: a dielectric window; wherein the RF antenna is positioned over the dielectric window; wherein the grounded induction lines are disposed below the dielectric window.

In some implementations, the RF antenna includes two or more discrete segments, each segment including two or more of the conductive lines that are connected to each other in series.

In some implementations, each segment includes a first end configured to receive RF power and a second end configured to be connected to ground.

In some implementations, adjacent conductive lines of a given segment are connected to each other in series by an end connector, the end connector being configured to produce a change in direction of current flow by enabling current flow between the adjacent conductive lines of the given segment.

In some implementations, the given segment has a unitary structure formed as a single piece that includes the end connector and the adjacent conductive lines of the given segment.

In some implementations, the grounded induction lines have a thickness in the range of approximately 0.2 to 1 inches.

In some implementations, the grounded induction lines have a width in the range of approximately 0.2 to 1 inches.

In some implementations, an RF antenna is provided that is configured, when powered, to inductively generate plasma in a process region of a process chamber, including: a first set of conductive lines that are parallel to one another and coplanar along a first horizontal plane, the first set of conductive lines being disposed over a dielectric window of a process chamber, the first horizontal plane being at a first height above the dielectric window; a second set of conductive lines that are parallel to one another and coplanar along a second horizontal plane, the second horizontal plane being parallel to the first horizontal plane, the second horizontal plane being at a second height above the dielectric window that is greater than the first height, each conductive line of the second set of conductive lines being disposed substantially over and parallel to a respective conductive line of the first set of conductive lines.

In some implementations, each of the conductive lines of the first set and the second set is substantially straight over a region defined by a wafer when present in the process chamber.

In some implementations, for each of the conductive lines of the first set and second set, current in a given conductive line of the first set flows in a substantially same direction as current in the conductive line of the second set that is substantially over the given conductive line of the first set.

In some implementations, at least one conductive line of the first set is electrically connected to at least one conductive line of the second set.

In some implementations, current in at least one pair of adjacent conductive lines of the first set flows in substantially opposite directions.

In some implementations, current in at least one pair of adjacent conductive lines of the first set flows in substantially the same direction.

In some implementations, the RF antenna is defined by two or more looped structures, each looped structure including two adjacent conductive lines of the first set and, two adjacent conductive lines of the second set that are respectively disposed over the two adjacent conductive lines of the first set.

In some implementations, each looped structure is formed from a single continuous length of a conductive material.

In some implementations, the each looped structure is configured so that current flow in the two adjacent conductive lines of the first set occurs in opposite directions, and current flow in the two adjacent conductive lines of the second set occurs in opposite directions.

In some implementations, the each looped structure is configured so that for each one of the two adjacent conductive lines of the first set, current flow occurs in a same direction as a respective one of the two adjacent conductive lines of the second set that is disposed over the one of the two adjacent conductive lines of the first set.

In some implementations, the looped structure further includes a first connector that connects the two adjacent conductive lines of the first set, a second connector that connects the two adjacent conductive lines of the second set, and a third connector that connects one of the two adjacent conductive lines of the first set to one of the two adjacent conductive lines of the second set that is not disposed over the one of the two adjacent conductive lines of the first set.

In some implementations, the looped structures receive power from a single RF source.

In some implementations, each of the looped structures receives power from a separate RF source.

In some implementations, an RF antenna is provided that is configured, when powered, to inductively generate plasma in a process region of a process chamber, including: a plurality of line pairs disposed over a dielectric window of a process chamber, each line pair including two horizontally oriented conductive lines that are parallel and vertically stacked; wherein the plurality of line pairs are parallel to each other.

In some implementations, current flow in conductive lines of a given line pair occurs in a same direction.

In some implementations, the conductive lines of the plurality of line pairs are substantially straight.

In some implementations, lower ones of the conductive lines of the line pairs are disposed along a first horizontal plain at a first height above the dielectric window.

In some implementations, upper ones of the conductive lines of the line pairs are disposed along a second horizontal plain at a second height above the dielectric window that is greater than the first height.

Other aspects and advantages of the disclosures herein will become apparent from the following detailed description, taken in conjunction with the accompanying drawings, which illustrate by way of example the principles of the disclosures.

BRIEF DESCRIPTION OF THE DRAWINGS

FIG. 9A illustrates an overhead view of an RF antenna 110 having multiple double reverse hairpin segments, in accordance with implementations of the disclosure.

FIG. 9B is a cross-section view of the implementation of FIG. 9A, in accordance with implementations of the disclosure.

FIGS. 20A, 20B, and 20C illustrate a hairpin segment for an RF antenna and corresponding experimental results, in accordance with implementations of the disclosure.

FIGS. 24A, 24B, and 24C illustrate an RF antenna and corresponding experimental results, in accordance with implementations of the disclosure.

FIGS. 25A, 25B, and 25C illustrate an RF antenna and corresponding experimental results, in accordance with implementations of the disclosure.

DETAILED DESCRIPTION

In the following description, numerous specific details are set forth in order to provide a thorough understanding of the example implementations. However, it will be apparent to one skilled in the art that the example implementations may be practiced without some of these specific details. In other instances, process operations and implementation details have not been described in detail, if already well known.

As used herein, the terms "about" and "approximately" mean that the specified parameter can be varied within a reasonable tolerance, e.g., ±10% in some implementations, ±15% in some implementations, or ±20% in some implementations.

Some implementations of the present disclosure provide a radio frequency (RF) antenna that is configured, when powered, to define a counter current inductor that generates localized magnetic fields for plasma generation. The RF antenna of the present disclosure enables generation of high density plasma (e.g. $1 \times 10^{11}$ per cubic cm or greater in some implementations) with high distribution uniformity in a small volume process space, thereby enabling ALD/ALE in a high density plasma system. At present, ALD/ALE is not performed in high density plasma systems, due to the large process space and the excessive amount of time required to pump gases into, and purge gases from, the process space, which is prohibitive for purposes of throughput.

However, implementations of the present disclosure overcome these challenges by enabling localized fields and plasma generation in a small process space (e.g. approximately 3 inch (approximately 7.5 cm) vertical gap or less in some implementations, approximately 1 inch (approximately 2.5 cm) vertical gap or less in some implementations). With such a small process space, it is possible to achieve a low residence time of process gases in the chamber, enabling reduction in the ALD/ALE cycle time as the time required to move gases into and out of the chamber is reduced.

Broadly speaking, implementations of the present disclosure provide an RF antenna that includes an array of equally spaced parallel conductive lines that are oriented along a plane. When the RF antenna is powered, current flow in adjacent conductive lines occurs in opposite directions, thereby forming a counter current inductive array that inductively generates plasma in the process space/region of the chamber. The counter current inductive array is such that magnetic fields generated by each of the conductive lines are respectively localized to their originating conductive lines.

In some implementations, portions of the conductive lines are connected in series to enable the change in direction of current flow between adjacent conductive lines, as described further below.

Figure 1A:
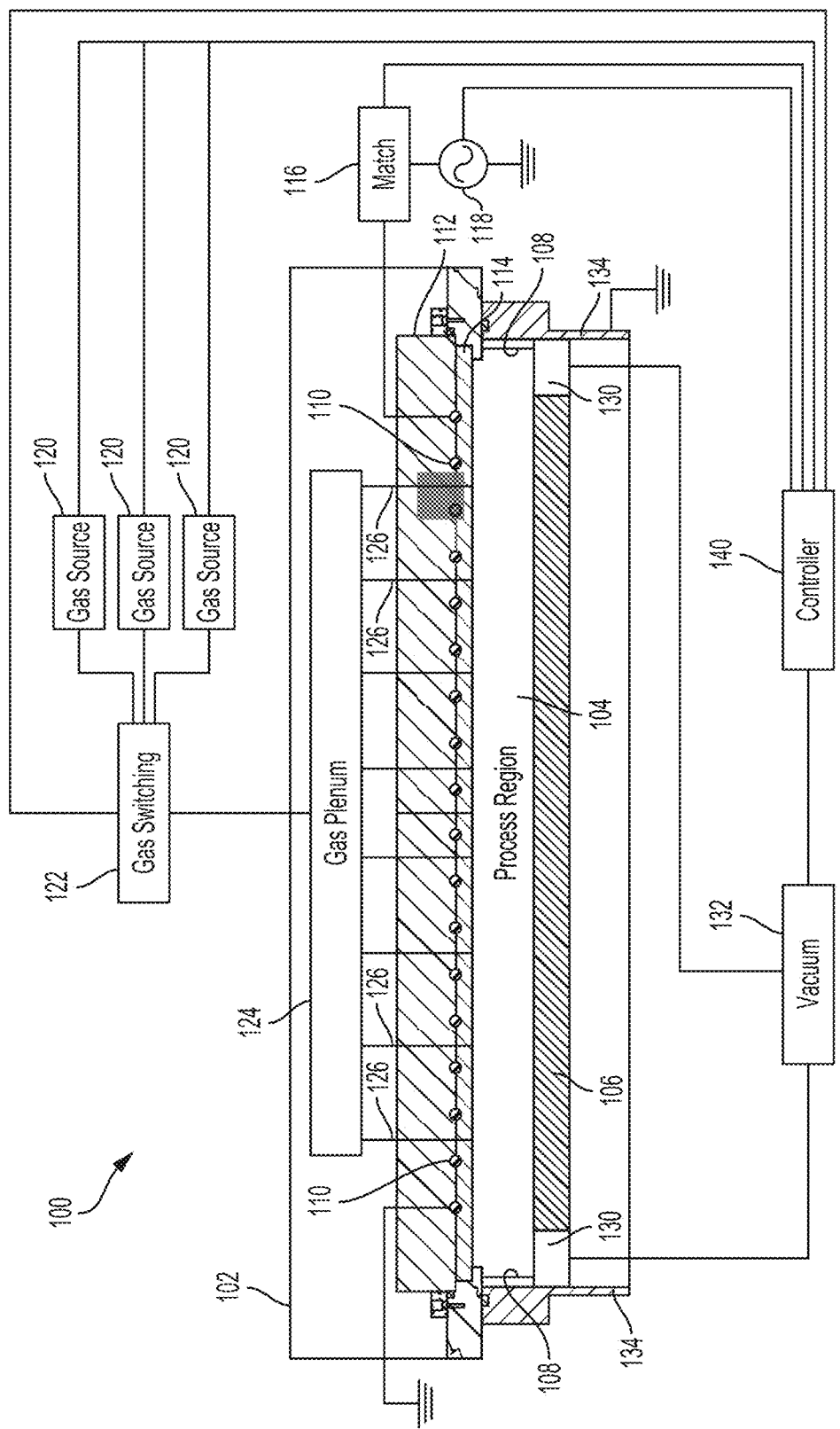
FIG. 1A is a cross-sectional schematic diagram illustrating a plasma processing system 100, in accordance with implementations of the disclosure.

FIG. 1A is a cross-sectional schematic diagram illustrating a plasma processing system 100, in accordance with implementations of the disclosure. The plasma processing system 100 includes a process chamber 102 that is configured to receive a substrate for plasma processing. The componentry of the process chamber 102 encloses and defines a process region 104, which is a space or volume in which plasma is generated for substrate processing. A pedestal 106 is configured to support the substrate (e.g. a wafer) so that the process region is defined over the substrate during processing.

An RF antenna 110 includes an array of conductive lines, which are shown in cross section in the illustrated implementation. The RF antenna 110 is powered by an RF source 118 through a match 116, and also connected to ground. In some implementations, as further described below, the RF antenna 110 is composed of several individual segments, with each segment being powered (by individual or shared power source(s)) and connected to ground.

In some implementations, the RF antenna 110 is disposed between a top insulator 112 and a bottom insulator 114. A side insulator 108 is also provided, which defines the internal sidewalls of the process region 104.

Process gases are provided from a plurality of gas sources 120, e.g. including a first reactant gas source for supplying the first reactant for the first half-reaction of the ALD process, a second reactant gas source for supplying the second reactant for the second half-reaction of the ALD process, and an inert gas source for supplying an inert gas for purging the process region 104 of the process chamber 102. A gas switching module 122 is configured to manage the delivery of process gases from the gas sources 120 to the process chamber 102. The gas switching module 122 may include a plurality of controllable valves and/or flow controllers to control the delivery of the process gases.

Process gases are delivered to a gas plenum 124. From the gas plenum 124, in some implementations, the process gases are routed into the process region 104 through a plurality of injectors 126. The injectors 126 can define throughholes through the top and bottom insulators, and the injectors 126 can be horizontally distributed above the process region 104 so that process gases can be simultaneously introduced and evenly distributed throughout the process region 104.

While a plurality of injectors are shown in the illustrated implementation, in other implementations, other hardware configurations can be employed to deliver process gases to the process region 104. In some implementations, a center injector and/or side injectors are provided to deliver process gases into the process region 104.

Gases (e.g. process gases, inert gas, reaction byproducts, etc.) are evacuated from the process region 104 through a baffle 130 by a vacuum pump 132. It will be appreciated that the process region 104 can be maintained under vacuum by the vacuum pump 132.

The process chamber 102 includes outer sidewalls 134 that are grounded.

Although not all specifically shown in detail, the process chamber 102 is typically coupled to facilities when installed in either a clean room or a fabrication facility. Facilities include plumbing that provide, among other things, processing gases, vacuum, temperature control, and environmental particle control. These facilities are coupled to the process chamber 102, when installed in the target fabrication facility. Additionally, process chamber 102 may be coupled to a transfer chamber that will enable robotics to transfer substrates (e.g. semiconductor wafers) into and out of process chamber 102 using automation.

A programmable controller 140 is provided for controlling the operation of the process chamber 102 and its associated components, including, by way of example without limitation, the RF source 118 and match 116, the gas switching module 122, and the vacuum pump 132. Broadly speaking, the controller 108 can be programmed to execute a chamber operation defined by a recipe. A given recipe may specify various parameters for the operation, such as the application of power to the RF antenna, the flow of gas into the chamber, and the application of vacuum. It should be appreciated that the timing, duration, magnitude, or any other adjustable parameter or controllable feature can be defined by a recipe and carried out by the controller to control the operation of the process chamber 102 and its associated components. Additionally, a series of recipes may be programmed into the controller 140. In one implementation, the recipe is configured to process ALD operations.

Figure 1B:
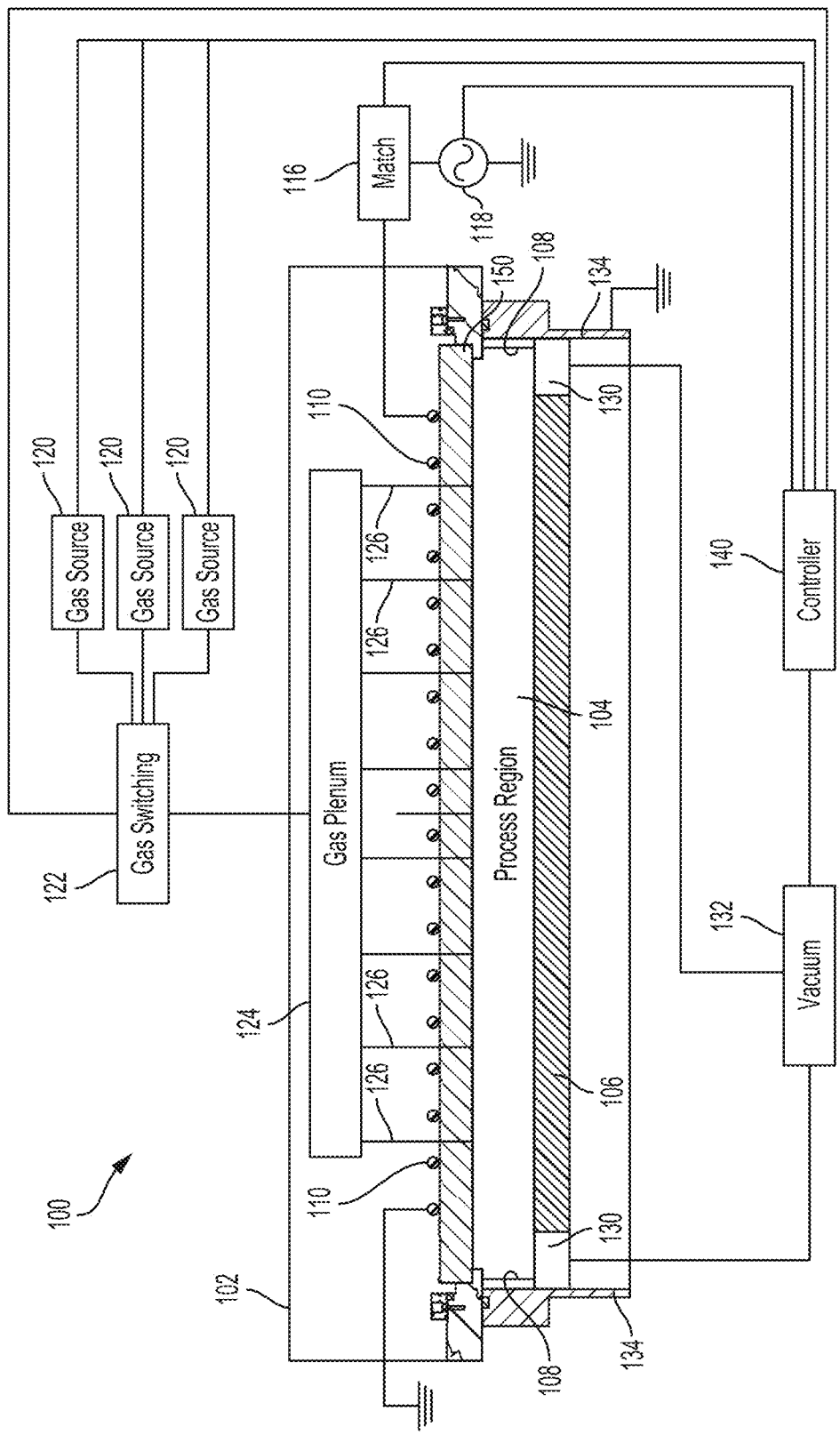
FIG. 1B is a cross-sectional schematic diagram illustrating a plasma processing system 100, in accordance with implementations of the disclosure.

FIG. 1B is a cross-sectional schematic diagram illustrating a plasma processing system 100, in accordance with implementations of the disclosure. The implementation of FIG. 1B differs from that of FIG. 1A primarily in that the RF antenna 110 is disposed over a dielectric window 150 (e.g. ceramic such as quartz), rather than being integrated into or sandwiched between insulators. In some implementations, the dielectric window 150 has a thickness in the range of about one-half to one inch (e.g. about 1 to 3 cm).

Figure 2:
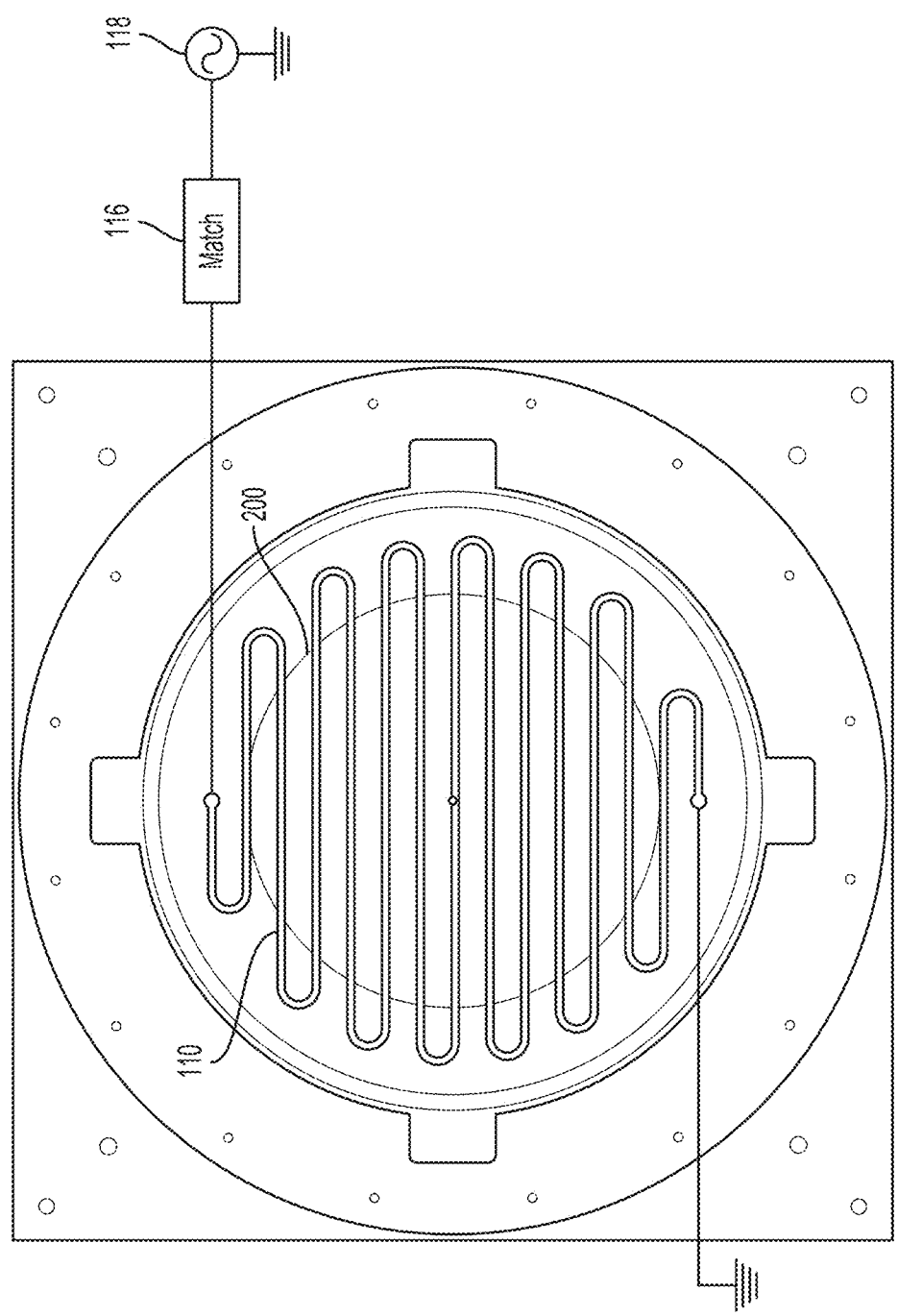
FIG. 2 is an overhead view of an RF antenna for plasma processing, in accordance with implementations of the disclosure.

FIG. 2 is an overhead view of an RF antenna for plasma processing, in accordance with implementations of the disclosure. As shown, the RF antenna 110 has a serpentine shape, consisting of a series of parallel equally spaced conductive lines that are connected in series by looped ends. In other words, the RF antenna is defined by a continuous line that traces a path back and forth over the process region. In the illustrated implementation, the RF antenna 110 is powered at one end by an RF source 118 through a match 116, and the other end of the RF antenna 110 is connected to ground.

Also shown in the overhead view is a substrate 200. The RF antenna 110 is formed in the illustrated implementation to cover a circular area that encompasses the substrate 200, and to inductively generate plasma in the process region of the chamber substantially over the entire exposed area of the substrate 200.

In some implementations, the thickness (vertical dimension) of the RF antenna 110 is in the range of approximately 0.01 to 0.02 inches (approximately 0.02 to 0.05 cm). In some implementations, the RF antenna 110 is at a minimum distance from the sidewalls of the chamber, e.g. approximately 0.5 inch (1.3 cm) in some implementations. In some implementations, there is a minimum horizontal distance from the edge of the wafer to the turnaround of a given loop of the RF antenna 110, e.g. approximately 0.5 inch (1.3 cm) in some implementations.

Figure 3:
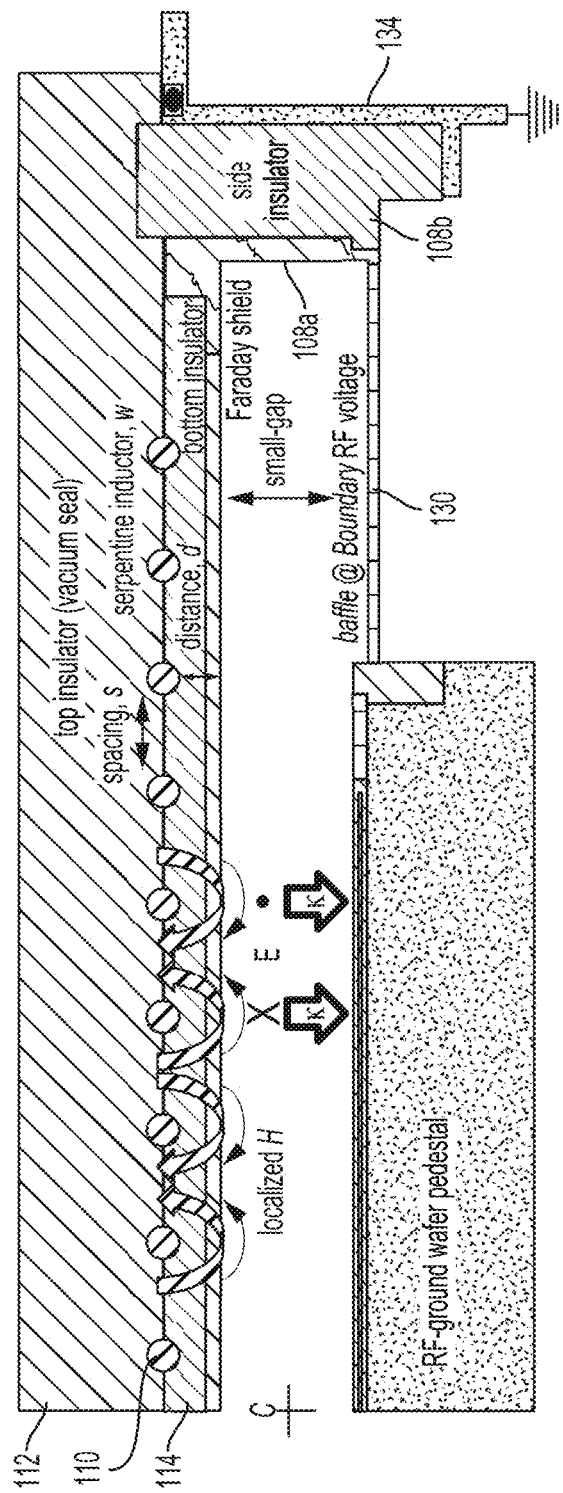
FIG. 3 is a conceptual cross-section view of a portion of a process chamber, in accordance with implementations of the disclosure.

FIG. 3 is a conceptual cross-section view of a portion of a process chamber, in accordance with implementations of the disclosure. As shown, the RF antenna 110 is sandwiched between a top insulator 112 and a bottom insulator 114. Side insulators 108a and 108b are joined to the periphery of the top and bottom insulators, so as to form a seal that enables the chamber to be operated under vacuum. The top and bottom insulators can be formed from a ceramic (e.g. quartz) or other insulating materials.

In order to achieve an inductively coupled plasma with high uniformity in a small vertical gap, it is important to have a localized magnetic field H (hence, E). Implementations of the present disclosure achieve this, generating a localized H by having the currents in any two adjacent lines running in the opposite direction. Parameters affecting the localization of the magnetic field and ultimately, the characteristics of the plasma generation, include the following: (1) line-line spacing (pitch), s, (2) line-plasma distance, d, (3) inductor line width, w.

In some implementations, the pitch s is in the range of about 0.5 to 2 inches (about 1 to 5 cm). In some implementations, s is approximately one inch (2.5 cm) for a vertical small gap on the order of approximately one inch (2.5 cm). In some implementations, s can be further reduced to approximately one-half inch (1.3 cm) in order to further improve the local electron density (Ne) uniformity of the small vertical gap (about one inch) geometry.

In order to maximize the plasma-skin induction current, d should be as small as physically and electrically feasible so as to maximize the induced fields. No limits are placed on the ratio s/d. In some implementations, a ratio of s/d>2 is generally considered for practical power-coupling and in fact, a maximum ratio s/d maximizes power-coupling as long as such geometry can be physically and electrically possible.

No limits are placed on the ratio of the vertical small-gap/s. In some implementations, small-gap/s>1 is generally considered for practical local Ne uniformity.

It is recognized that the field that penetrates into the plasma will become negligible if the spacing between lines (pitch) becomes much less than the thickness of the window. Also, if d is too small, then the conductive lines may be close to a Faraday shield, resulting in high stray capacitance.

Additionally, it is recognized that the conductive lines should have sufficient width and/or height to carry current, or they may be at risk of melting.

With continued reference to FIG. 3, k is the wave vector indicating the direction of energy flow. The wave vector k is equal to the cross product of E and H, e.g. in units of Watts per meter squared.

As can be seen, the RF antenna 110 covers the process region in a way that other antennas cannot do. More specifically, the RF antenna 110 provides a very uniform density of flux lines over the entire area with a granularity in accordance with the spacing of the antenna lines. The line-line spacing can be optimized for the line-plasma distance, which may in turn be determined in part by the thickness of the bottom insulator or dielectric window, any distance from the dielectric window, skin depth, etc. The RF antenna 110 provides a uniform source of magnetic flux to drive currents everywhere across the process region area and hence provides uniform plasma production.

Existing TCP coils do not achieve uniformity in a small vertical gap because they are designed to generate and diffuse plasma throughout a larger volume and at relatively lower pressure. Such coils are designed to be a global antenna, inducing currents throughout the plasma chamber in a large circular pattern, with attendant stochastic effects. Thus, such existing chambers do not have the property of low residence time. With a conventional TCP coil, it is not possible to achieve high uniformity very close to the window. And thus if the vertical gap of the chamber were simply reduced in an attempt to reduce the residence time, this would bring the non-uniformity close to the wafer surface.

However, with the RF antenna provided in accordance with implementations of the present disclosure, there are not the global current circulation and stochastic effects seen in existing coils. But rather, effects are localized, enabling high uniformity of plasma in a narrow vertical gap very close to the window.

FIGS. 4A, 4B, 4C, 4D, 4E, 4F, 4G, and 4H illustrate various examples of RF antenna 110 having various dimensions and coverage configurations, in accordance with implementations of the disclosure.

Figure 4D:
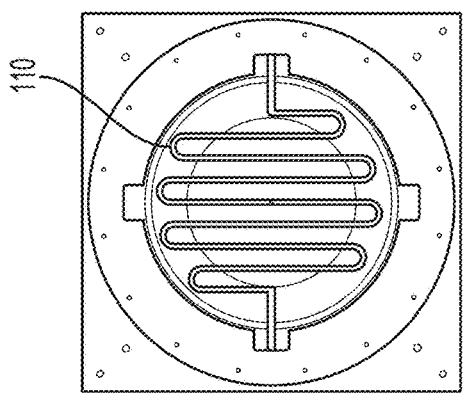
FIGS. 4A, 4B, 4C, 4D, 4E, 4F, 4G, and 4H illustrate various examples of RF antenna 110 having various dimensions and coverage configurations, in accordance with implementations of the disclosure.
Figure 4H:
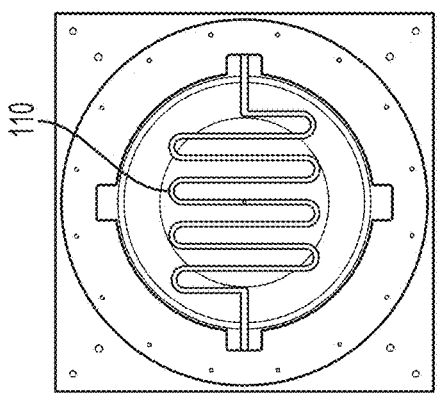
Figure 4C:
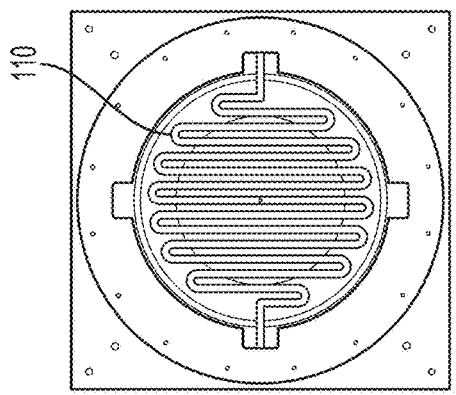
Figure 4G:
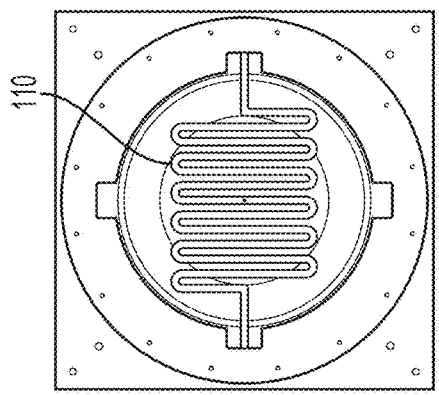
Figure 4B:
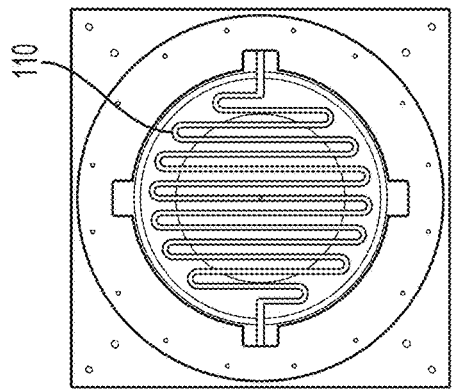
Figure 4F:
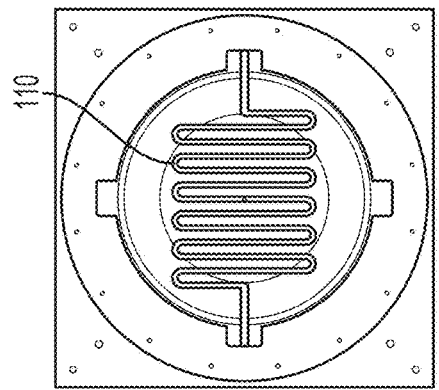
Figure 4A:
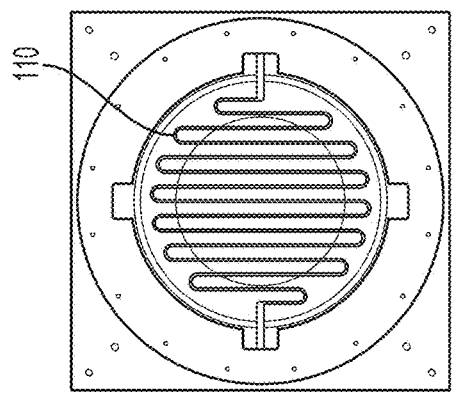

The implementations of FIGS. 4A-D illustrate the RF antenna 110 having a substantially circular coverage area, so as to provide coverage over the entire horizontal area of the substrate. In the implementation of FIG. 4A, the RF antenna 110 has a width of approximately 0.25 inch and a pitch of approximately 1 inch per line. In the implementation of FIG. 4B, the RF antenna 110 has a width of approximately 0.38 inch and a pitch of approximately 1 inch per line. In the implementation of FIG. 4C, the RF antenna 110 has a width of approximately 0.50 inch and a pitch of approximately 1 inch per line. In the implementation of FIG. 4D, the RF antenna 110 has a width of approximately 0.5 inch and a pitch of approximately 1.5 inches per line.

Figure 4E:
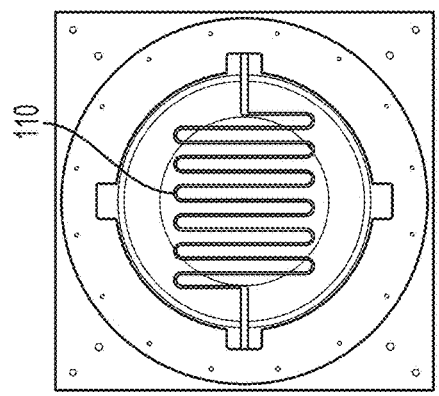

The implementations of FIGS. 4E-H illustrate the RF antenna 110 having a substantially rectangular coverage area. In the implementation of FIG. 4E, the RF antenna 110 has a width of approximately 0.25 inch and a pitch of approximately 1 inch per line. In the implementation of FIG. 4F, the RF antenna 110 has a width of approximately 0.38 inch and a pitch of approximately 1 inch per line. In the implementation of FIG. 4G, the RF antenna 110 has a width of approximately 0.50 inch and a pitch of approximately 1 inch per line. In the implementation of FIG. 4I, the RF antenna 110 has a width of approximately 0.25 inch and a pitch of approximately 1.5 inches per line. It will be appreciated that the parameters of the RF antenna 110, such as the width, pitch, and turns, can be optimized to provide for the desired density and uniformity of plasma when in operation. Currents induced in the plasma mirror the currents going back and forth along the RF antenna 110.

Figure 5:
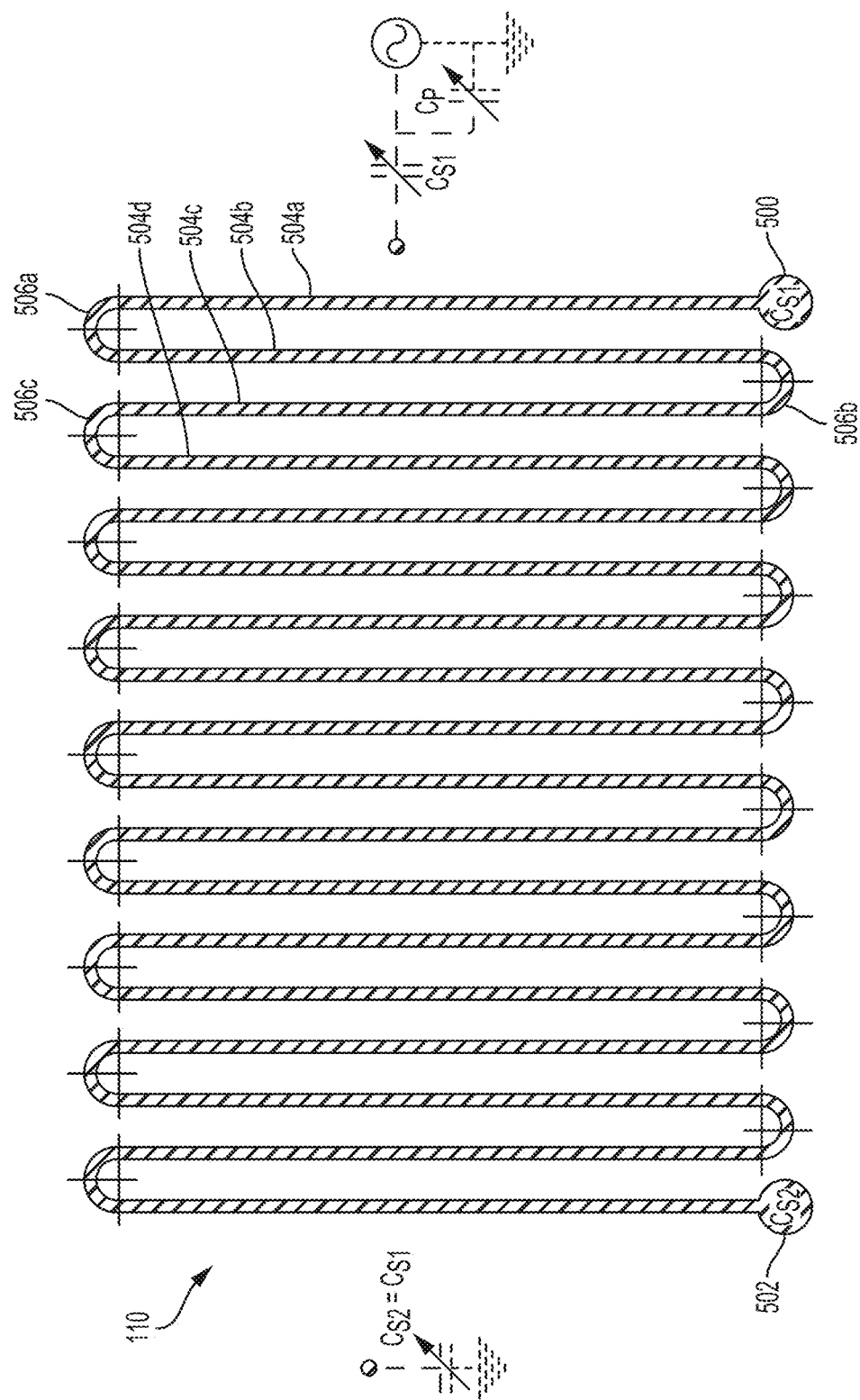
FIG. 5 illustrates an overhead view of an RF antenna 110 defined as a single continuous length of a conductive material, in accordance with implementations of the disclosure.

FIG. 5 illustrates an overhead view of an RF antenna 110 defined as a single continuous length of a conductive material, in accordance with implementations of the disclosure. Generally speaking, the RF antenna 110 is defined by an array of parallel equally spaced conductive lines, such as the conductive lines 504a, 504b, 504c, and 504d as indicated in the illustrated implementation. The conductive lines are substantially straight portions of the RF antenna 110, and when the RF antenna 110 is powered, current in adjacent ones of the conductive lines runs in opposite directions, forming a local countercurrent. For example, when powered, the current in conductive line 504c will run in the opposite direction as the current in adjacent conductive line 504d. To achieve this countercurrent setup, the conductive lines are connected in series to each other. For example, the conductive lines 504a, 504b, 504c, and 504d are connected in series. Conductive line 504a is connected to conductive line 504b by a connector 506a; conductive line 504b is connected to conductive line 504c by a connector 506b; and, conductive line 504c is connected to conductive line 504d by a connector 506c.

In the illustrated implementation, the connectors are shown as curved lines or semicircular shaped. However, in other implementations the connectors can have other shapes. In some implementations, each connector is defined by a single straight line connecting segment. In some implementations, each connector is defined by two or more straight line connecting segments. In some implementations, the RF antenna 110 may have different shaped connectors at different portions of the RF antenna 110.

The RF antenna 110 has a first end 500 that is powered, and a second end 502 that is connected to ground. As shown, the RF antenna 110 has a serpentine shape that defines a current path configured to flow back and forth along and parallel to a first axis, while traversing a second axis perpendicular to the first axis from one side of the chamber to the opposite side of the chamber. The RF antenna 110 thus defines a countercurrent inductor that produces localized plasma induction.

In the illustrated implementation, the RF antenna 110 has a single continuous length. In such implementations with and single continuous length, if the length is too long for the frequency at which the system operates, there may be transmission line effects as the whole length may not be sufficiently in phase, and the inductance may be too high. For example, at a frequency of 13.56 MHz, and an RF antenna 110 length of about 3-10 feet, the entire length can be considered to be in phase. However, if the length is significantly longer, then there may be transmission line effects. One possibility to address such issues is to lower the frequency. However, another way is to break down the conductive length into different segments, which lowers the inductance.

With continued reference to FIG. 5, in some implementations, each of the conductive lines has a segment length of approximately 17 inches (approximately 43 cm); in some implementations, approximately 15-20 inches (approximately 38 to 51 cm). In some implementations, the line-to-line spacing is approximately 1 inch (approximately 2.5 cm); in some implementations, approximately 0.5 to 1.5 inches (approximately 1.3 to 3.8 cm). In some implementations, the line width is approximately 0.25 inch (approximately 0.6 cm); in some implementations, approximately 0.1 to 0.5 inch (approximately 0.2 to 1.3 cm).

Figure 6:
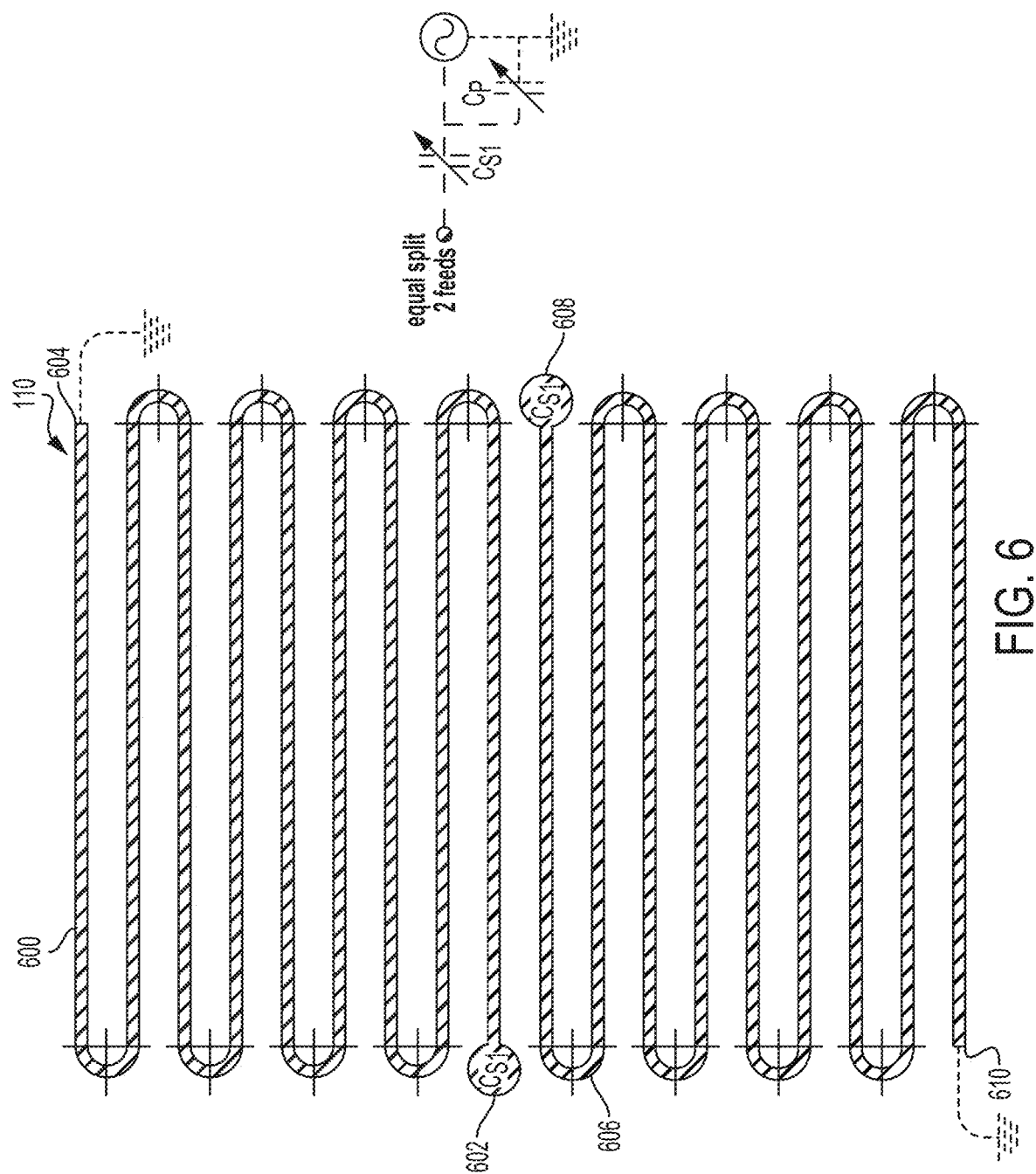
FIG. 6 illustrates an overhead view of RF antenna 110 consisting of two distinct segments, in accordance with implementations of the disclosure.

FIG. 6 illustrates an overhead view of RF antenna 110 consisting of two distinct segments, in accordance with implementations of the disclosure. As shown, the RF antenna 110 has a segment 600 and a segment 606. The RF antenna 110 still consists of an array of conductive lines that are parallel and equally spaced. However, the conductive lines are divided into two segments, with the segment 600 including half of the conductive lines connected in series, and the segment 606 including the other half of the conductive lines connected in series. The segment 600 is powered at a first end 602 and grounded at a second end 604. The segment 606 is powered at a first end 608 and grounded at a second end 610.

In some implementations, power is split from a single power source to each of the first ends 602 and 608 of the segments 600 and 606 respectively. In other implementations, power is provided from separate power sources to each of the first ends respectively. In either case, when the RF antenna 110 is powered, each pair of adjacent conductive lines of the RF antenna 110 exhibits current flow in opposite directions, so that RF antenna 110 functions as a countercurrent inductor.

In some implementations, the RF antenna 110 in accordance with FIG. 6 has dimensions similar to those described with reference to the implementation of FIG. 5.

Figure 7:
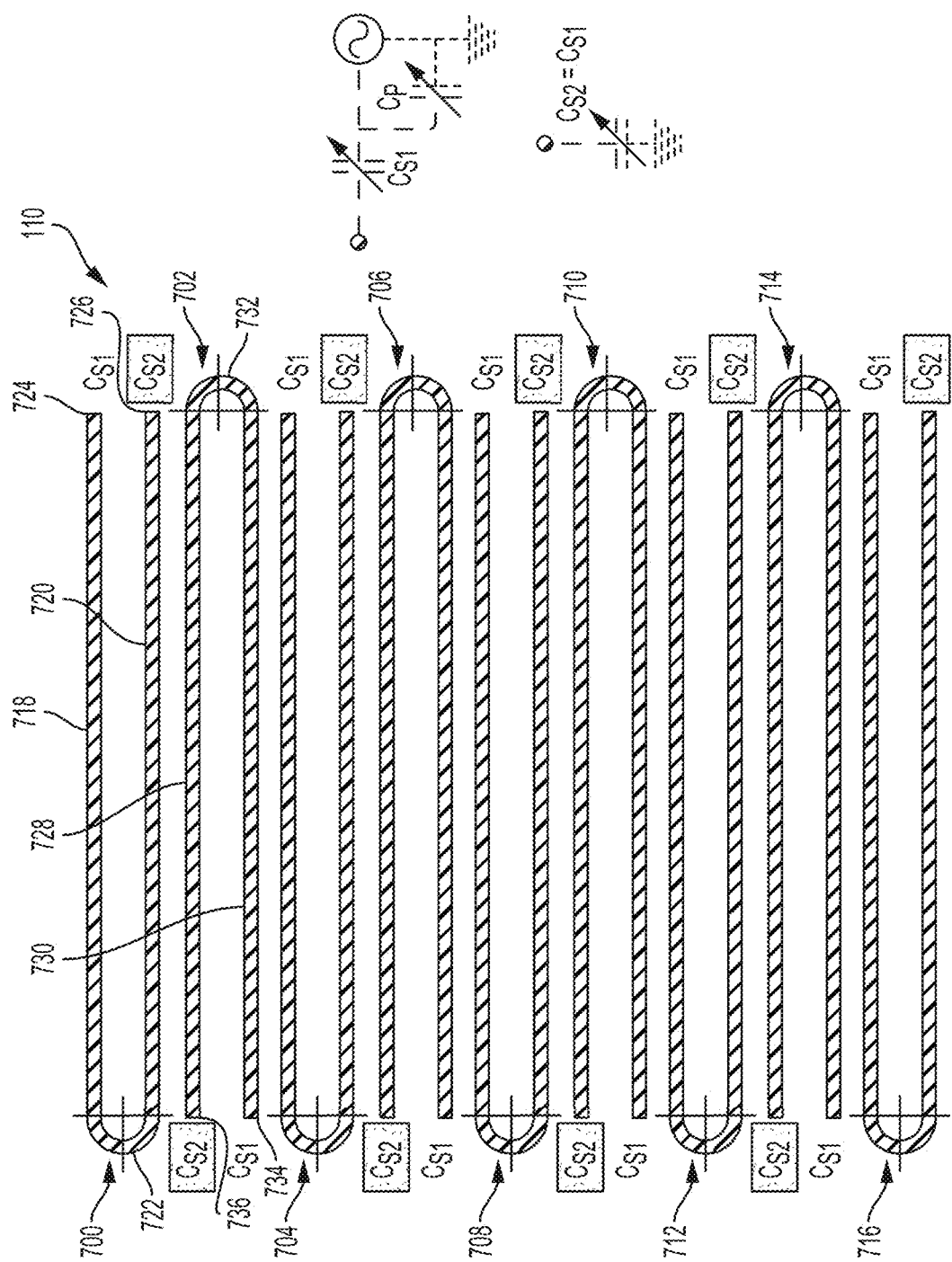
FIG. 7 illustrates an overhead view of an RF antenna 110 having multiple hairpin-shaped segments, in accordance with implementations of the disclosure.

FIG. 7 illustrates an overhead view of an RF antenna 110 having multiple hairpin-shaped segments, in accordance with implementations of the disclosure. In the illustrated implementation, the RF antenna 110 consists of segments 700, 702, 704, 706, 708, 710, 712, 714, and 716. Each segment has a hairpin shape consisting of two adjacent and parallel conductive lines that are connected by a connector on one side. For example, the segment 700 includes conductive lines 718 and 720, connected on one side by a connector 722. An adjacent segment 702 includes conductive lines 728 and 730, connected on the opposite side by a connector 732.

The segment 700 is powered at a first end 724, and has a second end 726 connected to ground. The segment 702 powered at a first end 734, and has a second end 736 connected to ground. The remaining segments are similarly configured to be powered and grounded. In some implementations, the segments may each receive RF power that is uniformly or adjustably split from a power source. It will be appreciated that the segments are arranged as shown, so that when the RF antenna 110 is powered, adjacent lines exhibit current flow in opposite directions, thereby enabling the RF antenna 110 to function as a countercurrent inductor.

In some implementations, the RF antenna 110 is powered at a frequency of 13.56 MHz and a total power W. In some implementations, the power to each segment is equal to W divided by the number of segments of the RF antenna 110.

Figure 8:
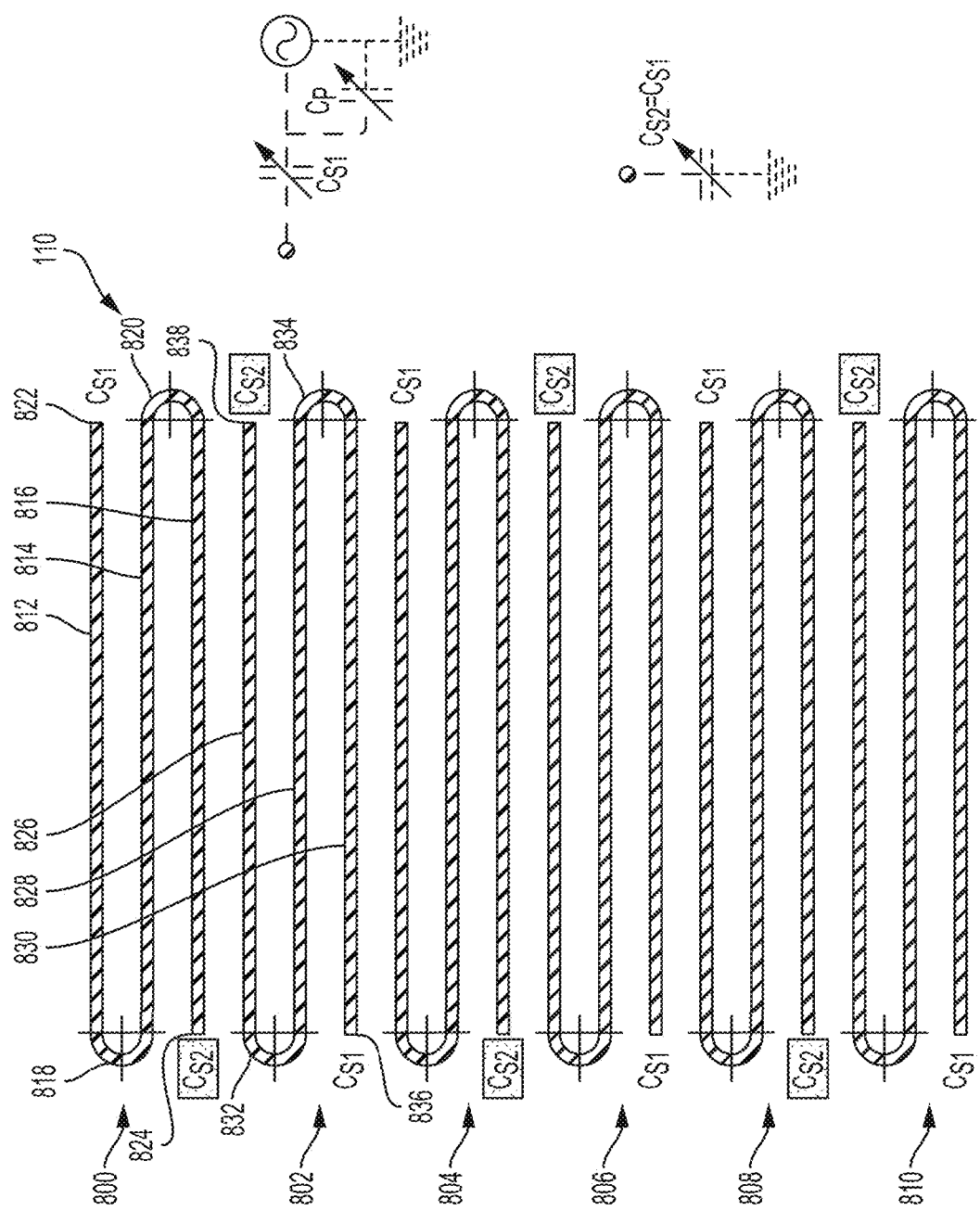
FIG. 8 illustrates an overhead view of an RF antenna 110 having multiple segments, in accordance with implementations of the disclosure.

FIG. 8 illustrates an overhead view of an RF antenna 110 having multiple segments, in accordance with implementations of the disclosure. In the illustrated implementation, each segment includes three conductive lines connected in series. The RF antenna 110 as shown includes segments 800, 802, 804, 806, 808, and 810. By way of example, the segment 800 includes conductive lines 812, 814, and 816 connected in series by connectors 818 and 820 as shown. Similarly, the segment 802 includes conductive lines 826, 828, and 830 connected in series by connectors 832 and 834. The remaining segments are similarly configured. Each segment thus exhibits a double reverse hairpin shape, with two 180 degree turns for each segment.

The segment 800 receives power at a first end 822, and a second end 824 is connected to ground Likewise, the segment 802 receives power at a first end 836, and a second end 838 is connected to ground. The other segments are similarly configured. In some implementations, RF power can be uniformly or adjustably split from a power source to the segments of the RF antenna 110. It will be appreciated that the segments are arranged as shown, so that when the RF antenna 110 is powered, adjacent lines exhibit current flow in opposite directions, thereby enabling the RF antenna 110 to function as a countercurrent inductor.

In some implementations, the RF antenna 110 is powered at a frequency of 13.56 MHz and a total power W. In some implementations, the power to each segment is equal to W divided by the number of segments of the RF antenna 110.

FIG. 9A illustrates an overhead view of an RF antenna 110 having multiple double reverse hairpin segments, in accordance with implementations of the disclosure. In the illustrated implementation, the RF antenna 110 includes segments 900, 916, 940, and 956. Each segment is powered by a separate power supply, thus enabling the RF power provided to each segment to be individually tuned. This can be leveraged to improve deposition uniformity, for example, or even to intentionally produce a differential deposition profile. Segment 900 is powered by power supply 912 and connected to ground through a termination module 914; segment 916 is powered by power supply 928 and connected to ground through a termination module 930; segment 940 is powered by power supply 952 and connected to ground through a termination module 954; segment 956 is powered by power supply 968 and connected to ground through a termination module 970.

Segment 900 includes conductive lines 902, 904, and 906, connected in series by connectors 908 and 910; segment 916 includes conductive lines 918, 920, and 922, connected in series by connectors 924 and 926; segment 940 includes conductive lines 942, 944, and 946, connected in series by connectors 948 and 950; and segment 956 includes conductive lines 958, 960, and 962, connected in series by connectors 964 and 966.

As conceptually shown by the arrows on the conductive lines, when the RF antenna 110 is powered, current flow in adjacent conductive lines occurs in opposite directions, thus forming a countercurrent inductor.

In some implementations, the RF antenna 110 is powered at a frequency of 13.56 MHz and a total power W. In some implementations, the power to each segment is equal to W divided by the number of segments of the RF antenna 110. For example, in the case of four segments as shown, the power to each segment is equal to W/4.

FIG. 9B is a cross-section view of the implementation of FIG. 9A, in accordance with implementations of the disclosure. In FIG. 9B, the components of the RF antenna 110 are shown disposed over a dielectric window 980. Shown below the dielectric window 980 is a ground electrode 982.

Figure 10A:
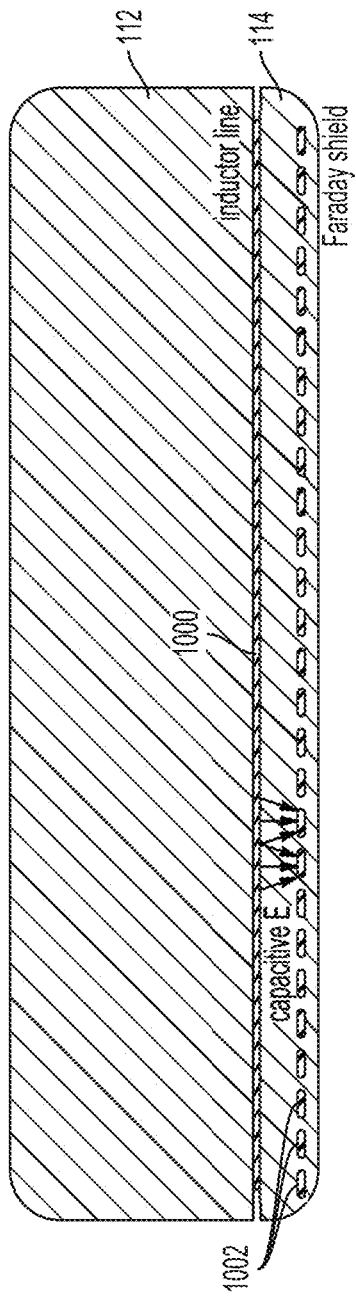
FIG. 10A illustrates a conceptual cross-section of an RF antenna 110 in accordance with implementations of the disclosure.

FIG. 10A illustrates a conceptual cross-section of an RF antenna 110 in accordance with implementations of the disclosure. Shown is a cross-section view along a length of one of the conductive lines 1000 of the RF antenna 110. Conductive lines 1000 may also be referred to as inductor lines. The RF antenna 110 is formed between a top insulator 112 and a bottom insulator 114. Also disposed within the bottom insulator and below the RF antenna 110 is a Faraday shield 1002. The Faraday shield 1002 includes lines that are oriented perpendicular to the orientation of the conductive lines of the RF antenna 110. Thus in the illustrated implementation, the Faraday shield 1002 appears as a series of short segments below the conductive line 1000, as the view is cross-sectional across the Faraday shield's lines.

Figure 10B:
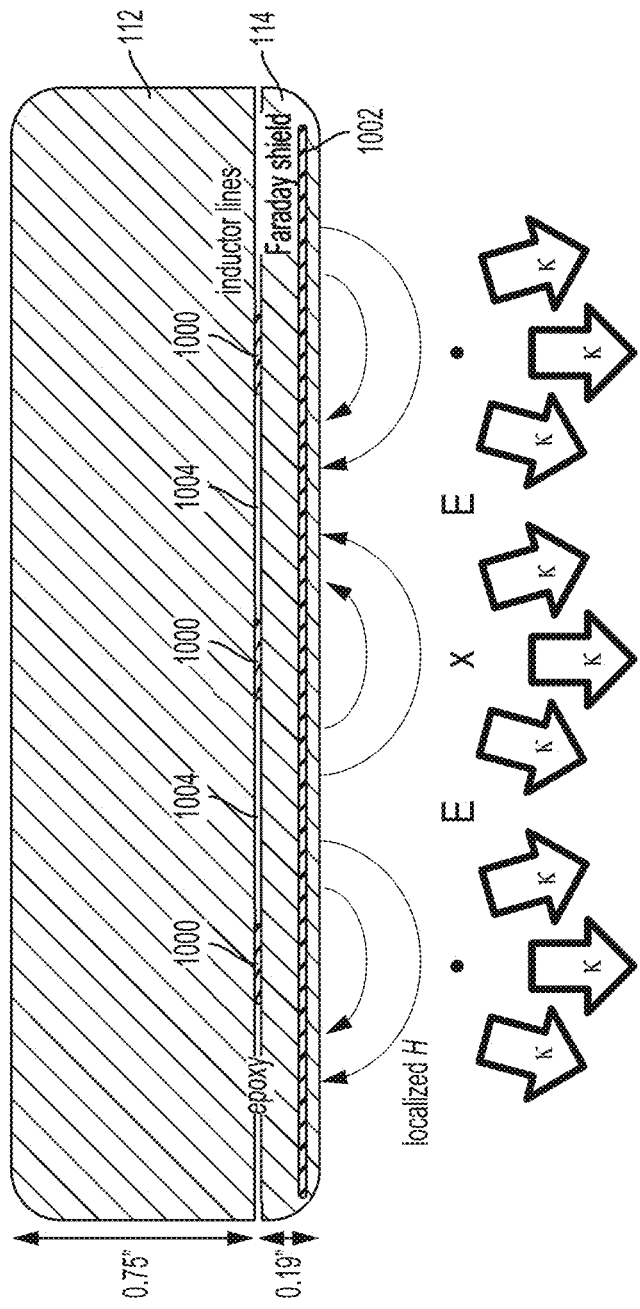
FIG. 10B illustrates a conceptual cross-section in accordance with the implementation of FIG. 10A.

FIG. 10B illustrates a conceptual cross-section in accordance with the implementation of FIG. 10A. The view shown at FIG. 10B is perpendicular to that of FIG. 10A. Thus, the illustrated cross-section of FIG. 10B is perpendicular to the orientation of the conductive lines 1000 of the RF antenna 110, and several individual conductive lines 1000 are visible. In some implementations, between the individual conductive lines 1000, there is epoxy 1004, which bonds the top insulator 112 and the bottom insulator 114.

The electrostatic Faraday shield 1002 absorbs the electric field from the conductive lines, so that electric field will not pass through into plasma. The arrows shown at FIG. 10A illustrate electric field lines terminating on the Faraday shield 1002. Thus, only the magnetic fields pass through the ceramic into the plasma skin to be absorbed.

In some implementations, the Faraday shield is designed such that the capacitance between the inductor lines and the Faraday shield is a controllable quantity. In some implementations, the Faraday shield 1002 is at ground, so if the stray capacitance is too high compared to the series resonance capacitance, then the ICP match won't tune.

Further illustrated at FIG. 10B is the wave vector K, indicated by arrows beneath the inductor lines. Directly below the inductor line the direction of energy flow is straight down. But away from the inductor line, the direction of energy flow changes because the magnetic field is curved.

The Faraday shield can function to block capacitive coupling from the RF antenna 110 to plasma. In some implementations, the Faraday shield is grounded; whereas in some implementations, the Faraday shield is floating.

In some implementations, the Faraday shield is powered, to sputter the window to keep it clean. Additionally, if the Faraday shield is powered, then this could be used to assist in ignition and plasma stability.

Figure 11B:
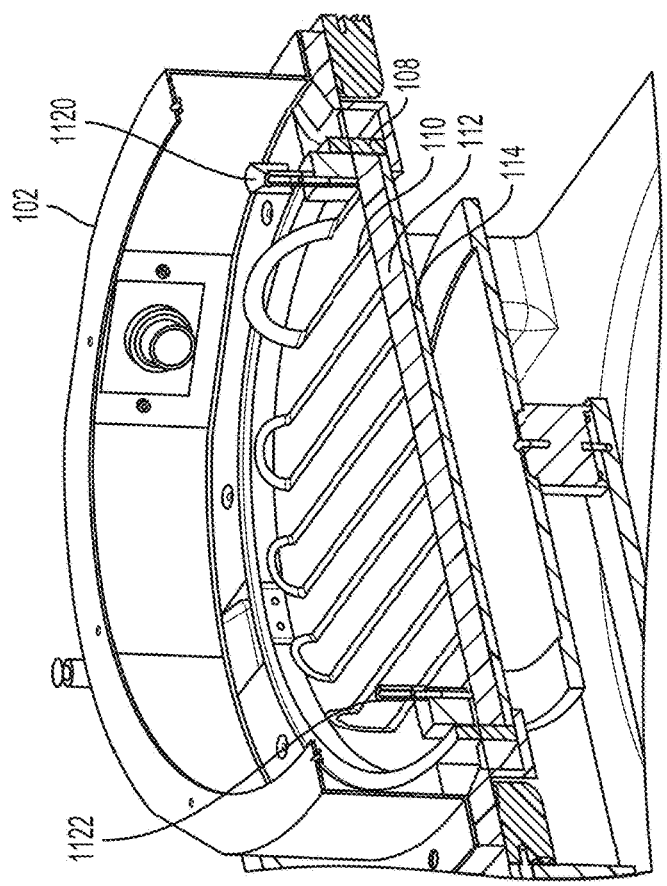
FIG. 11B illustrates a cutaway view of a process chamber 102 including the RF antenna 110 in accordance with the implementation of FIG. 11A.
Figure 11A:
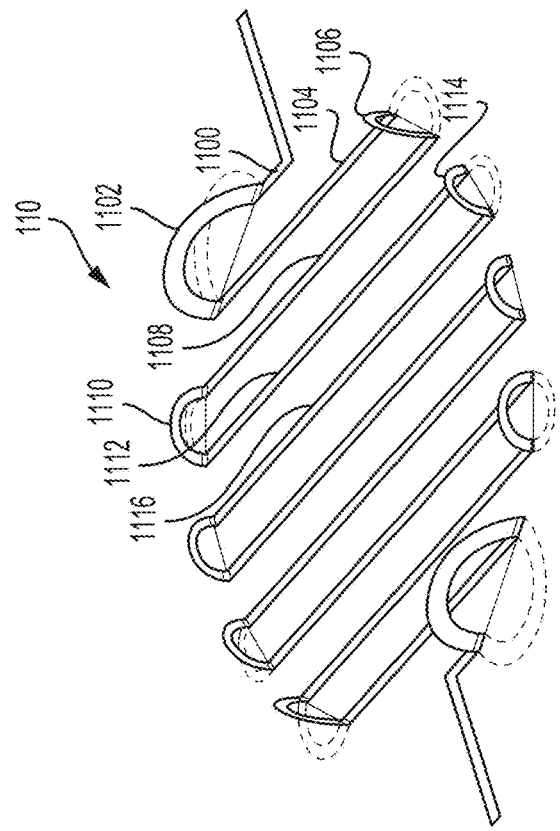
FIG. 11A illustrates a perspective view of an RF antenna 110 having raised end loops, in accordance with implementations of the disclosure.

FIG. 11A illustrates a perspective view of an RF antenna 110 having raised end loops, in accordance with implementations of the disclosure. In the RF antenna 110 the looped ends may cause some transformer effect. Therefore, in some implementations, this effect can be reduced by bending the end loops up at an angle (e.g. approximately 90 degree angle). This will also reduce the end loops' current induction into the chamber.

In the illustrated implementation, the RF antenna 110 includes conductive lines that are connected in series by raised end loop connectors. For example, the conductive lines 1100, 1104, 1108, 1112, and 1116 are connected in series by connectors 1102, 1106, 1110, and 1114 as shown. The connectors are curved segments (e.g. semicircular) and each is oriented along a plane that is substantially perpendicular to the plane along which the conductive lines are oriented. The connectors define a current path, from one conductive line to another, that travels upward out of the plane of the conductive lines, and then travels downward back into the plane of the conductive lines.

In the illustrated implementation, the RF antenna 110 is configured to cover a substantially circular region of the chamber, so as to cover and extend beyond the area of the substrate surface that is beneath it. Accordingly, when the connectors are configured to have substantially the same shape as in the illustrated implementation, then the sizes of the connectors may vary as the distance between the ends of adjacent conductive lines may vary depending upon their positioning within the overall array of conductive lines. As shown, adjacent conductive lines positioned towards the ends of the RF antenna 110 have larger connectors (e.g. connector 1102) than adjacent conductive lines positioned towards the center of the RF antenna 110 (e.g. connector 1114).

FIG. 11B illustrates a cutaway view of a process chamber 102 including the RF antenna 110 in accordance with the implementation of FIG. 11A. In some implementations, the RF antenna 110 is positioned above a dielectric window that may consist of top and bottom insulators 112 and 114. In some implementations, the RF antenna 110 is positioned between the top and bottom insulators 112 and 114.

Also shown are contact structures 1120 and 1122 which define electrical contacts for the RF antenna 110. For example, the contact structure 1120 may receive RF power from a power source, while the contact structure 1122 is connected to ground.

Figure 11D:
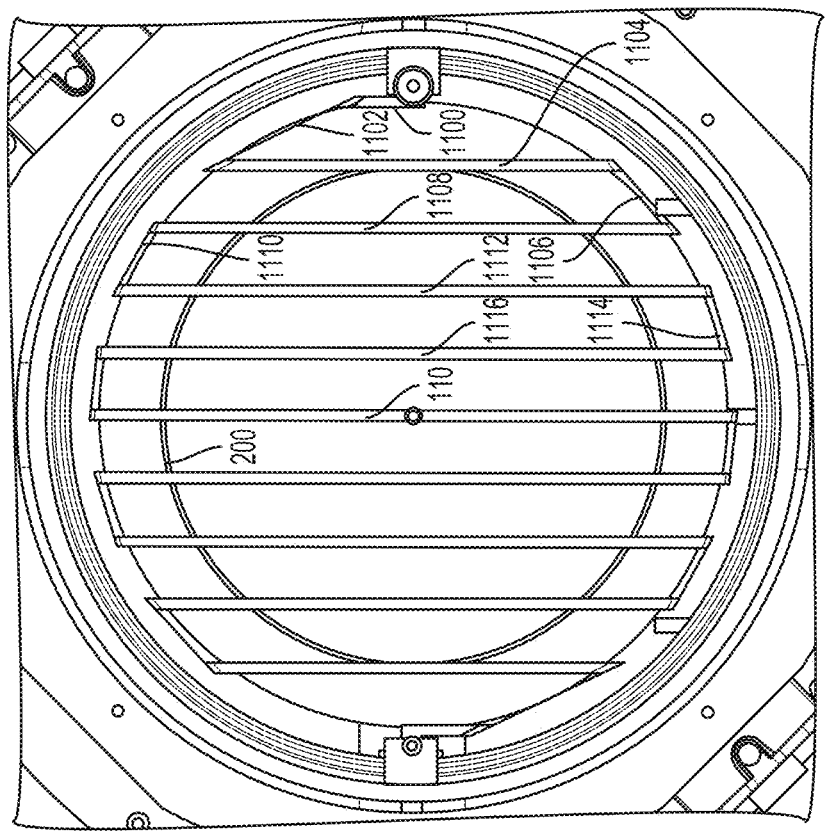
FIG. 11D illustrates an overhead view of the process chamber 102 in accordance with the implementation of FIG. 11B.
Figure 11C:
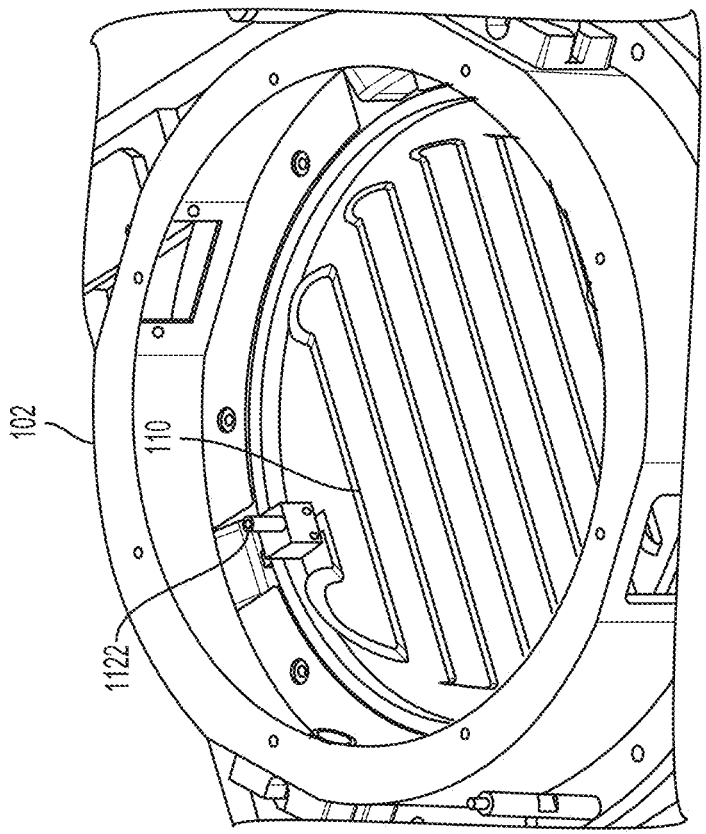
FIG. 11C illustrates a perspective view of the process chamber 102 in accordance with the implementation of FIG. 11B.

FIG. 11C illustrates a perspective view of the process chamber 102 in accordance with the implementation of FIG. 11B. The region of the process chamber 102 above the RF antenna 110 can be provided with airflow to cool this region and more specifically cool the RF antenna 110 and prevent it possibly melting.

FIG. 11D illustrates an overhead view of the process chamber 102 in accordance with the implementation of FIG. 11B. An advantage of the upturned end loop connectors of the RF antenna 110 is that the straight conductive lines can be extended close to the chamber edge, so that the length/reach and coverage area of each conductive line is maximized. In some implementations, a minimum distance from the chamber edge is defined for the RF antenna 110 (e.g. approximately 0.5 inch, or 1.3 cm), and the conductive lines may therefore extend up to or close to the minimum distance from the chamber edge that is defined. In this manner, the conductive lines extend beyond the edge of the substrate 200 to the maximum extent possible, thereby promoting uniformity of plasma generation over the substrate edge regions.

Figure 12B:
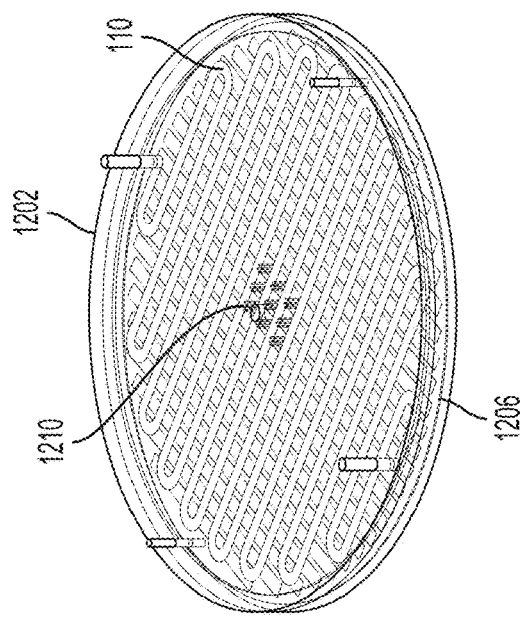
FIG. 12B illustrates a perspective view showing the stacking of components including the RF antenna 110, in accordance with the implementation of FIG. 12A.
Figure 12A:
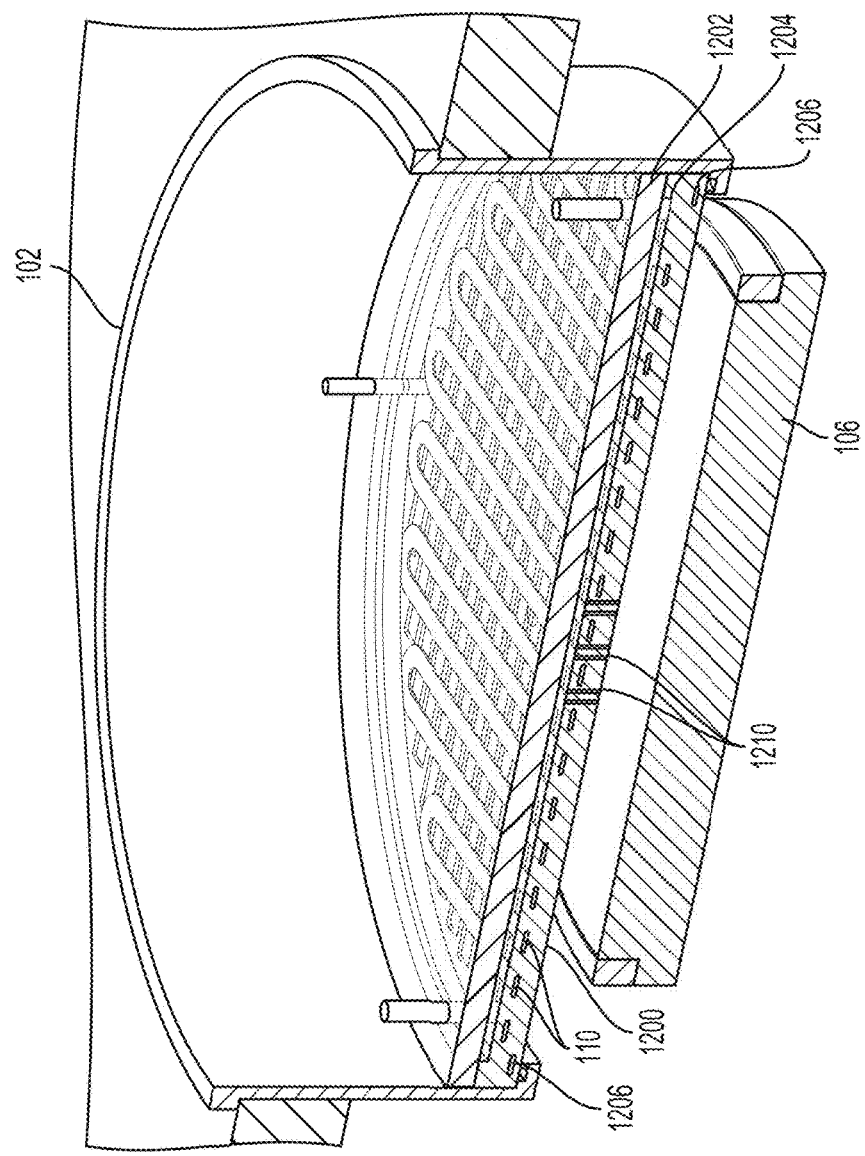
FIG. 12A illustrates a cutaway view of a process chamber 102, in accordance with implementations of the disclosure.

FIG. 12A illustrates a cutaway view of a process chamber 102, in accordance with implementations of the disclosure. In the illustrated implementation, the RF antenna 110 and the Faraday shield 1206 are embedded within a lower insulator 1200. An upper insulator 1202 is positioned above the lower insulator 1200, forming a space between the upper and lower insulators that defines a gas plenum 1204. Also visible in cross section are gas through-holes 1210 that pass through the lower insulator 1200, enabling process gases in the gas plenum 1204 to travel through the lower insulator 1200 into the process region over the wafer pedestal 106.

FIG. 12B illustrates a perspective view showing the stacking of components including the RF antenna 110, in accordance with the implementation of FIG. 12A. As can be seen in this view, the RF antenna 110 is positioned over the Faraday shield 1206, with the conductive lines of the RF antenna 110 running perpendicular to lines of the Faraday shield 1206.

Figure 12C:
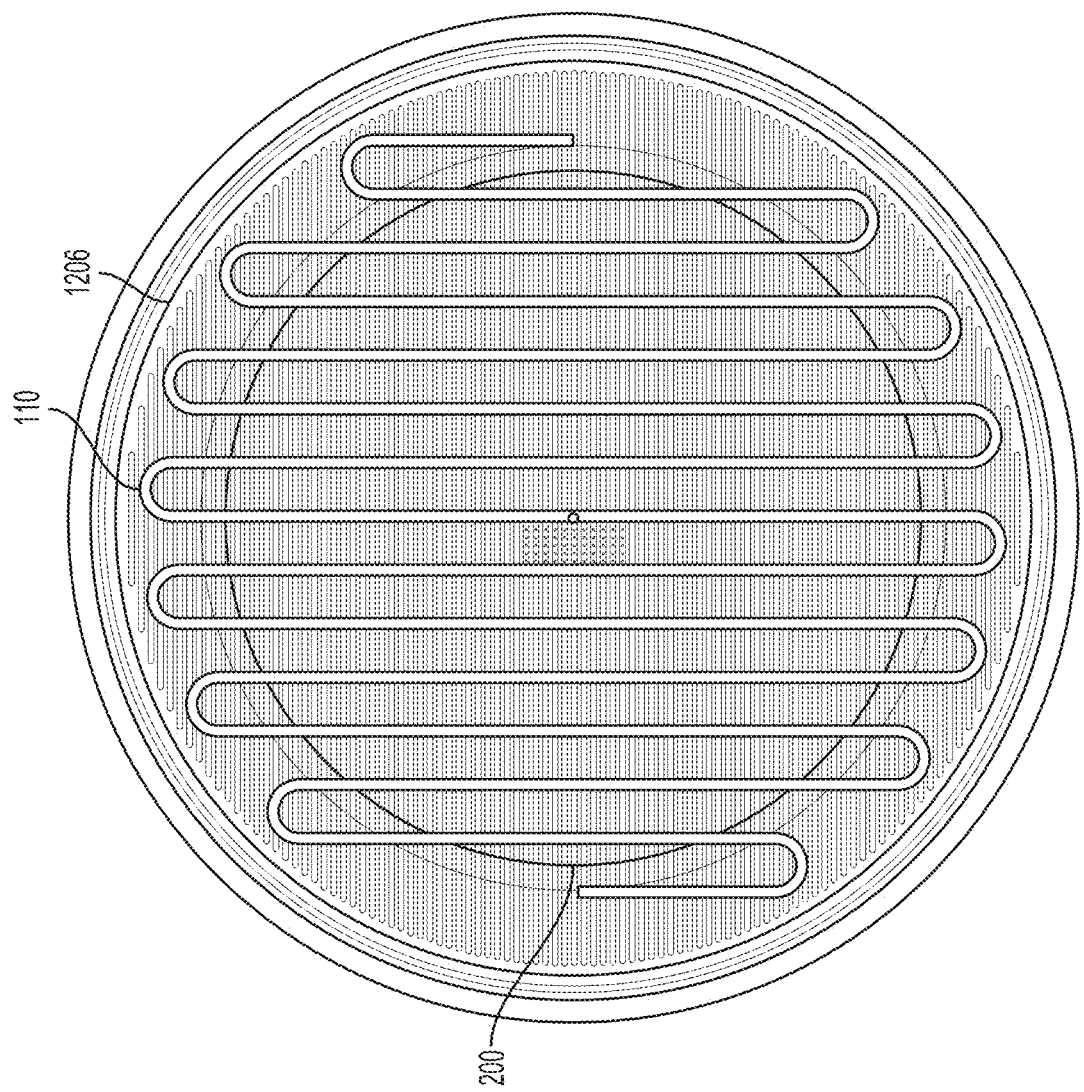
FIG. 12C illustrates an overhead view of the process chamber 102, in accordance with implementations of the disclosure.

FIG. 12C illustrates an overhead view of the process chamber 102, in accordance with implementations of the disclosure. As shown, the RF antenna 110 is positioned over the Faraday shield 1206. In the implementation of FIG. 12C, the line pitch of the Faraday shield is smaller than that of the implementation shown at FIGS. 12A and 12B.

Figure 12D:
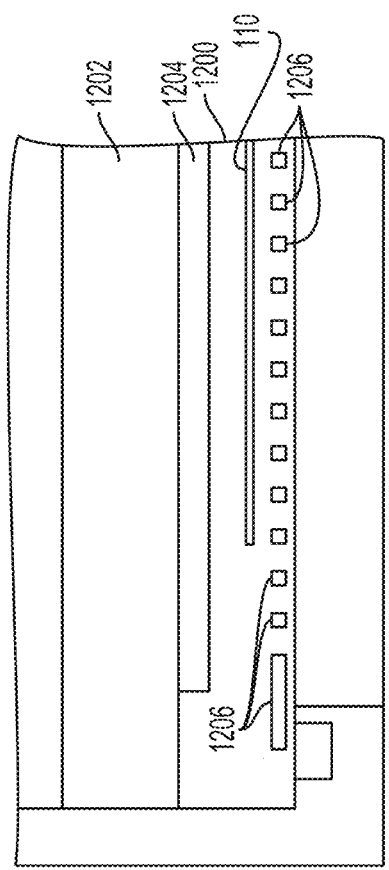
FIG. 12D illustrates a cross section view of an outer portion of the process chamber 102, in accordance with the implementation of FIG. 12C.

FIG. 12D illustrates a cross section view of an outer portion of the process chamber 102, in accordance with the implementation of FIG. 12C. The gas plenum 1204 is shown between the upper insulator 1202 and the lower insulator 1200. The illustrated cross section is along the direction of the conductive lines of the RF antenna 110, and perpendicular to the direction of the lines of the Faraday shield 1206.

Figure 12F:
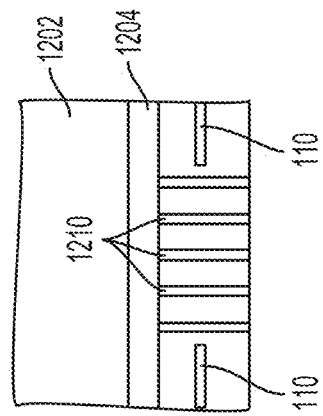
FIG. 12F illustrates a cross section view of a portion of the process chamber 102, in accordance with the implementation of FIG. 12C.
Figure 12E:
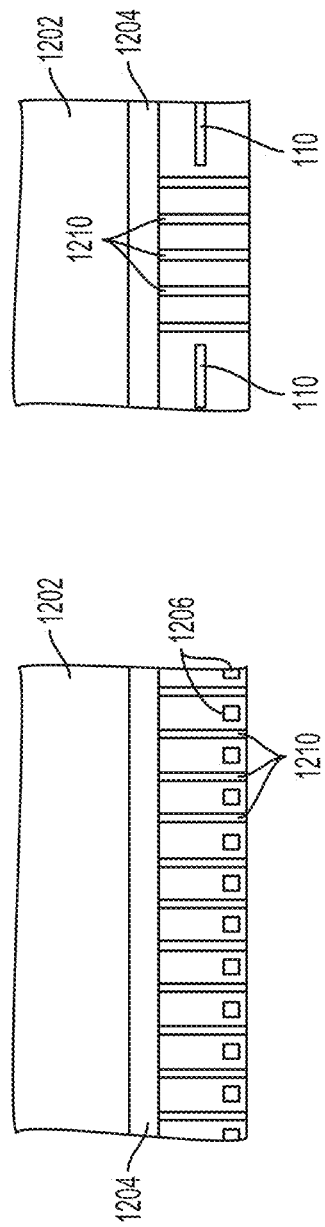
FIG. 12E illustrates a cross section view of a portion of the process chamber 102, in accordance with the implementation of FIG. 12C.

FIG. 12E illustrates a cross section view of a portion of the process chamber 102, in accordance with the implementation of FIG. 12C. The illustrated cross section is perpendicular to the lines of the Faraday shield 1206. In the illustrated view, gas through-holes 1210 are shown, which are positioned so that process gas may travel between the lines of the Faraday shield 1210.

FIG. 12F illustrates a cross section view of a portion of the process chamber 102, in accordance with the implementation of FIG. 12C. The illustrated cross section is perpendicular to the lines of the RF antenna 110. As shown, the gas through-holes 1210 are positioned so that process gas may travel between the conductive lines of the RF antenna 110.

Figure 13A:
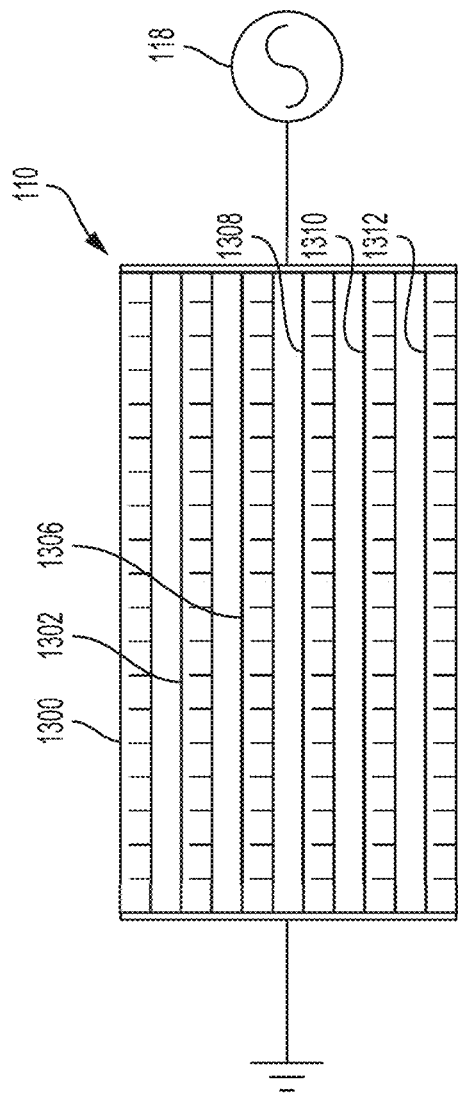
FIG. 13A illustrates an RF antenna 110 in accordance with implementations of the disclosure.

FIG. 13A illustrates an RF antenna 110 in accordance with implementations of the disclosure. In the illustrated implementation, the RF antenna 110 includes parallel and equally spaced conductive lines 1300, 1302, 1306, 1308, 1310, and 1312. The conductive lines of the RF antenna 110 are powered from the same side of the RF antenna 110 and split RF power from a power source 118. The conductive lines are grounded on the opposite side of the RF antenna 110. Hence, currents run in parallel in the same direction along the lines 1300, 1302, 1306, 1308, 1310, and 1312.

Figure 13B:
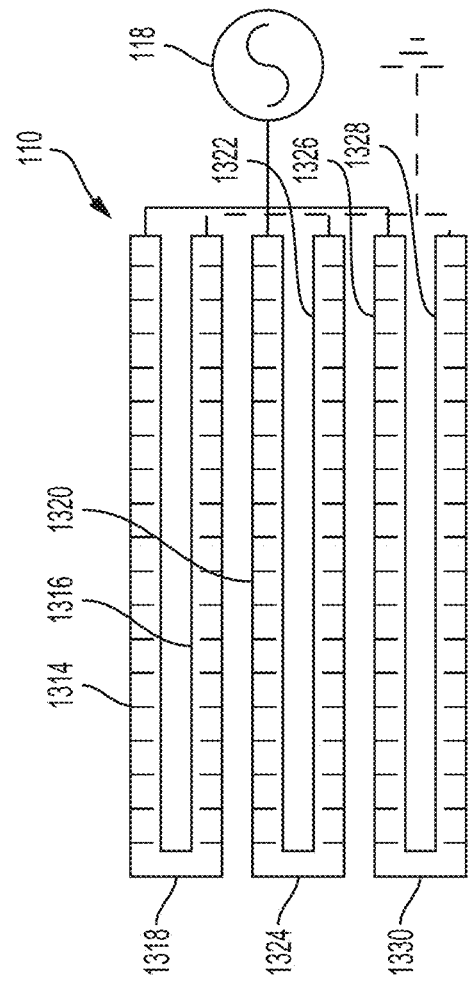
FIG. 13B illustrates an RF antenna 110 in accordance with implementations of the disclosure.

FIG. 13B illustrates an RF antenna 110 in accordance with implementations of the disclosure. In the illustrated implementation, the RF antenna 110 includes parallel and equally spaced conductive lines 1314, 1316, 1320, 1322, 1326, and 1328. Conductive lines 1314 and 1316 are connected in series by a connector 1318; conductive lines 1320 and 1322 are connected in series by a connector 1324; conductive lines 1326 and 1328 are connected in series by a connector 1330. As shown, the conductive lines are powered and grounded from the same side of the RF antenna 110. More specifically, the conductive lines 1314, 1320, and 1326 are powered by an RF power source 118, and the conductive lines 1316, 1322, and 1328 are connected to ground, along the same side of the RF antenna 110.

A problem for achieving high density plasma with inductively coupled plasma systems is that the voltage and/or power required to achieve the desired high density of plasma is too high. Having too high a voltage and/or power can cause multiple problems. Generally speaking, the plasma sheath forms the outermost part (e.g. about 1 mm thickness) of the plasma skin (e.g. about 1 cm thick). As the electric field in the plasma sheath just below the dielectric window is generally perpendicular to the plane of the dielectric window (whereas the electric field in the plasma skin is generally parallel to the plane of the dielectric window) the high voltage and/or power will result in bombardment of the dielectric window with ions, which can result in contamination of the wafer surface. This further wastes energy by generating heat and also consumes the power being applied, so that it is wasted instead being used for inductive heating of the plasma, rendering the process very inefficient. Additionally, high voltage and/or power may stress related power componentry, producing excessive wear, reducing lifetime, and may even trigger arcing of the match circuitry.

In some implementations, it is contemplated how to place the counter-current inductor lines the closest to the plasma while having the least plasma-to-inductor voltage and the most inductor-current. Accordingly, with continued reference to the implementation of FIG. 5, for an RF antenna defined having a single continuous length, the following is considered:

$$V_S = I_0 \frac{\tau}{C_S} = I_0 \omega L_S$$

where $V_S$ is the RF antenna's peak-voltage,
$I_0$ is the inductor peak current,
$L_S$ is the RF antenna's inductance,
$\omega$ is the angular frequency and $\tau$ is the angular period.

It will be noted that for an unbalanced ICP where the inductor-end is tied directly to ground without $C_{S2}$, its phase-cap was $C=C_S/2$ and the unbalanced ICP peak-voltage is double that of the balanced ICP.

On the lowest order, a constant $I_0$ keeps a constant $n_e$ for the ICP. Thus, a challenge is how to maintain a constant $I_0$ while keeping $V_S$ as low as possible. If $V_S$ can be kept under 400V at maximum power, then Faraday shield may not be needed.

As noted previously, by way of example without limitation, an RF antenna having the following dimensions is considered: 17" line-segment (18 lines), 1" line-to-line, 0.25" line width.

One strategy for reducing the voltage is to divide the RF antenna into multiple segments, such as indicated by the implementation of FIG. 7. Considering such an implementation, then the following is considered:

let, L=Serpentine-cell's inductance,
$L_0$=Serpentine-cell Array's inductance,
Then, it is approximately correct to have, $$L = \frac{L_S}{9}$$

$$L_0 = \frac{L}{9} = \frac{L_S}{81}$$

and the matcher would then have, $$C_0 = 81 C_S$$

$$\omega = \sqrt{\frac{2}{L_0 C_0}}$$

and then the inductor's peak-voltage becomes, $$V_0 = 9 I_0 \frac{\tau}{C_0} = 9 I_0 \omega L_0$$

$$V_0 = I_0 \frac{\tau}{9 C_S} = I_0 \omega \frac{L_S}{9}$$

$$V_0 = \frac{V_S}{9}$$

Thus, by dividing the RF antenna into nine segments, the voltage is approximately divided by nine, while each line segment still passes the same current, $I_0$. A possible complication is that the phase-caps of the matcher will need to be 81 times larger than that of the matcher for the RF antenna having only a single continuous length. The 400V peak-voltage for the 9-segment array RF antenna is equivalent to 3600V for the single continuous length RF antenna, and that is equivalent to 7200V unbalanced ICP. A ±7200V peak-voltage of an unbalanced ICP is typically associated with 5 kW to 10 kW of RF power.

While a 400V peak-voltage is achievable as discussed above, such a voltage and power requirement may still be too high. Another way to reduce the voltage is to couple the RF power through a grounded counter-current inductor as discussed below.

Figure 14A:
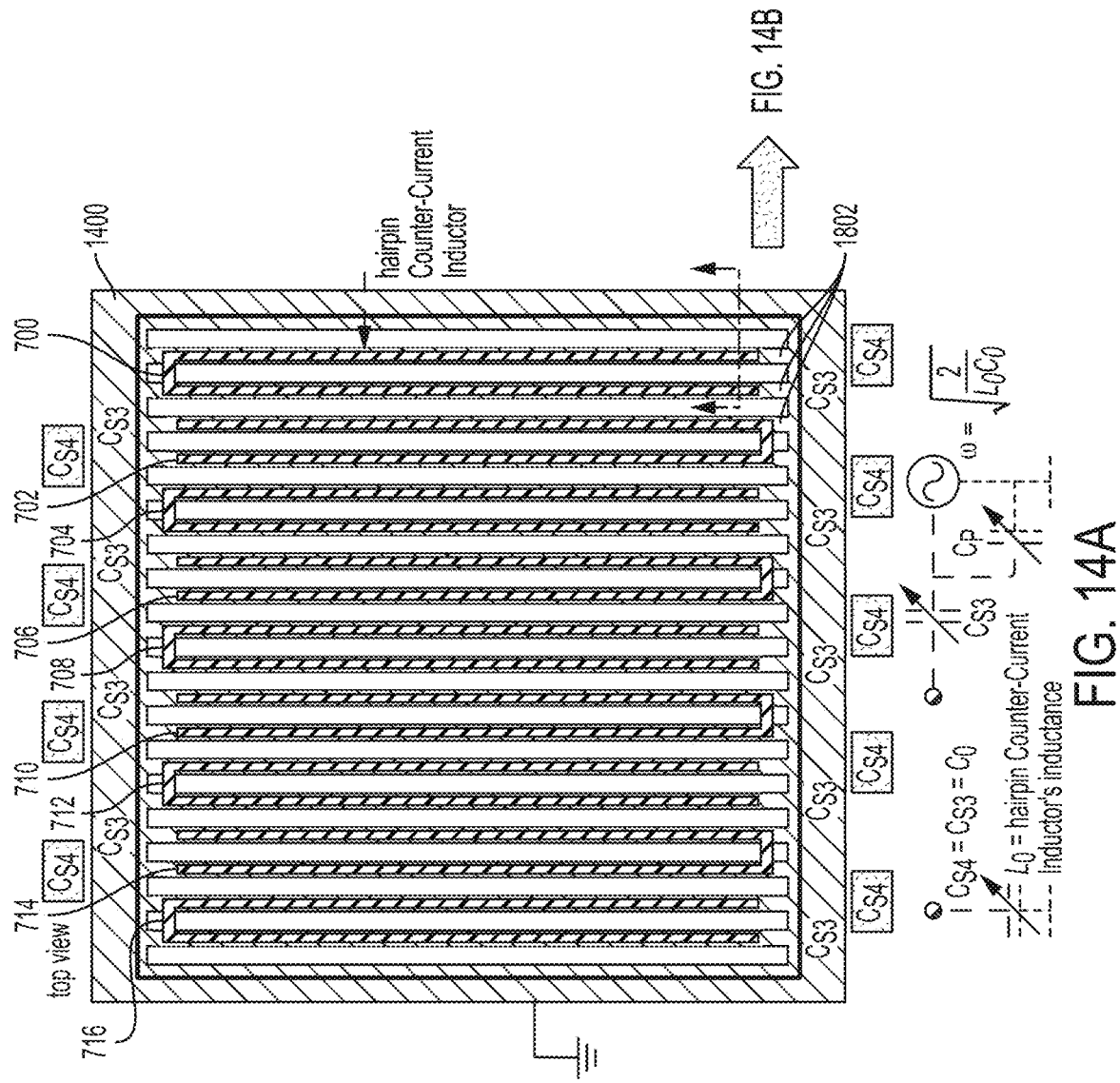
FIG. 14A illustrates an overhead view of an RF antenna disposed over a grounded counter-current inductor for coupling RF power into a chamber, in accordance with implementations of the disclosure.

FIG. 14A illustrates an overhead view of an RF antenna disposed over a grounded counter-current inductor for coupling RF power into a chamber, in accordance with implementations of the disclosure. The RF antenna 110 in accordance with the implementation of FIG. 7 (including segments 700, 702, 704, 706, 708, 710, 712, 714, and 716) is shown disposed over a grounded (counter current) inductor 1400. The RF antenna 110 is positioned above the dielectric window, while the grounded inductor 1400 is positioned below the dielectric window in the process region of the chamber. Broadly speaking, the RF antenna 110 is powered as previously discussed and induces currents in the grounded inductor 1400, which in turn inductively generate the plasma in the process region.

As shown, the grounded inductor 1400 includes grounded inductor lines 1402 that are positioned directly beneath the conductive lines of the RF antenna 110.

Figure 14B:
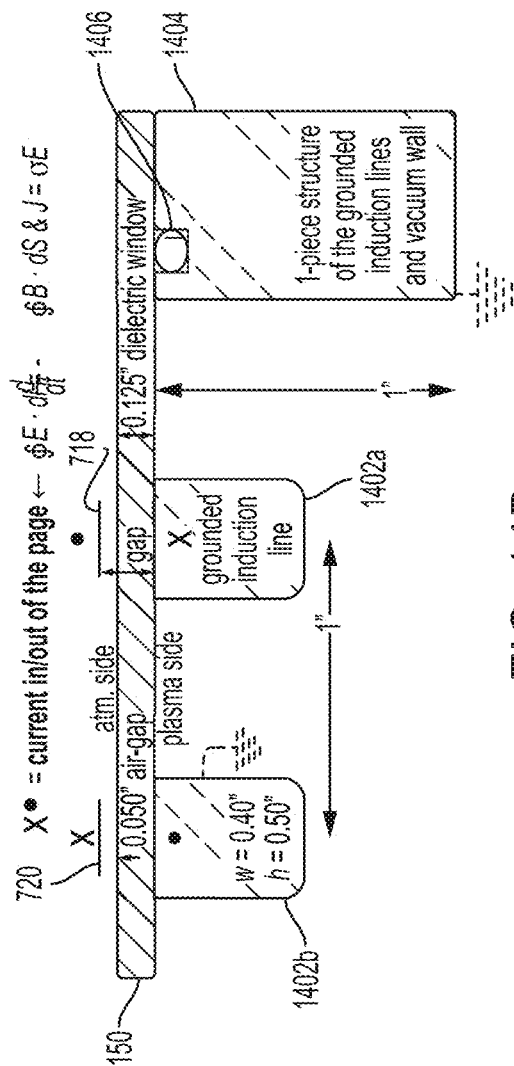
FIG. 14B illustrates a cross section view of the grounded inductor 1400, in accordance with implementations of the disclosure.

FIG. 14B illustrates a cross section view of the grounded inductor 1400, in accordance with implementations of the disclosure. The conductive lines 718 and 720 of the segment 700 of the RF antenna 110 are shown disposed over the dielectric window 150, and separated therefrom by an airgap of approximately 0.050 inch (0.13 cm) in some implementations. The grounded inductor lines 1402a and 1402b are aligned below the conductive lines 718 and 720, respectively. In some implementations, the dielectric window 150 has a thickness of approximately 0.125 inch (0.32 cm). At such a thickness, the dielectric window may not be structurally strong enough to withstand the difference in pressure when the chamber is operated under vacuum conditions. Therefore, the grounded inductor lines 1402 of the grounded inductor 1400 may further serve to support the dielectric window 150, enabling the dielectric window 150 to be constructed with low thickness (e.g. less than about 0.25 inch (0.6 cm) in some implementations).

In some implementations, a typical current flowing in a hairpin segment such as segment 718 of the RF antenna 110 is about 80 amps. However, because the segment is thin, it has a certain inductance. The grounded inductor line 1402a has a much larger cross sectional area so its inductance, in some implementations, is about four times lower than that of the segment 718. So assuming conservation of flux for the sake of simplification, then the current in the grounded inductor line 1402a becomes about four times higher than the current in the segment 718. So the 80 amps flowing in the segment 718 becomes approximately 320 amps flowing in the grounded induction line 1402a. And with the current amplified four times, then the voltage in the grounded induction line 1402a is reduced by a factor of four.

Thus, the voltage can be reduced both by the segmentation of the RF antenna 110 and by using the grounded inductor 1400. By way of example without limitation, at for example, 3 kW of power and 80 amps current, the voltage in a single continuous line RF antenna design (as in implementation of FIG. 5) may be in the range of about 8000 V. However, by splitting the RF antenna into, for example, a nine segmented hairpin design (as in implementation of FIG. 7), the voltage is approximately divided by the number of segments, so instead of 8000 V, the voltage in the segments is reduced (divided by nine) to approximately 900 V. And using the grounded inductor 1400e, because the inductance is lower, the current is further amplified about four times from 80 to 320 Amps, and when the current is amplified four times, the voltage drops four times. Thus, the 900 V in the RF antenna 110 drops down to a voltage in the grounded inductor 1400 in the range of about 200 to 300 V.

The grounded inductor lines 1402 are immersed in the plasma, so the magnetic flux generated by current in the grounded inductor lines 1402 will be strongly coupled to the plasma. A typical inductor is much further away from the plasma, and typically separated by a thicker window. However, implementations of the present disclosure provide for the inductor line to be located in the plasma with current amplified so the voltage drops.

In some implementations, the RF antenna 110 is powered with approximately 2 to 5 kW of power, to produce a high density plasma.

As shown, in some implementations, the grounded inductor lines 1402 have a cross-sectional width of about 0.4 inch (1 cm) and a cross-sectional height of about 0.5 inch (1.3 cm). The pitch of the grounded inductor lines 1402 is the same as that of the conductive lines of the RF antenna 110. Hence, in some implementations, the pitch of the grounded inductor lines 1402 is about 1 inch (2.5 cm).

In some implementations, a frame 1404 of the grounded inductor 1400 is formed as a one-piece structure that forms part of the sidewalls of the process chamber, acting as a vacuum wall to structurally maintain the integrity of the chamber under vacuum. A gasket 1406 is embedded in the frame 1404 to provide a seal between the dielectric window 150 and the frame 1404 of the grounded inductor 1400. It will be appreciated that the inductor lines 1402 of the grounded inductor 1400 are attached at their ends to the frame 1404, and in some implementations, are formed as a continuous structure with the frame 1404.

It will be appreciated that the grounded inductor 1400 also serves as the Faraday shield, and thus there is no need for an additional Faraday shield to block the electric field from the RF antenna 110, as the electric field is absorbed by the grounded inductor 1400.

Additionally, in some implementations, the gap between the conductive lines of the RF antenna 110 and the grounded inductor lines of the grounded inductor 1400 can be configured to be the smallest possible to maximize inductive coupling while also being large enough to support a stray capacitance that can facilitate the series resonance.

Figure 14C:
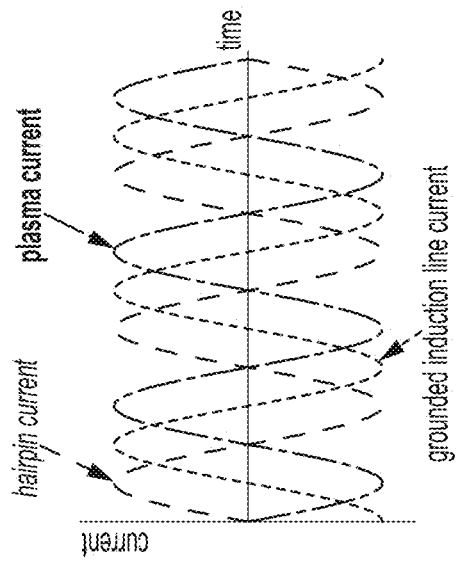
FIG. 14C is a graph illustrating the relative phases of the currents in the structures of the plasma processing system, in accordance with the implementation of FIG. 14A.

FIG. 14C is a graph illustrating the relative phases of the currents in the structures of the plasma processing system, in accordance with the implementation of FIG. 14A. As shown, but without being bound by any particular theory of operation, it is submitted that in some implementations, the current in the grounded induction lines of the grounded inductor 1400 is approximately 90 degrees phase-shifted from the current in the respective conductive lines (hairpin current) of the RF antenna 110. Further, the current in the plasma is submitted to be approximately 90 degrees phase-shifted from the current in the grounded inductor 1400. Thus, the current in the plasma is submitted to be approximately 180 degrees phase-shifted from the current in the RF antenna 110.

Figure 14D:
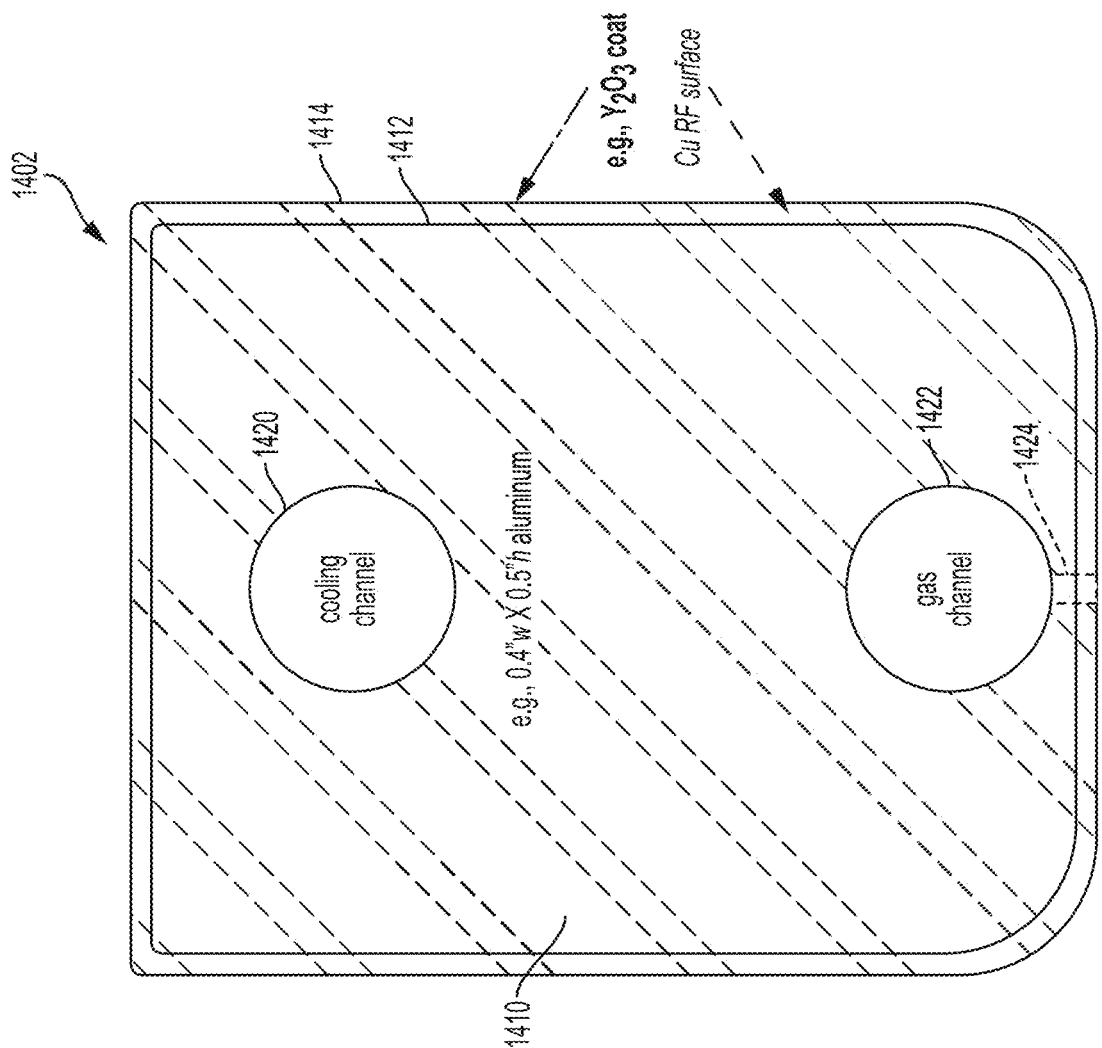
FIG. 14D illustrates a cross-section view of a grounded inductor line 1402 of the grounded inductor 1400, in accordance with the implementation of FIG. 14A.

FIG. 14D illustrates a cross-section view of a grounded inductor line 1402 of the grounded inductor 1400, in accordance with the implementation of FIG. 14A. As shown, in some implementations, the structure includes an aluminum central body 1410, which provides suitable strength to support the dielectric window 150 during vacuum processes. However, while aluminum is strong, it is not a good RF conductor. Therefore, the aluminum body 1410 can be coated with a highly conductive material such as Cu or Ni—Ag—Ni, to form a conductive coating 1412 over the central body 1410. Then a protective coating 1414 can be deposited over the conductive coating 1412, the protective coating 1414 consisting of a material that will be chemically non-reactive during process conditions, such as yttrium oxide ($Y_2O_3$).

Additionally, in some implementations, cooling channels 1420 can be defined within the grounded inductor lines 1402, to enable a coolant to be circulated within the grounded inductor 1400 and provide for temperature control of the grounded inductor 1400.

Further, in some implementations, gas channels 1422 can be run within the grounded inductor lines 1402, which allow process gases to be fed into the chamber through the grounded inductor 1400. Process gases can be routed into the gas channels 1422 and distributed into the process region through exit holes 1424. The integration of a showerhead is generally always a problem for any system with a dielectric window. However, the grounded inductor 1400 disclosed herein provides a metal piece within which channels for liquid cooling and process gases can be run, so that the dielectric window 150 does not need to have any holes as in other systems.

Figure 15A:
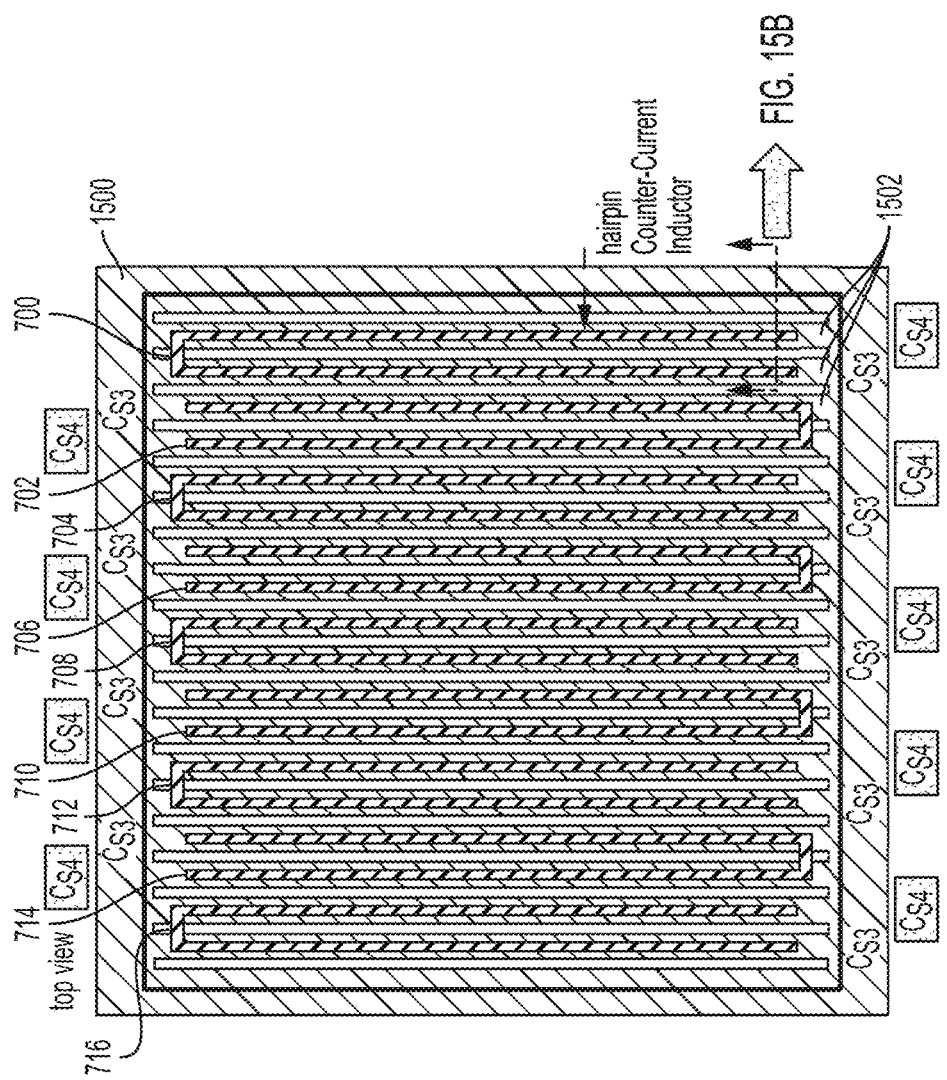
FIGS. 15A and 15B illustrate overhead and cross-section views, respectively, of a grounded inductor 1500, in accordance with implementations of the disclosure.
Figure 15B:
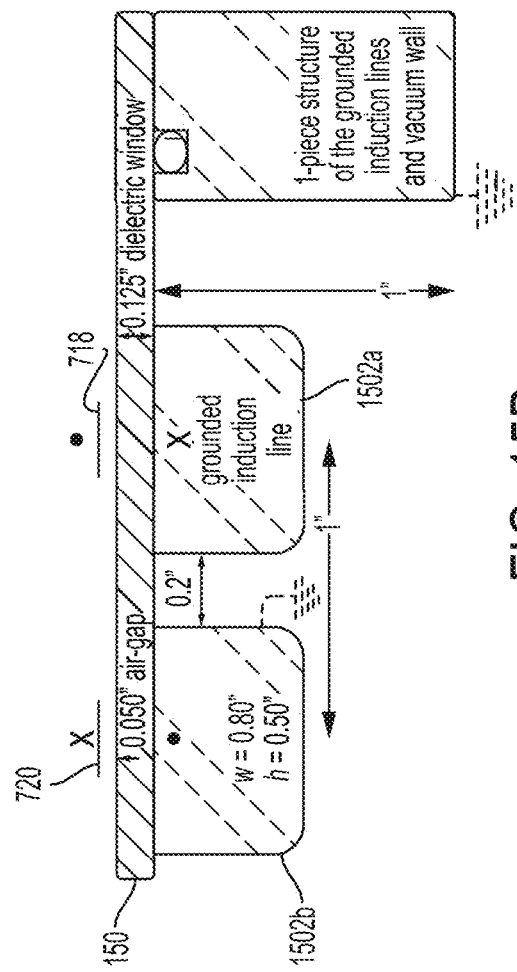

FIGS. 15A and 15B illustrate overhead and cross-section views, respectively, of a grounded inductor 1500, in accordance with implementations of the disclosure. The grounded inductor 1500 of FIGS. 15A and 15B differs from the grounded inductor 1400 of FIGS. 14A and 14B primarily in that the width of the grounded inductor lines 1502 is widened to have a width of approximately 0.8 inch (2 cm).

In existing ICP systems, it is generally desirable to have the Faraday shield oriented with lines running perpendicular to the inductor lines, and for the Faraday shield to have gaps so that magnetic flux to come through the Faraday shield into the process region. However, in the present design of the grounded inductor structure, it is desired to not have any magnetic flux from the RF antenna 110 to come in to the plasma. Rather, it is desirable to have the magnetic flux induce electric field above and below.

For the currents indicated by the X and the dot, indicating the current traveling in/out of the page, respectively, $$\oint E \cdot dl = -\frac{d}{dt} \oint B \cdot dS \quad \& \quad J = \sigma E$$

J is current; sigma is conductivity; E is the electric field.

The grounded inductor 1400 is in some implementations, aluminum coated with copper (Cu) (as noted above) which has significantly better conductivity than the plasma. Thus, the flux of the RF antenna 110 would not substantially generate plasma current, as the current in the RF antenna 110 would principally become current in the copper of the grounded inductor 1400. Thus the magnetic flux by the RF antenna 110 is substantially completely blocked by the grounded inductor lines. In some implementations, the gap between the grounded inductor lines can be a very small gap, e.g. less than about 0.5 inch (1.3 cm) in some implementations, about 0.2 inch (0.5 cm) in some implementations.

The proximity of the grounded induction lines (e.g., 0.2") could force a ~90° line-to-line current phase; its effect of enhancing "spatial stochastic" heating is discussed further below. The proximity also increases counter-current mutual induction resulting in a reduced inductance for the grounded induction line and that, reduces the peak voltage on the grounded induction line for a given current. The wider grounded induction line could also benefit the local plasma-density uniformity.

Figure 16:
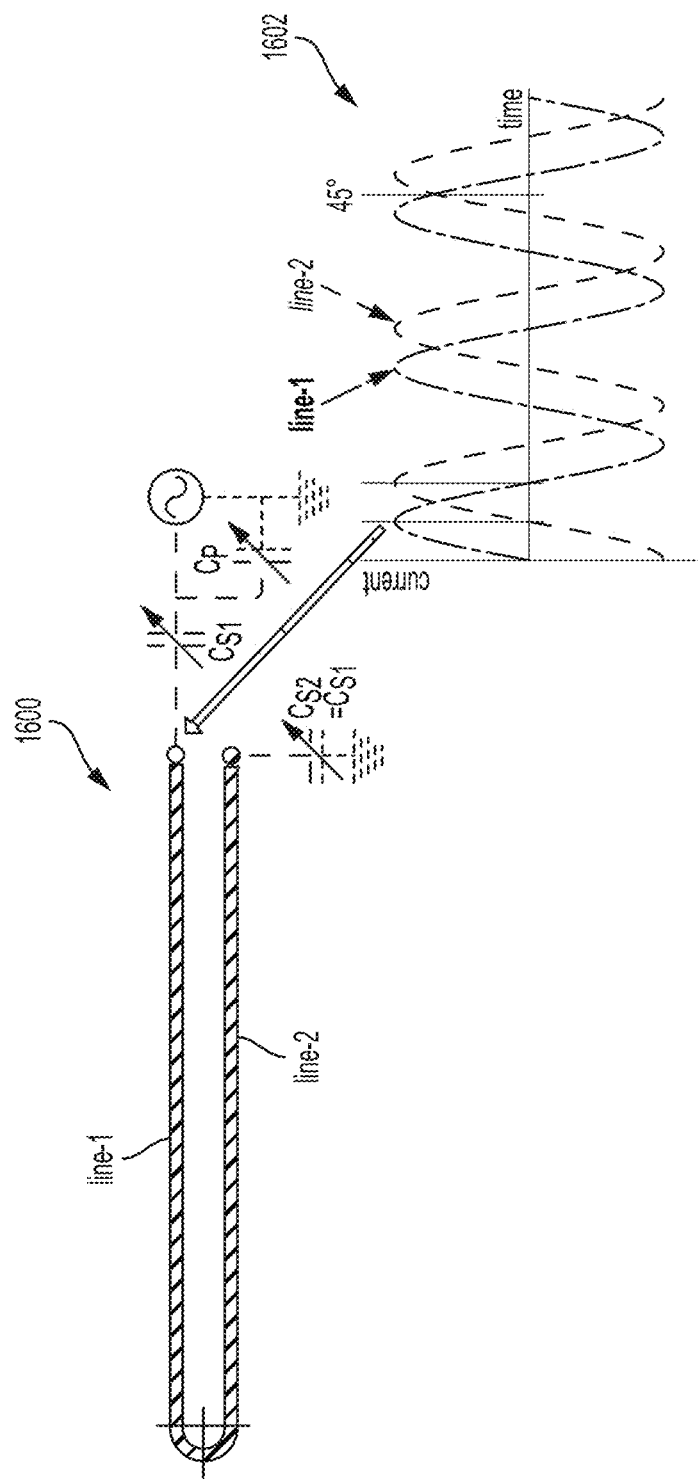
FIG. 16 illustrates a single hairpin counter-current inductor segment, in accordance with implementations of the disclosure.

FIG. 16 illustrates a single hairpin counter-current inductor segment, in accordance with implementations of the disclosure. The segment 1600 as shown can be part of an array of such segments organized to form a counter-current inductor RF antenna 110 in accordance with implementations discussed above. An issue to consider is the precise current phase along the two conductive lines of the segment 1600, indicated as line-1 and line-2 in the illustrated implementation.

Without being bound by any particular theory of operation, it is nonetheless posited that each ladder piece is likely not a uniform-current inductor. For line-to-line induction is believed to play a part in affecting the current phase. A graph 1602 illustrates by way of example without limitation, a 90 degree line-to-line current phase, that is believed to occur if line-to-line induction dominates. However, it is noted that if line-to-line conduction (real current) dominates, then the line-to-line current phase is 180 degrees, as the 180 degree direction change forced by the hairpin turn geometry will produce this.

In view of both line-to-line conduction and induction effects on current phase, it is therefore possible that perhaps the line-to-line current phase is a mixture from 90 degrees to 180 degrees varying along the length of a line to the current/voltage nodes.

Figure 17:
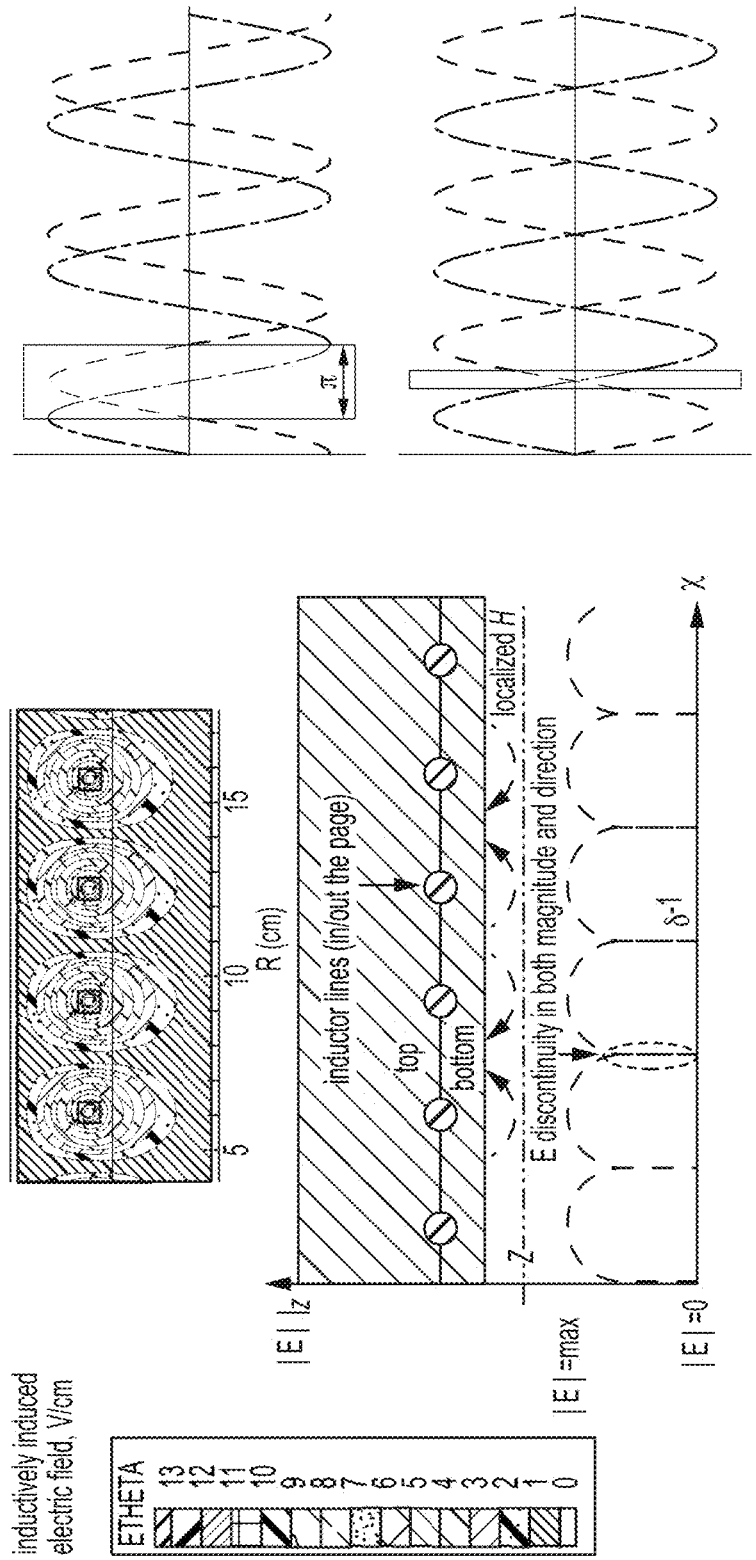
FIG. 17 illustrates the effect of 90 degree line-to-line phased spatial-alternating plasma-skin induction currents, in accordance with implementations of the disclosure.

FIG. 17 illustrates the effect of 90 degree line-to-line phased spatial-alternating plasma-skin induction currents, in accordance with implementations of the disclosure.

∇×E is the highest within Δx~1 mm (simply due to ωB in Δx) and it will lead to "spatial" stochastic collisionless heating of the electrons as the electrons drift across Δx. In the absence of Landau damping and cyclotron resonance, such spatial stochastic collisionless heating occurs when electrons drift across Δx under a coincident phase condition. If the line-to-line phase were 180°, such coincident phase is very small. However, for the 90° line-to-line phase, such coincident phase is π⇒½ the time collisionless heating occurs. If the plasma is collisional, such a spatial stochastic process simply enhances ionization through collisional relaxation.

Thus, the effect of a 90 degree line-line current phase, if it exists, is enhanced ionization in addition to EEDf mixing among regions under the lines which normally occur even in the pure 180 degree condition.

Figure 18A:
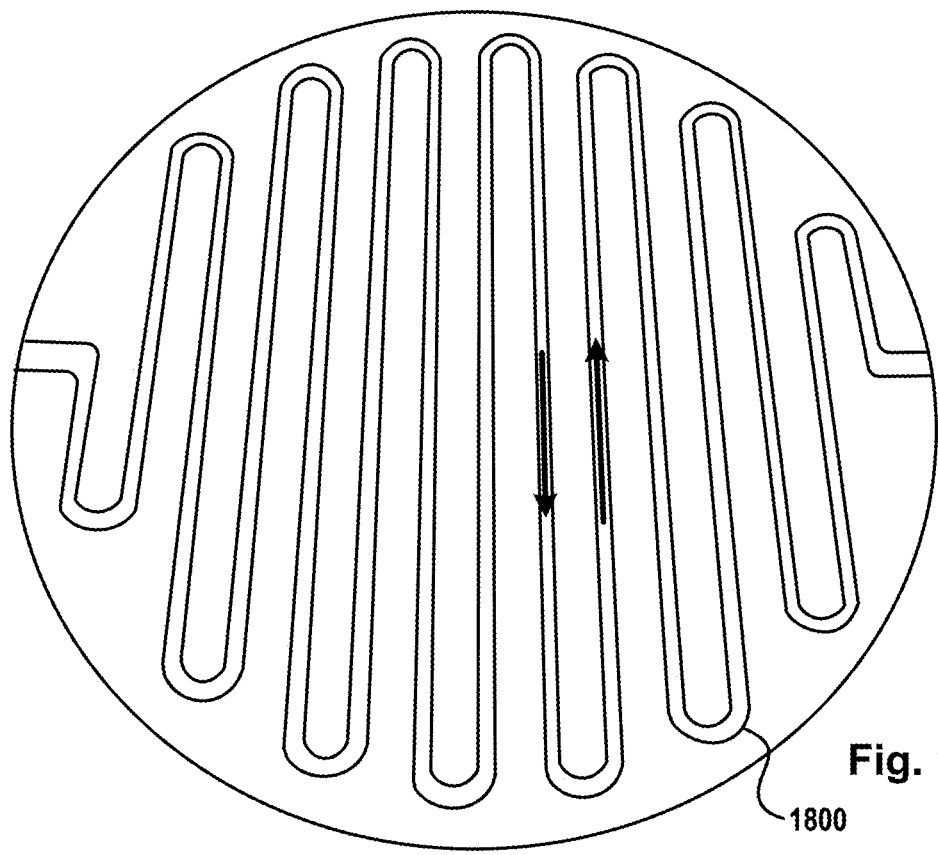
FIGS. 18A and 18B illustrate an RF antenna and corresponding experimental results, in accordance with implementations of the disclosure.

FIG. 18A illustrates an overhead view of an RF antenna 1800 having a series serpentine configuration, in accordance with implementations of the disclosure. The RF antenna has an inductance of 2.4 μH, a 0.25 inch line width, and the parallel lines are equally spaced and have a 1 inch pitch.

Figure 18B:
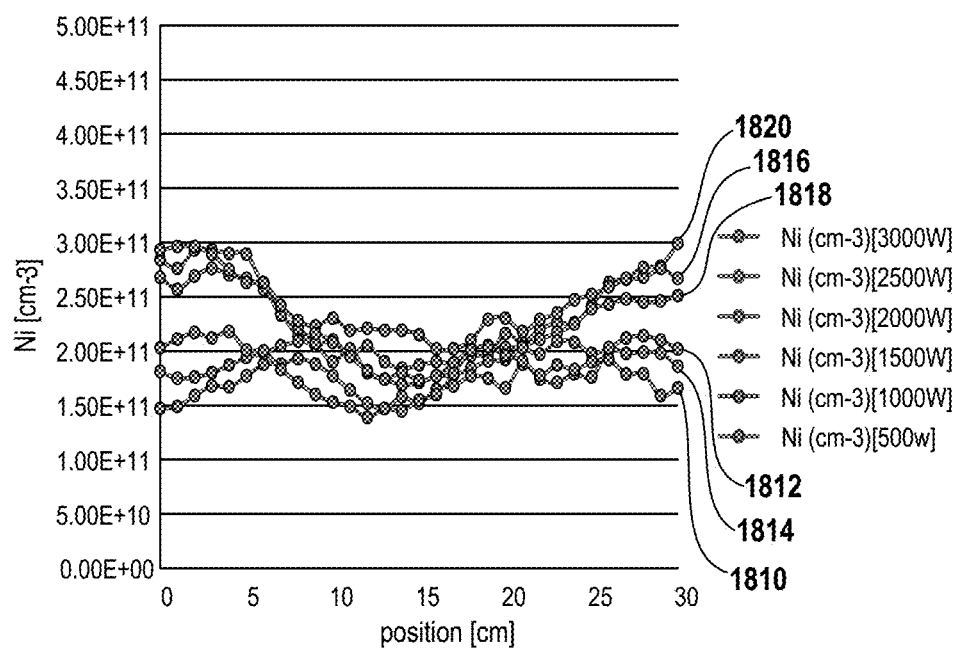

FIG. 18B is a graph showing ion density as a function of lateral position for a plasma generated using RF antenna 1800 under various powers. The lateral position is the position along a center line in the chamber running perpendicular to the lines of the RF antenna. In the illustrated implementation, results are shown for a 30 cm distance that is equivalent to measuring edge-to-edge across a 300 mm wafer plane. Ion density was measured using a moving Langmuir probe. Plasma was generated with 50 mT Ar, in a chamber having a 2 inch vertical gap from the dielectric window to the wafer plane.

The curves 1810, 1812, 1814, 1816, 1818, and 1820 correspond to results for power levels of 500 W, 1000 W, 1500 W, 2000 W, 2500 W, and 3000 W, respectively.

In the following disclosure, several different examples of RF antenna configurations are shown and tested. The inductor lines generally have a height of approximately ½ inch and a width of approximately ⅛ inch. However it will be appreciated that in other implementations the height and width of the inductor lines may vary. Broadly speaking, an inductor line height greater than its width can be beneficial to reduce capacitive coupling versus inductive coupling. For purposes of experimentation, RF power was applied at a frequency of 13.56 MHz. However, it will be appreciated that in other implementations the frequency of the power may vary, e.g. in a range of about 400 kHz to about 2 MHz.

Figure 19A:
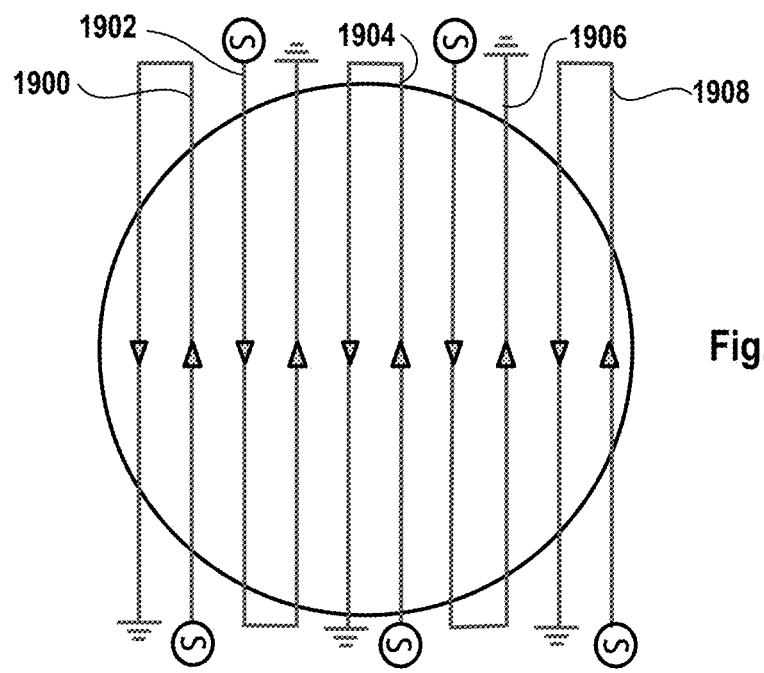
FIGS. 19A and 19B illustrate an RF antenna, in accordance with implementations of the disclosure.

FIG. 19A schematically illustrates an RF antenna having five hairpin segments 1900, 1902, 1904, 1906, and 1908. The segments are arranged so that when powered, the RF antenna operates a counter-current inductor.

Figure 19B:
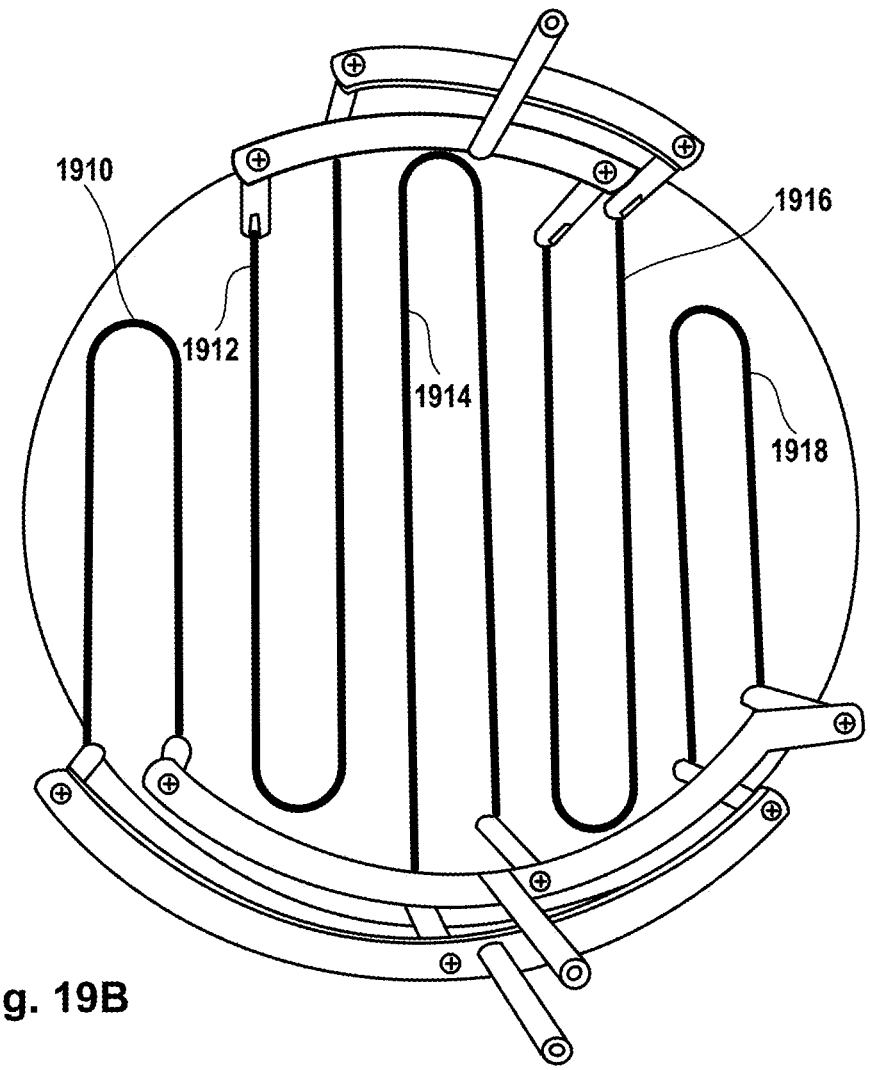

FIG. 19B illustrates an overhead view of an RF antenna in accordance with the implementation of FIG. 19A, including five hairpin segments 1910, 1912, 1914, 1916, and 1918, that form a counter-current inductor.

FIG. 20A illustrates a single hairpin element 2000 having a 1.5 inch spacing between lines, in accordance with implementations of the disclosure.

FIG. 20B is a graph of ion density versus lateral position for a plasma generated using the single hairpin element 2000. The curves 2010 and 2012 illustrate results at 500 W and 1000 W, respectively.

FIG. 20C is a graph showing normalized density versus normalized power for the results shown at FIG. 20B.

Figures 21A, 21B:
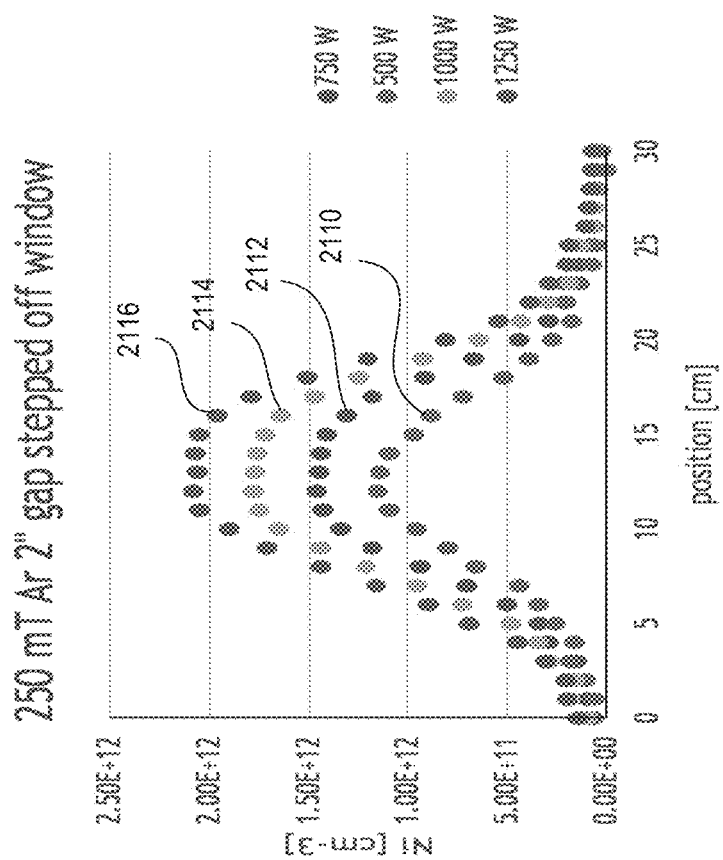
FIGS. 21A and 21B illustrate a hairpin segment for an RF antenna and corresponding experimental results, in accordance with implementations of the disclosure.

FIG. 21A illustrates a perspective view of a single hairpin element 2100 with a 0.125" spacing introduced between the antenna and the dielectric window 2102 to reduce capacitive coupling. As shown, the spacing was accomplished by using spacers 2104 and 2106 mounted on the dielectric window 2102. The thickness of the dielectric window 2102 is approximately ¾ inch.

FIG. 21B is a graph of ion density versus lateral position for a plasma generated at 250 mT Ar using the single hairpin element 2100 with the 0.125 inch spacing off the dielectric window. The curves 2110, 2112, 2114, and 2116 illustrate results at 500 W, 750 W, 1000 W, and 1250 W, respectively.

Figure 22B:
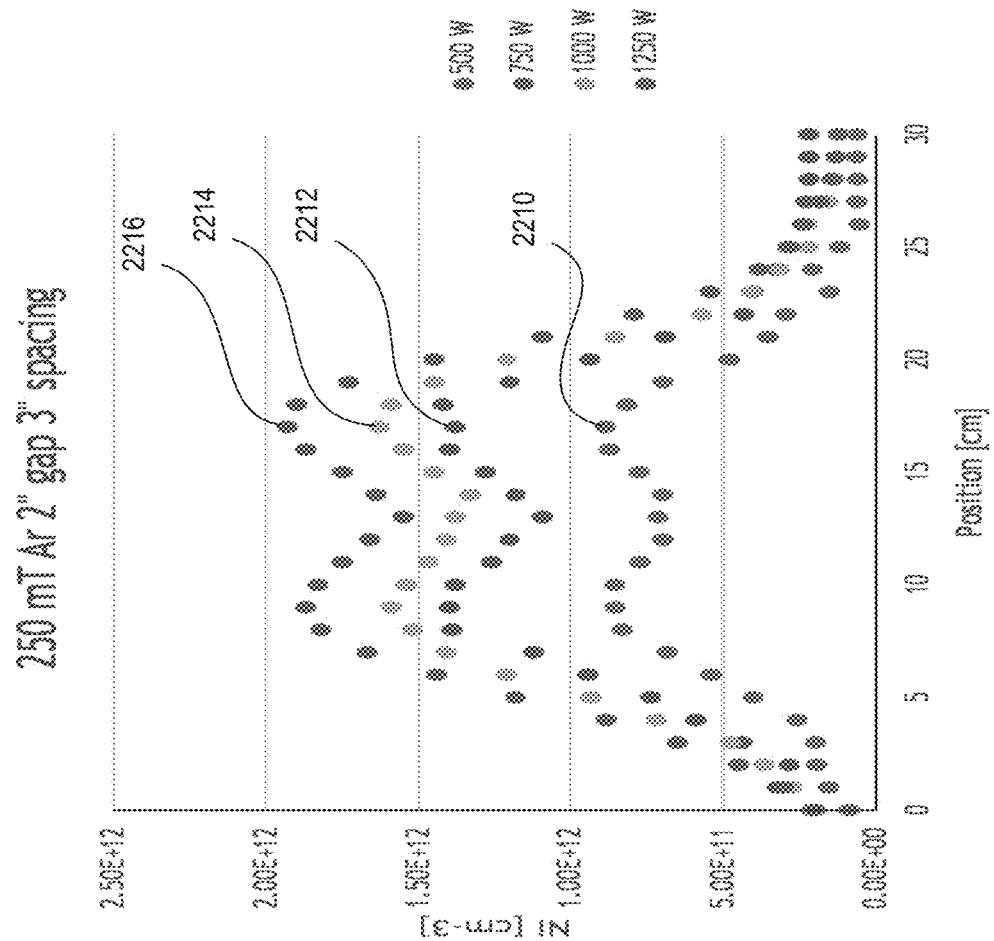
FIGS. 22A and 22B illustrate a hairpin segment for an RF antenna and corresponding experimental results, in accordance with implementations of the disclosure.
Figure 22A:
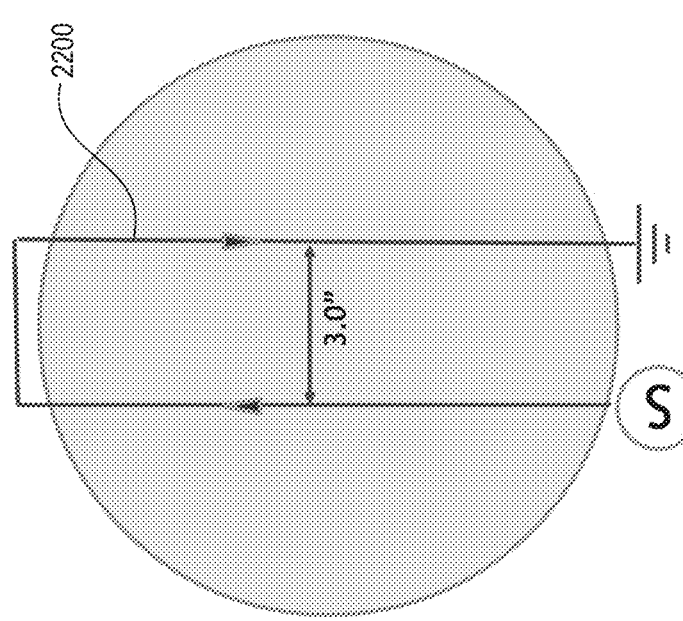

FIG. 22A schematically illustrates a single hairpin element 2200 having a 3 inch spacing.

FIG. 22B is a graph of ion density versus lateral position for a plasma generated at 250 mT Ar using the single hairpin element 2200. The curves 2210, 2212, 2214, and 2216 illustrate results at 500 W, 750 W, 1000 W, and 1250 W, respectively.

Figure 23C:
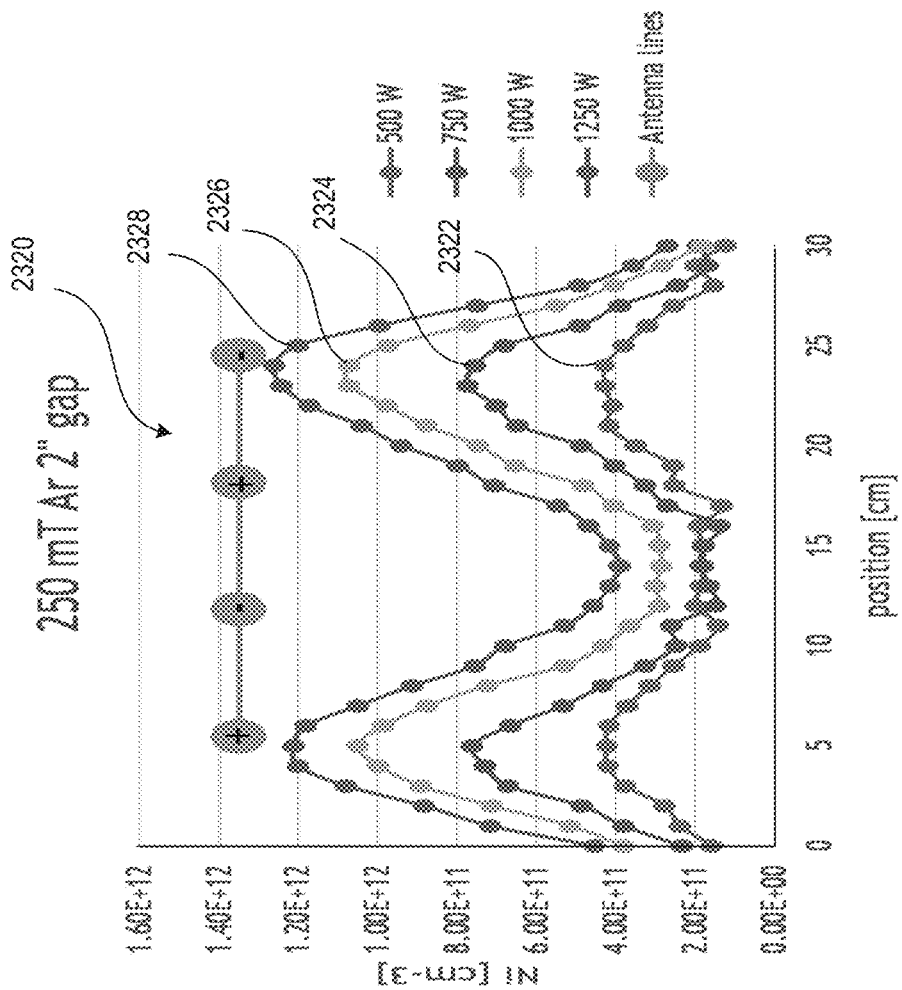
FIGS. 23A, 23B, and 23C illustrate an RF antenna and corresponding experimental results, in accordance with implementations of the disclosure.
Figure 23A:
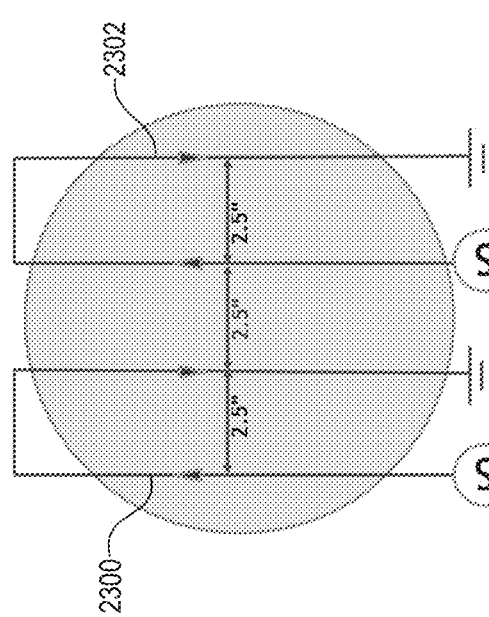

FIG. 23A schematically illustrates an RF antenna consisting of two segments 2300 and 2302, having a line spacing of 2.5"/2.5"/2.5" as shown, and configured as a counter-current inductor.

Figure 23B:
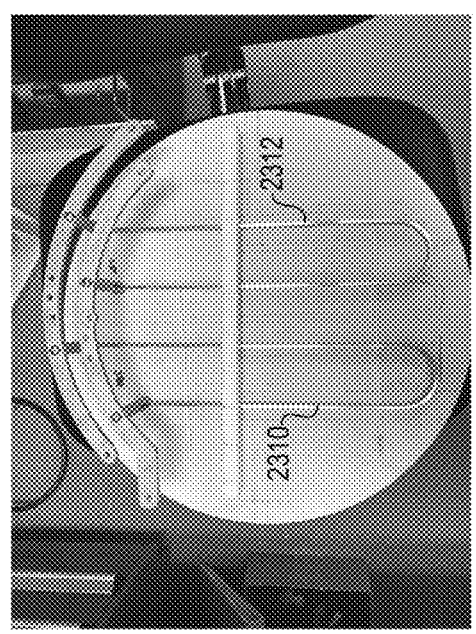

FIG. 23B illustrates an overhead view of an RF antenna having segments 2310 and 2312, in accordance with the implementation of FIG. 23A.

FIG. 23C is a graph of ion density versus lateral position for a plasma generated at 250 mT Ar using the RF antenna of FIG. 23B. The approximate lateral locations of the antenna lines are shown at reference 2320. The curves 2322, 2324, 2326, and 2328 illustrate results at 500 W, 750 W, 1000 W, and 1250 W, respectively.

FIG. 24A schematically illustrates an RF antenna consisting of two hairpin segments 2400 and 2402, having a line spacing of 2.5"/2.5"/2.5" as shown, and configured as a partially parallel-current and partially counter-current inductor. As can be seen, the segments are configured and arranged so that within a single hairpin segment, current in adjacent lines runs in opposite directions, whereas between the two hairpin segments, current in the adjacent lines runs in the same direction. In some embodiments, the separation between the inner segments of the hairpin conductive lines can be adjusted to be increased or decreased as a tuning knob, to influence uniformity across the wafer. In the example of FIG. 24A, two hairpin conductive lines are shown. In other embodiments, additional hairpin conductive lines can be added, e.g., four hairpin conductive lines. The connections of power and ground to each hairpin conductive line can be made to set whether the current in adjacent inner lines run in the same direction or in opposite directions. In other cases, the power source connected to each segment can be separately controlled, e.g., to provide different power, voltage, and/or frequency to each hairpin conductive line. In this manner, not only can the structural placement of the hairpin conductive lines be set at different separations, but the power/current provided to each segment can also be individually set or dynamically adjusted to achieve the desired uniformity profiles. By way of example, FIGS. 31C and 32C show how uniformity can be achieved by the set relative orientation of the hairpin conductive lines, e.g., relative to each other, and the connections to the RF power source and ground.

FIG. 24B illustrates an overhead view of an RF antenna having segments 2410 and 2412, in accordance with the implementation of FIG. 24A.

FIG. 24C is a graph of ion density versus lateral position for a plasma generated at 120 mT Ar using the RF antenna of FIG. 24B. The approximate lateral locations of the antenna lines are shown at reference 2420. The curves 2422, 2424, 2426, and 2428 illustrate results at 500 W, 750 W, 1000 W, and 1250 W, respectively.

FIG. 25A schematically illustrates an RF antenna consisting of two hairpin segments 2500 and 2502, having a line spacing of 2.5"/3.5"/2.5" as shown, and configured as a partially parallel-current and partially counter-current inductor. The implementation of FIG. 25A is similar to that of FIG. 24A, but with a wider center spacing.

FIG. 25B illustrates an overhead view of an RF antenna having segments 2510 and 2512, in accordance with the implementation of FIG. 25A.

FIG. 25C is a graph of ion density versus lateral position for a plasma generated at 250 mT Ar using the RF antenna of FIG. 25B. The approximate lateral locations of the antenna lines are shown at reference 2520. The curves 2522, 2524, 2526, and 2528 illustrate results at 500 W, 750 W, 1000 W, and 1250 W, respectively.

Figure 26C:
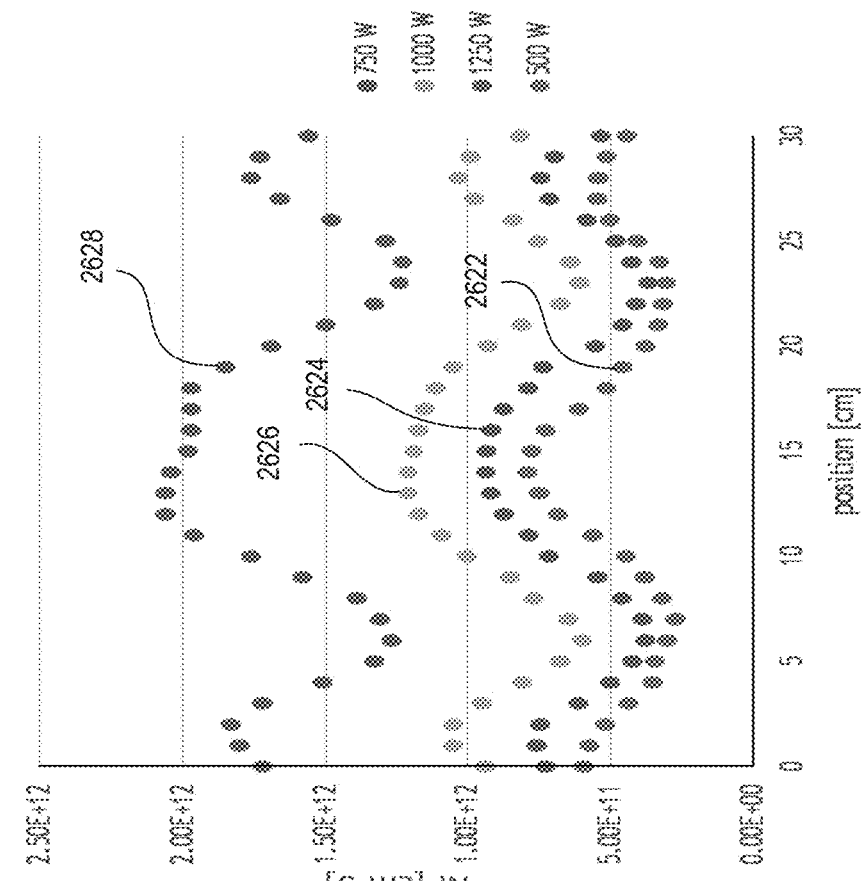
FIGS. 26A, 26B, and 26C illustrate an RF antenna and corresponding experimental results, in accordance with implementations of the disclosure.
Figure 26A:
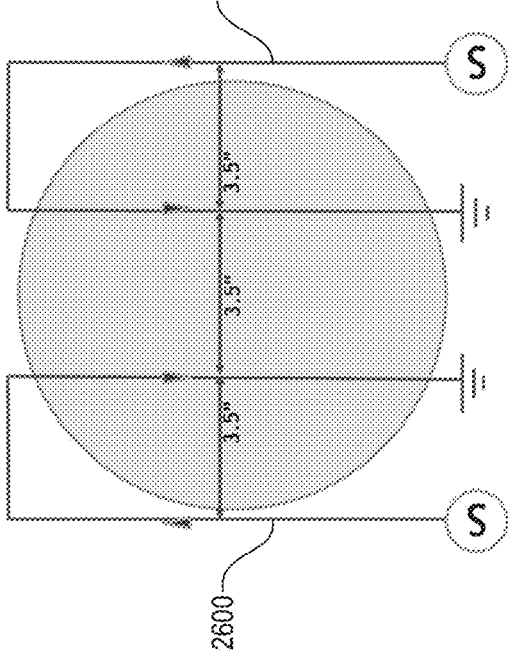

FIG. 26A schematically illustrates an RF antenna consisting of two hairpin segments 2600 and 2602, having an even line spacing of 3.5"/3.5"/3.5" as shown, and configured as a partially parallel-current and partially counter-current inductor. The implementation of FIG. 26A is similar to that of FIG. 25A, but with a wider even spacing.

Figure 26B:
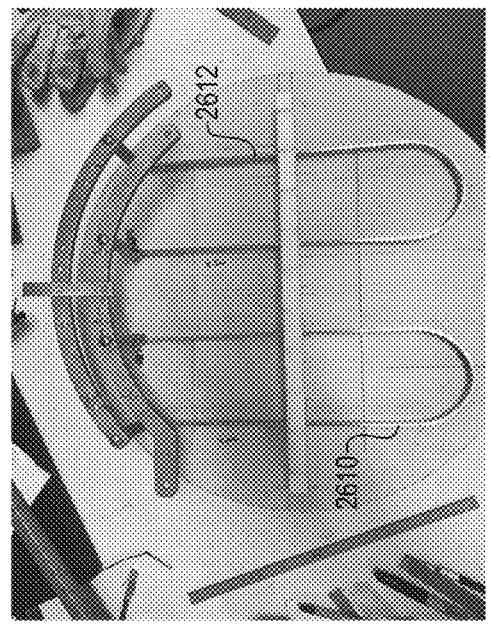

FIG. 26B illustrates an overhead view of an RF antenna having segments 2610 and 2612, in accordance with the implementation of FIG. 26A.

FIG. 26C is a graph of ion density versus lateral position for a plasma generated at 250 mT Ar using the RF antenna of FIG. 26B. The curves 2622, 2624, 2626, and 2628 illustrate results at 500 W, 750 W, 1000 W, and 1250 W, respectively.

Figure 27A:
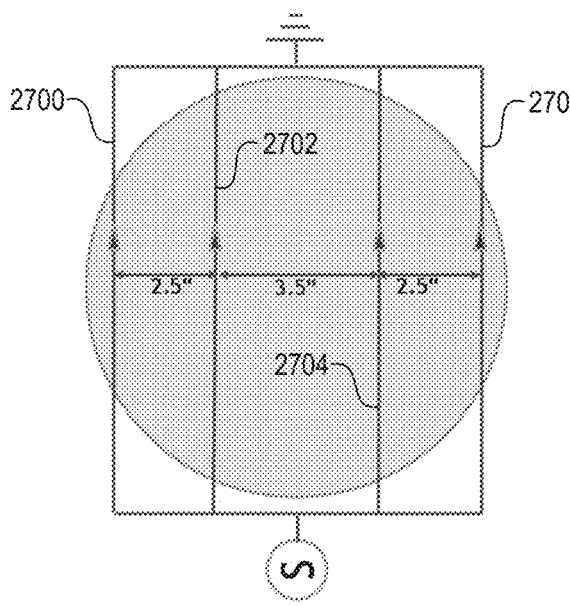
FIGS. 27A, 27B, and 27C illustrate an RF antenna and corresponding experimental results, in accordance with implementations of the disclosure.

FIG. 27A schematically illustrates an RF antenna consisting of several lines 2700, 2702, 2704, and 2706, connected in parallel, and having a line spacing of 2.5"/3.5"/2.5" as shown, and configured as an anti-counter current array/inductor or parallel-current array/inductor. That is, when the RF antenna is powered, the current in the inductor lines runs parallel in the same direction. The implementation of FIG. 27A is similar to that of FIG. 25A in terms of line spacing, but with complete parallel current as noted.

Figure 27B:
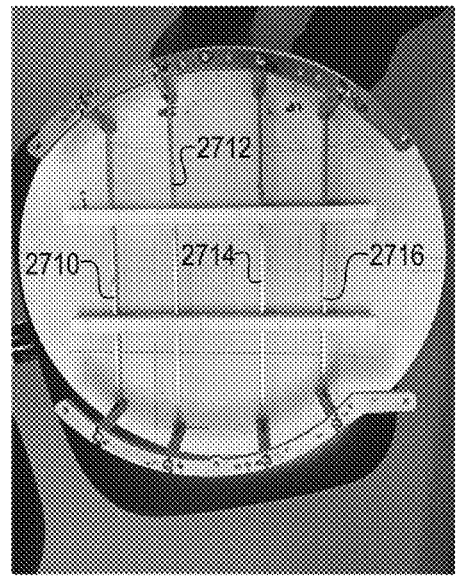

FIG. 27B illustrates an overhead view of an RF antenna having lines 2710, 2712, 2714, and 1716, in accordance with the implementation of FIG. 27A.

Figure 27C:
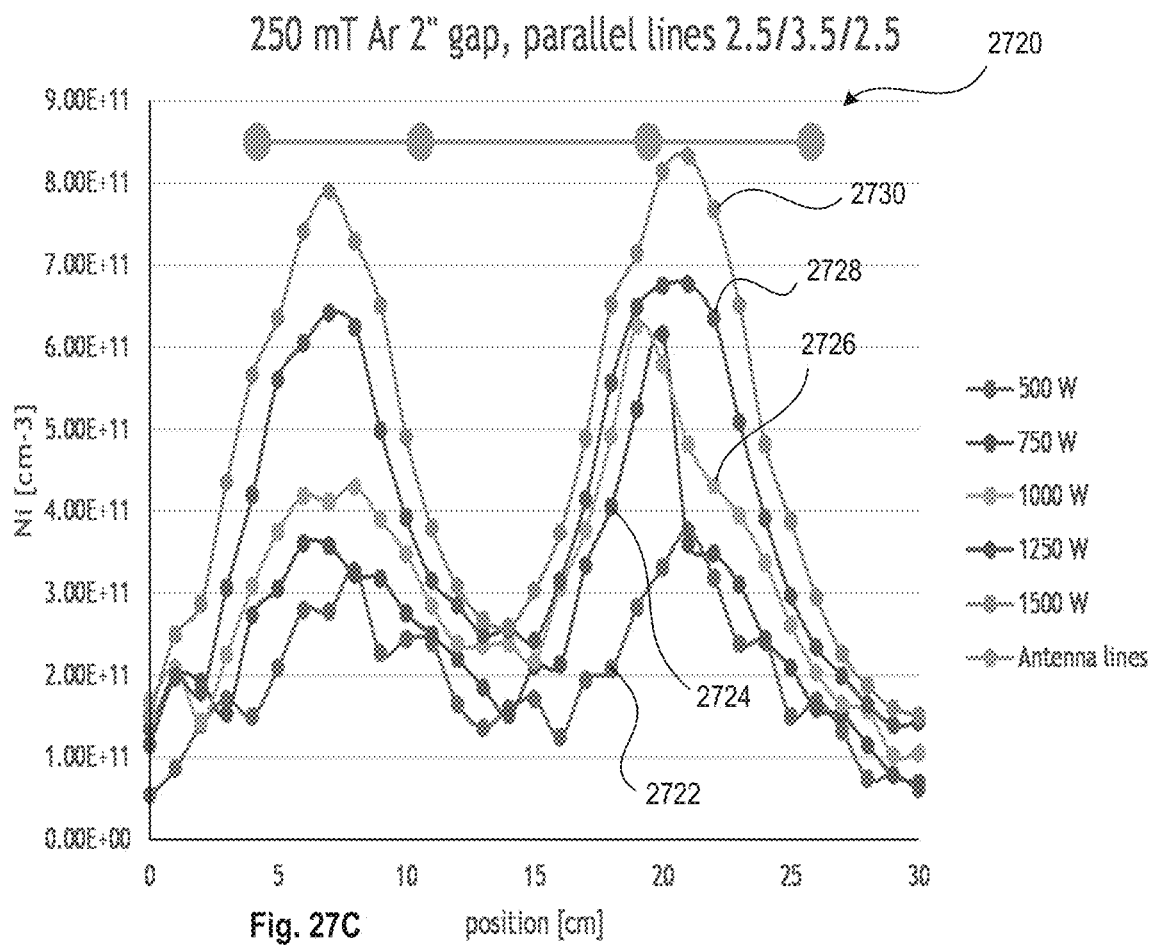

FIG. 27C is a graph of ion density versus lateral position for a plasma generated at 250 mT Ar using the RF antenna of FIG. 27B. The approximate lateral locations of the antenna lines are shown at reference 2720. The curves 2722, 2724, 2726, 2728, and 2730 illustrate results at 500 W, 750 W, 1000 W, 1250 W, and 1500 W, respectively.

Figure 28A:
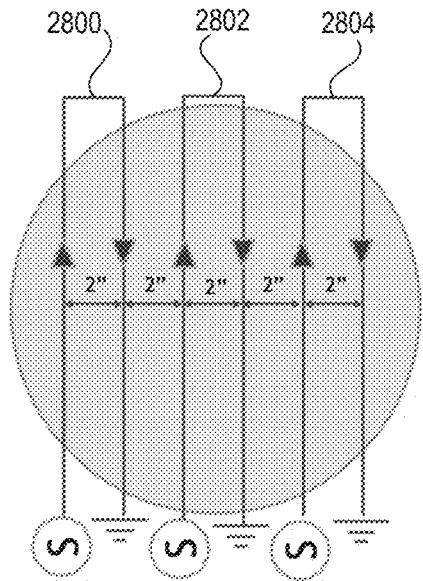
FIGS. 28A, 28B, and 28C illustrate an RF antenna and corresponding experimental results, in accordance with implementations of the disclosure.

FIG. 28A schematically illustrates an RF antenna having three hairpin segments 2800, 2802, and 2804, having an even line spacing of two inches as shown, and configured as a counter current inductor.

Figure 28B:
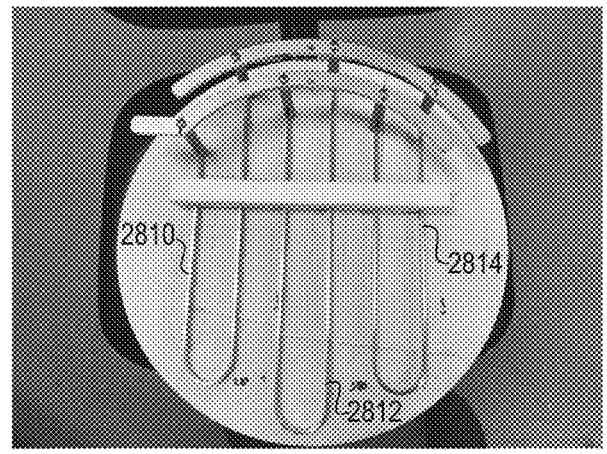

FIG. 28B illustrates an overhead view of an RF antenna having hairpin segments 2810, 2812, and 2814, in accordance with the implementation of FIG. 28A.

Figure 28C:
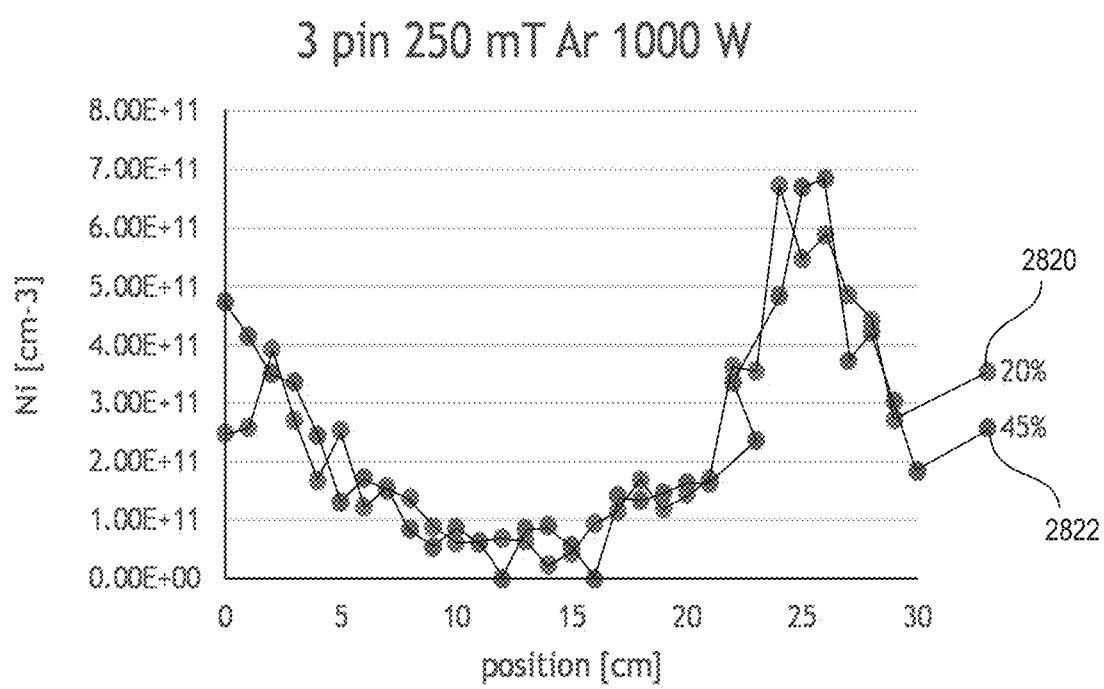

FIG. 28C is a graph of ion density versus lateral position for a plasma generated at 250 mT Ar, 1000 W, using the RF antenna of FIG. 28B. The curves 2820 and 2822 illustrate results at 20% and 45%, respectively.

Figure 29A:
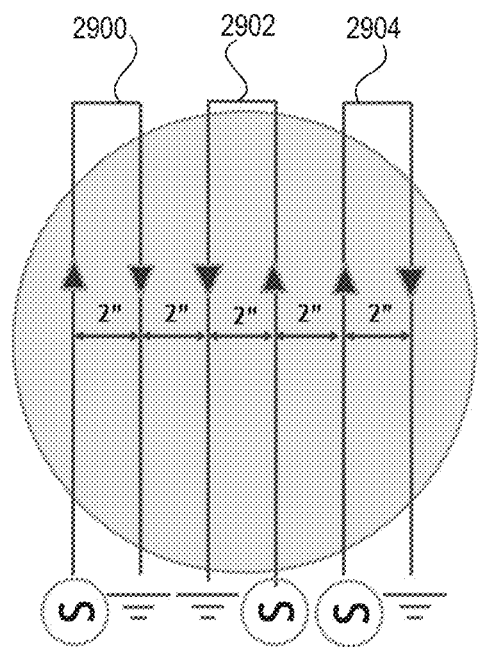
FIGS. 29A, 29B, and 29C illustrate an RF antenna and corresponding experimental results, in accordance with implementations of the disclosure.

FIG. 29A schematically illustrates an RF antenna consisting of three hairpin segments 2900, 2902, and 2904, having an even spacing of two inches as shown, and configured as a partially parallel-current and partially counter-current inductor.

Figure 29B:
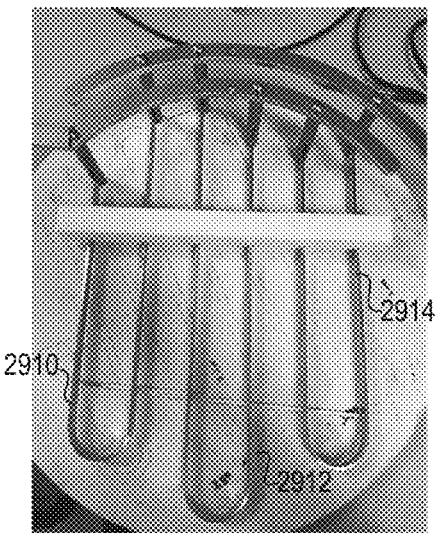

FIG. 29B illustrates an overhead view of an RF antenna having segments 2910, 2912, and 2914, in accordance with the implementation of FIG. 29A.

Figure 29C:
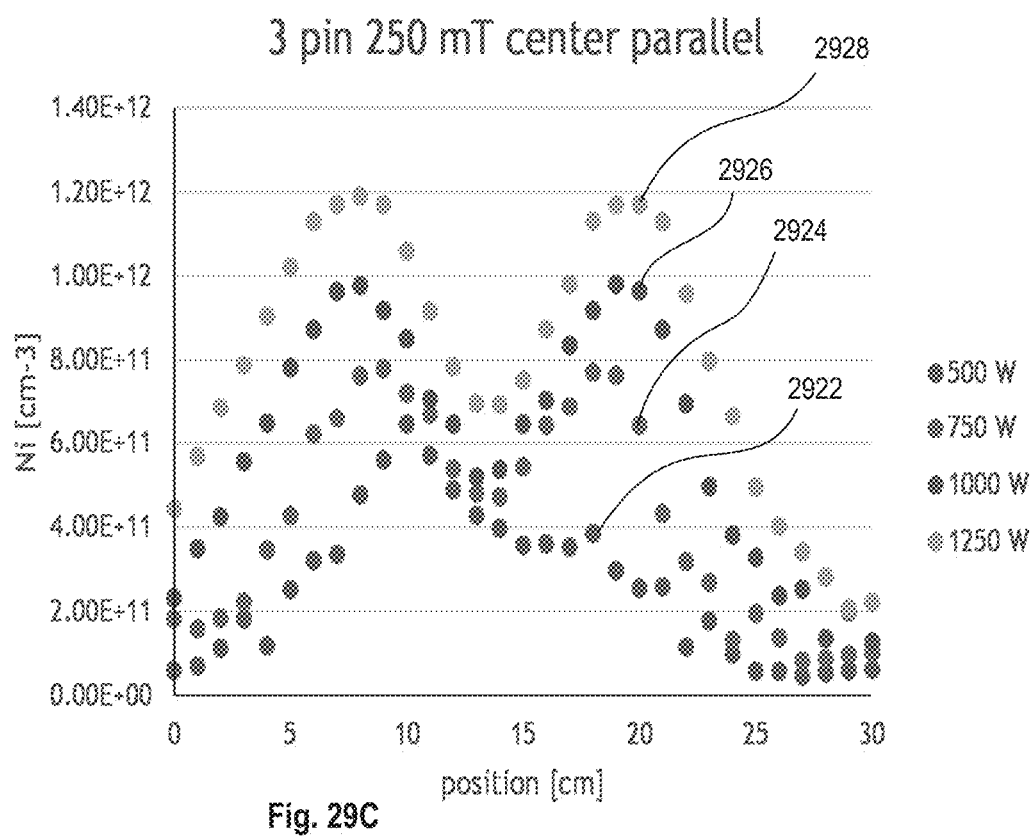

FIG. 29C is a graph of ion density versus lateral position for a plasma generated at 250 mT Ar using the RF antenna of FIG. 29B. The curves 2922, 2924, 2926, and 2928 illustrate results at 500 W, 750 W, 1000 W, and 1250 W, respectively.

Figure 30A:
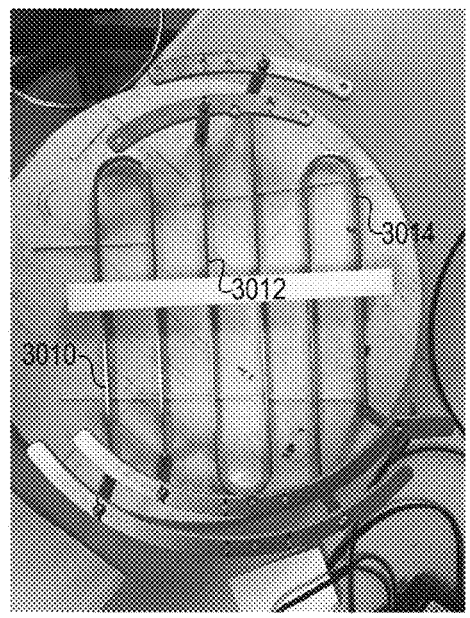
FIGS. 30A and 30B illustrate an RF antenna and corresponding experimental results, in accordance with implementations of the disclosure.

FIG. 30A illustrates an overhead view of an RF antenna consisting of three hairpin segments 3010, 3012, and 3014, having an even spacing of two inches as shown, and configured as a counter-current inductor, but with an alternating reverse setup of the hairpin segments, so that adjacent hairpin segments powered/grounded from opposite sides. The implementation of FIG. 30A is similar to that of FIG. 28A and 28B, except that the middle hairpin segment 3002 is powered and grounded from the opposite side when compared to the outer two hairpin segments 3002 and 3004.

Figure 30B:
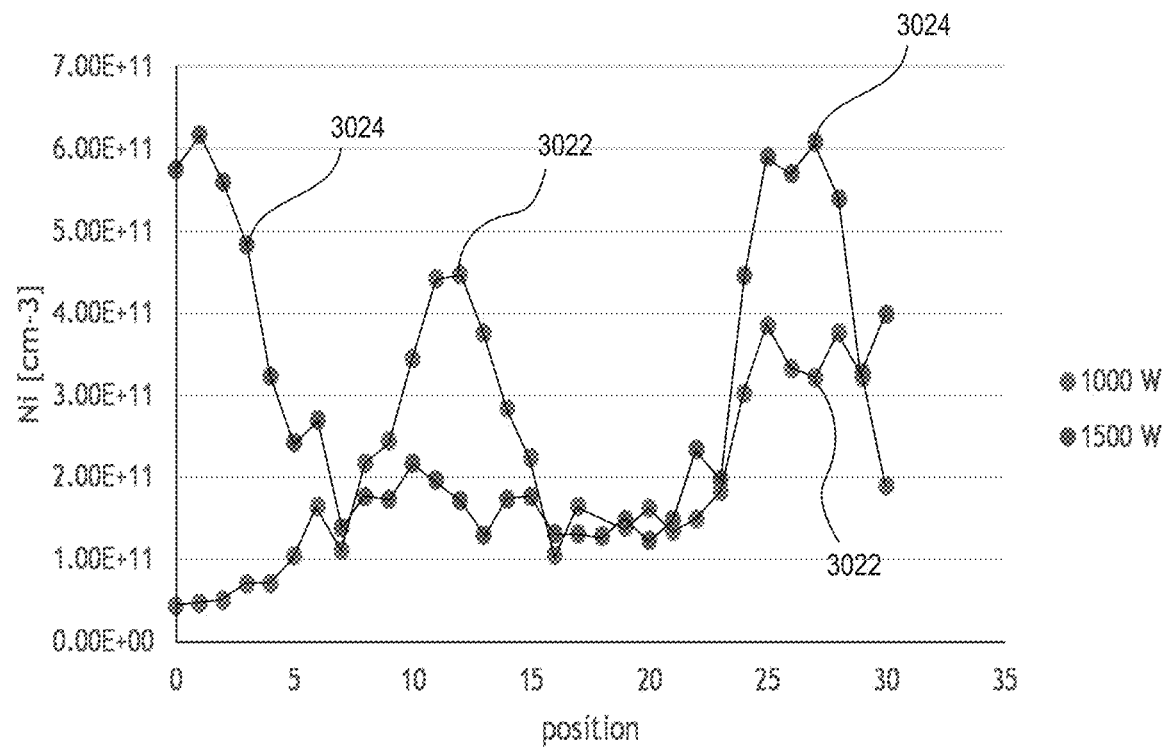

FIG. 30B is a graph of ion density versus lateral position for a plasma generated at 250 mT Ar using the RF antenna of FIG. 30A. The curves 3022 and 3024 illustrate results at 1000 W and 1500 W, respectively.

Figure 31A:
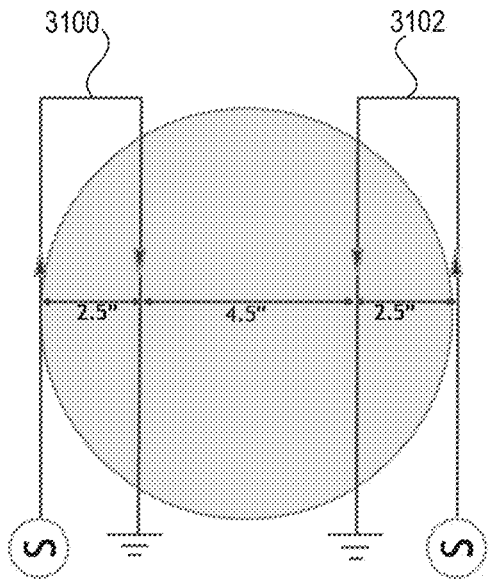
FIGS. 31A, 31B, and 31C illustrate an RF antenna and corresponding experimental results, in accordance with implementations of the disclosure.

FIG. 31A schematically illustrates an RF antenna consisting of two hairpin segments 3100 and 3102, having a line spacing of 2.5"/4.5"/2.5" as shown, and configured as a partially parallel-current and partially counter-current inductor.

Figure 31B:
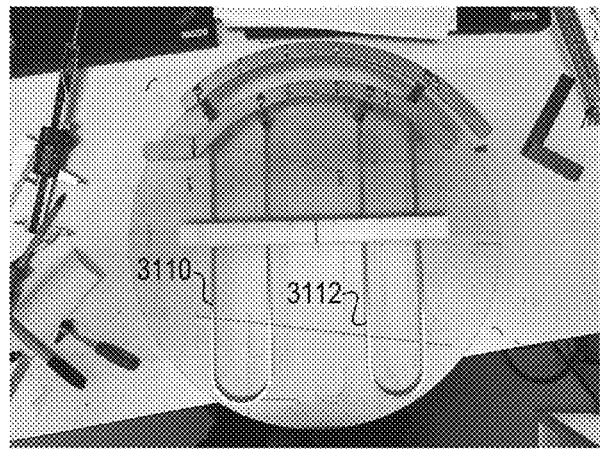
Figure 31C:
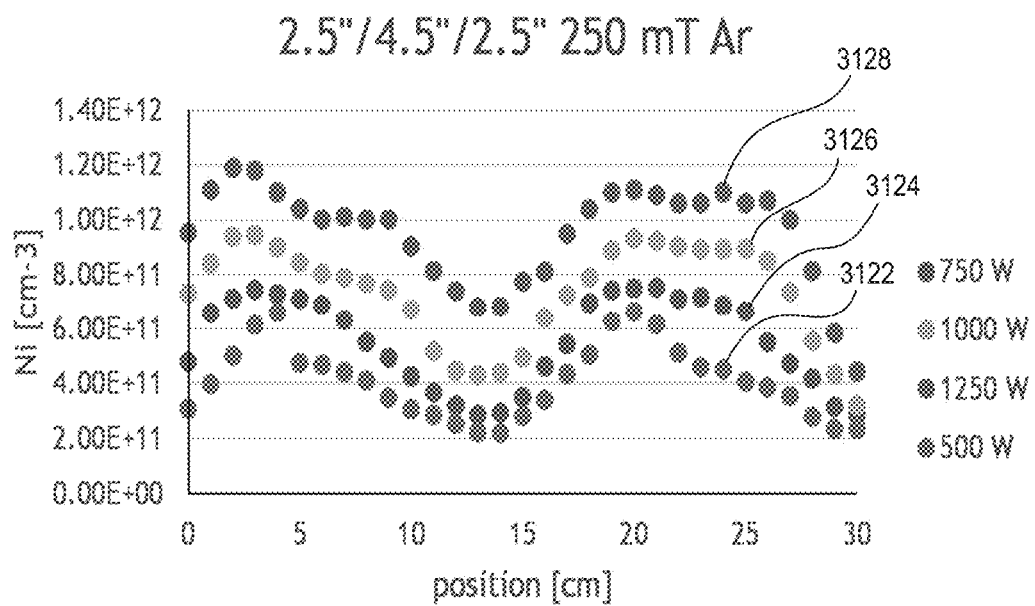

FIG. 31B illustrates an overhead view of an RF antenna having segments 3110 and 3112, in accordance with the implementation of FIG. 31A.

FIG. 31C is a graph of ion density versus lateral position for a plasma generated at 250 mT Ar using the RF antenna of FIG. 31B. The curves 3122, 3124, 3126, and 3128 illustrate results at 500 W, 750 W, 1000 W, and 1250 W, respectively.

Figure 32A:
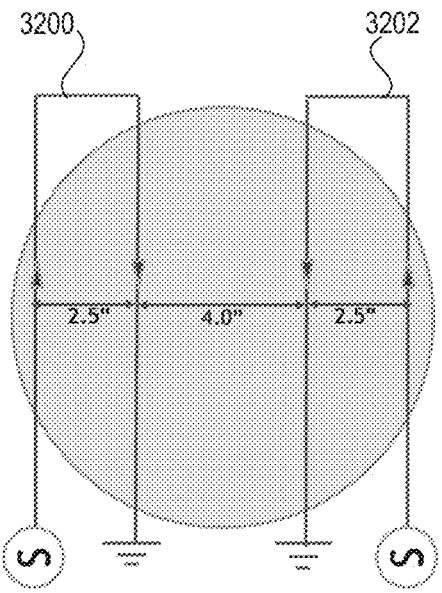
FIGS. 32A, 32B, and 32C illustrate an RF antenna and corresponding experimental results, in accordance with implementations of the disclosure.

FIG. 32A schematically illustrates an RF antenna consisting of two hairpin segments 3200 and 3202, having a line spacing of 2.5"/4.0"/2.5" as shown, and configured as a partially parallel-current and partially counter-current inductor.

Figure 32B:
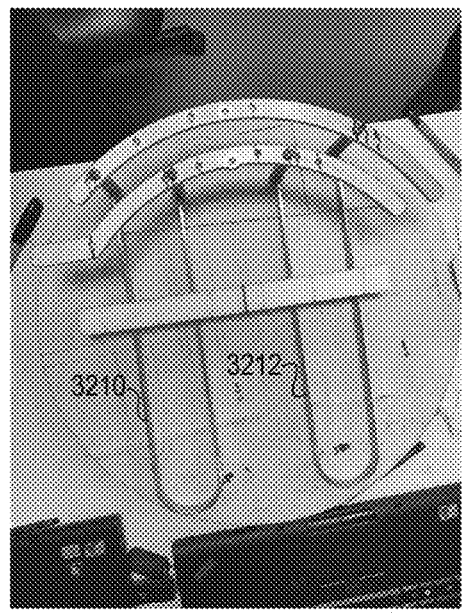
Figure 32C:
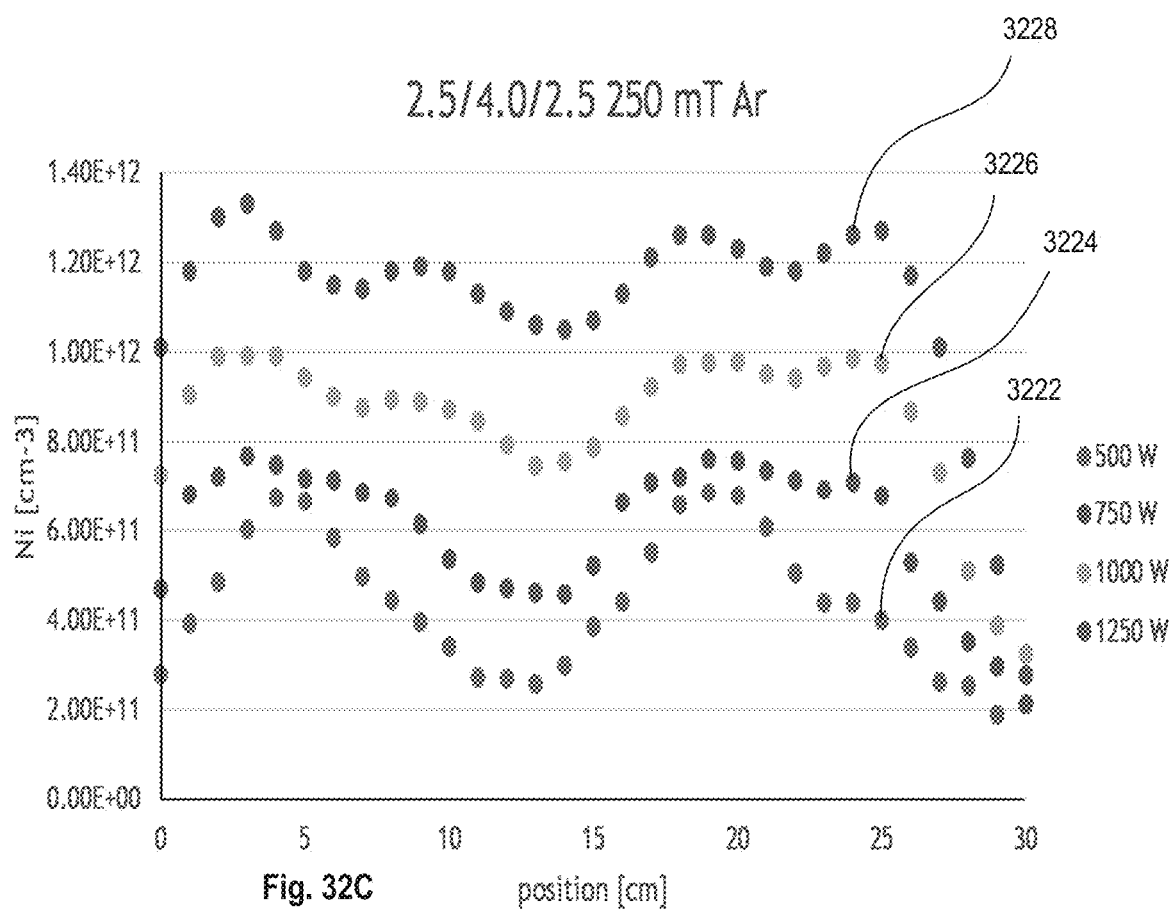

FIG. 32B illustrates an overhead view of an RF antenna having segments 3210 and 3212, in accordance with the implementation of FIG. 32A.

FIG. 32C is a graph of ion density versus lateral position for a plasma generated at 250 mT Ar using the RF antenna of FIG. 32B. The curves 3222, 3224, 3226, and 3228 illustrate results at 500 W, 750 W, 1000 W, and 1250 W, respectively.

Table 1 below shows additional data analysis for the results illustrated at FIG. 32C.

TABLE 1

| power | average | max | std dev | range | std dev (−3pts) | range (−3pts) |
|---|---|---|---|---|---|---|
| 500 | 4.35E+11 | 6.85E+11 | 35% | 57% | 31% | 47% |
| 750 | 6.03E+11 | 7.67E+11 | 25% | 46% | 17% | 26% |
| 1000 | 8.46E+11 | 9.92E+11 | 20% | 39% | 9% | 15% |
| 1250 | 1.18E+12 | 1.33E+12 | 20% | 47% | 7% | 14% |

Figure 33:
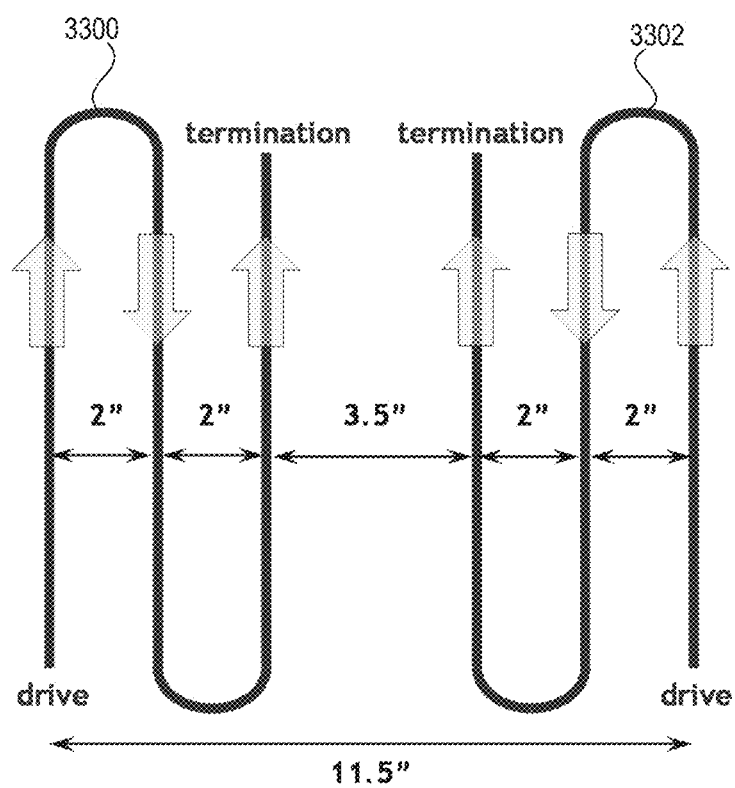
FIG. 33 illustrates an RF antenna, in accordance with implementations of the disclosure.

FIG. 33 schematically illustrates an RF antenna consisting of two S-shaped (S-pin/mini-serpentine) segments 3300 and 3302, having a line spacing of 2"/2"/3.5"/2"/2" as shown, and configured as a partially parallel-current and partially counter-current inductor. Each of the S-pin segments is configured individually as a counter-current inductor. However, the adjacent ones of the lines of the segments 3300 and 3302 (innermost two adjacent lines) are configured for parallel current in the same direction.

Figure 34:
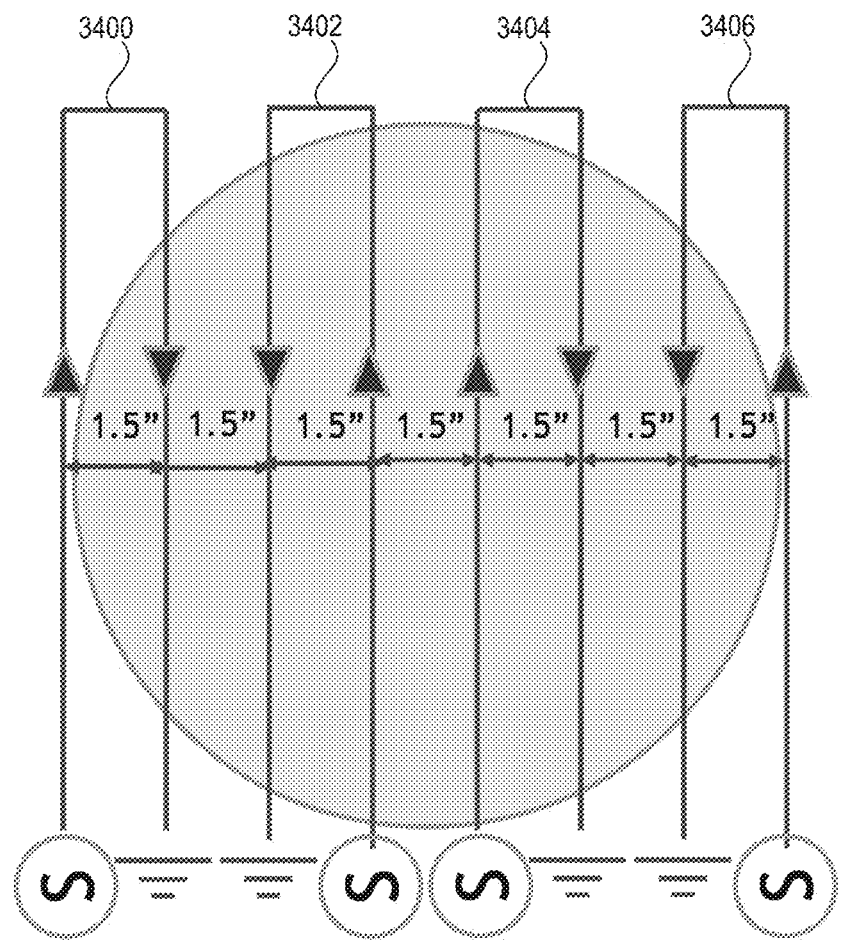
FIG. 34 illustrates an RF antenna, in accordance with implementations of the disclosure.

FIG. 34 schematically illustrates an RF antenna consisting of four hairpin segments 3400, 3402, 3404, and 3406, and having an even line spacing of 1.5", and configured as a partially parallel-current and partially counter-current inductor.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 35A:
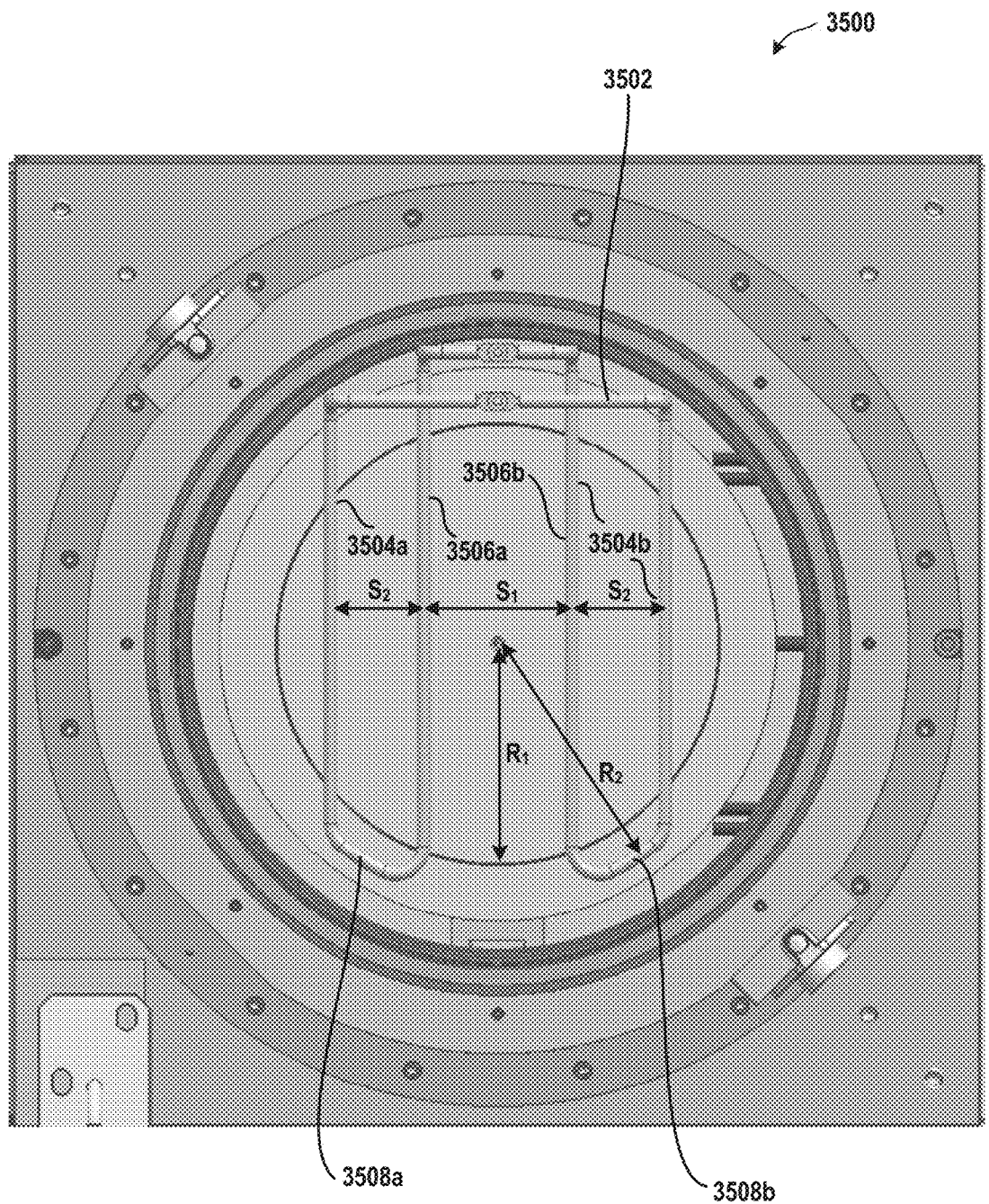
FIG. 35A illustrates an overhead view into a process chamber 3500 showing a configuration of an RF antenna 3502, in accordance with implementations of the disclosure.

FIG. 35A illustrates an overhead view into a process chamber 3500 showing a configuration of an RF antenna 3502, in accordance with implementations of the disclosure. The RF antenna 3502 is disposed over a dielectric window (not shown) and is configured to inductively generate plasma in the process chamber 3500 when powered. The RF antenna 3502 includes several conductive lines that are parallel to each other and coplanar (oriented along the same plane above the dielectric window of the process chamber). These include outer conductive lines 3504a and 3504b, and inner conductive lines 3506a and 3506b. In the illustrated implementation current flow in the inner conductive lines 3506a and 3506b occurs in the same given direction, while current flow in the outer conductive lines 3504a and 3504b occurs in the opposite direction.

The conductive lines 3504a, 3504b, 3506a, and 3506b, are substantially straight portions of the RF antenna. As shown, the conductive lines 3504a and 3506a are connected by a connecting portion 3508a, and the conductive lines 3504b and 3506b are connected by a connecting portion 3508b, enabling current flow between the inner and outer conductive lines. The connecting portions function as turnarounds, so that current flow in the outer conductive lines flows in the opposite direction to current flow in the inner conductive lines.

The inner conductive lines 3506a and 3506b are spaced apart at a pitch spacing $S_1$ (center-to-center distance) of about 1 to 6 inches (about 2.5 to 15 cm) in some implementations, about 3 to 5 inches (about 7.5 to 12.5 cm) in some implementations, or about 4 inches (about 10 cm) in some implementations.

The adjacent outer and inner conductive lines 3504a and 3506a, as well as 3504b and 3506b, are spaced apart at a pitch spacing $S_2$ (center-to-center distance) of about 2 to 6 inches (about 5 to 15 cm) in some implementations, about 2 to 3 inches (about 5 to 7.5 cm) in some implementations, or about 2.5 inches (about 6 to 6.5 cm) in some implementations.

In some implementations, the inner and outer conductive lines are configured to be substantially straight throughout the region that is over the wafer's surface. That is, relative to an axis that is orthogonal through the center of the wafer surface, the conductive lines extend in a substantially straight manner to a point that is at or beyond the radius of the wafer. In the illustrated implementation, the radius $R_1$ of the wafer is shown, and the radius $R_2$ of the connecting portions 3508a and 3508b is greater than the radius $R_1$.

Figure 35B:
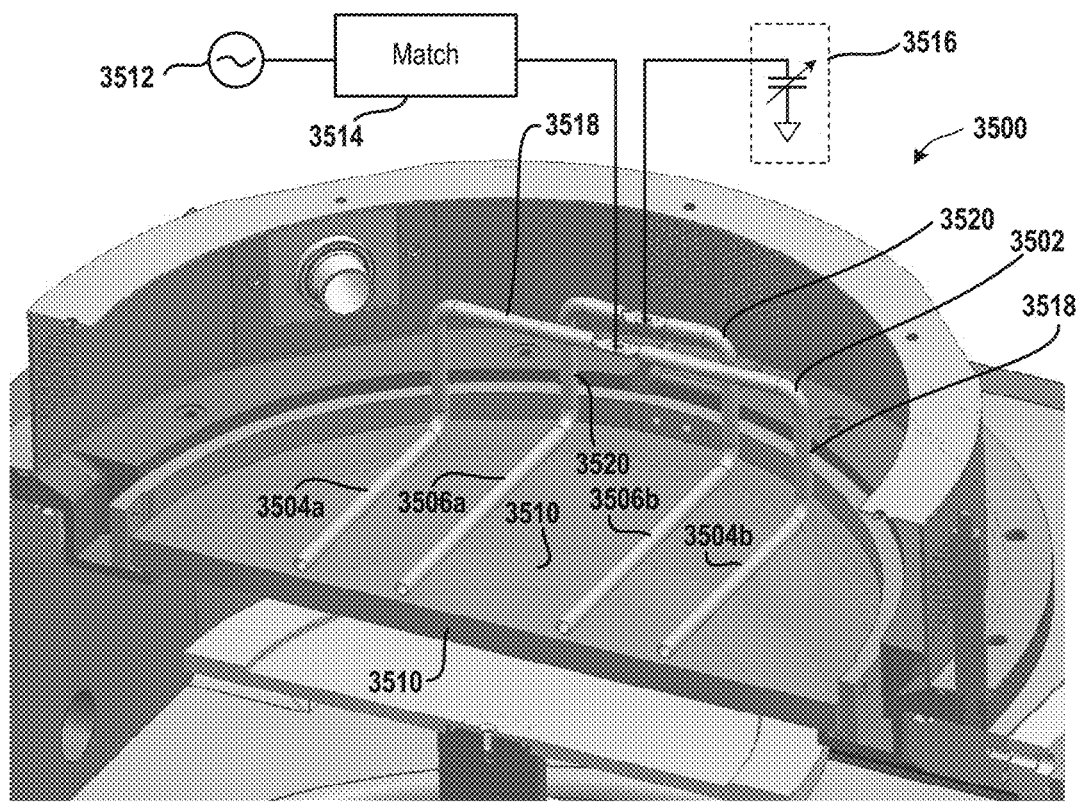
FIG. 35B illustrates a perspective cutaway view of the process chamber 3500, in accordance with implementations of the disclosure.

FIG. 35B illustrates a perspective cutaway view of the process chamber 3500, in accordance with implementations of the disclosure. As shown, the RF antenna 3502 is disposed over the dielectric window 3510. In some implementations the thickness of the dielectric window 3510 is in the range of about 0.5 to 2 inches (about 1 to 5 cm). In some implementations the distance of the RF antenna 3502 from the dielectric window 3510 is about 0 to 0.5 inch (about 0 to 1.5 cm).

The RF antenna 3502 receives RF power from a generator 3512 through a match 3514, which together define an RF source for the RF antenna. As shown, in some implementations the outer conductive lines 3504a and 3504b connect to the RF source, or are positioned upstream (the RF feed side of the RF antenna) relative to the RF source, as compared to the inner conductive lines 3506a and 3506b which are positioned downstream relative to the RF source (the ground/return side of the RF antenna). In some implementations the inner conductive lines 3506a and 3506b connect to a termination cap 3516 that includes a variable capacitor and connects to ground.

It is further noted that as shown in the illustrated implementation, the ends of the RF antenna 3502 are raised above the plane of the conductive lines. More specifically, the ends of the RF antenna on the feed side (ref. 3518) serve to electrically link the outer conductive lines for connection to the same RF source. Similarly, the ends of the RF antenna on the ground/return side (ref. 3520) link the inner conductive lines for connection to the same termination cap.

In an alternative implementation, the inner conductive lines are positioned upstream and connected to the RF source, and the outer conductive lines are positioned downstream and connected to the termination cap.

In the illustrated implementation the upstream and downstream ends of the RF antenna 3502 are joined so as to be powered by the same RF source and grounded through the same termination cap. However, it will be appreciated that in some implementations the upstream ends of the RF antenna 3502 can be powered by separate RF sources. Further, in some implementations the downstream ends of the RF antenna 3502 can be terminated by separate termination caps.

Figure 35C:
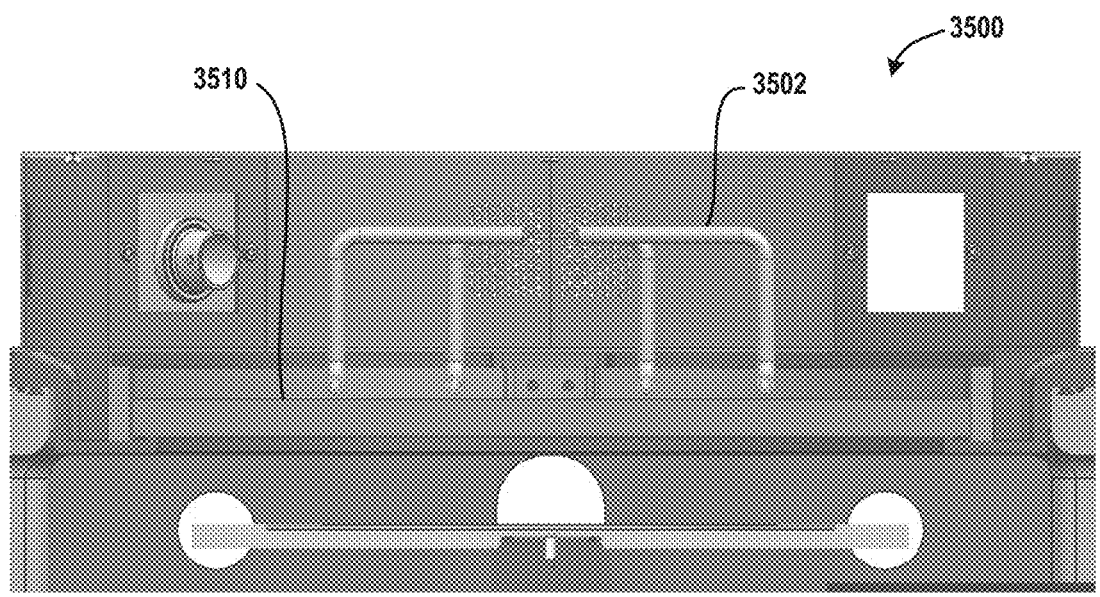
FIG. 35C illustrates a cutaway view of the process chamber 3500 along a plane perpendicular to the conductive lines of the RF antenna 3502, in accordance with implementations of the disclosure.

FIG. 35C illustrates a cutaway view of the process chamber 3500 along a plane perpendicular to the conductive lines of the RF antenna 3502, in accordance with implementations of the disclosure.

Figure 36A:
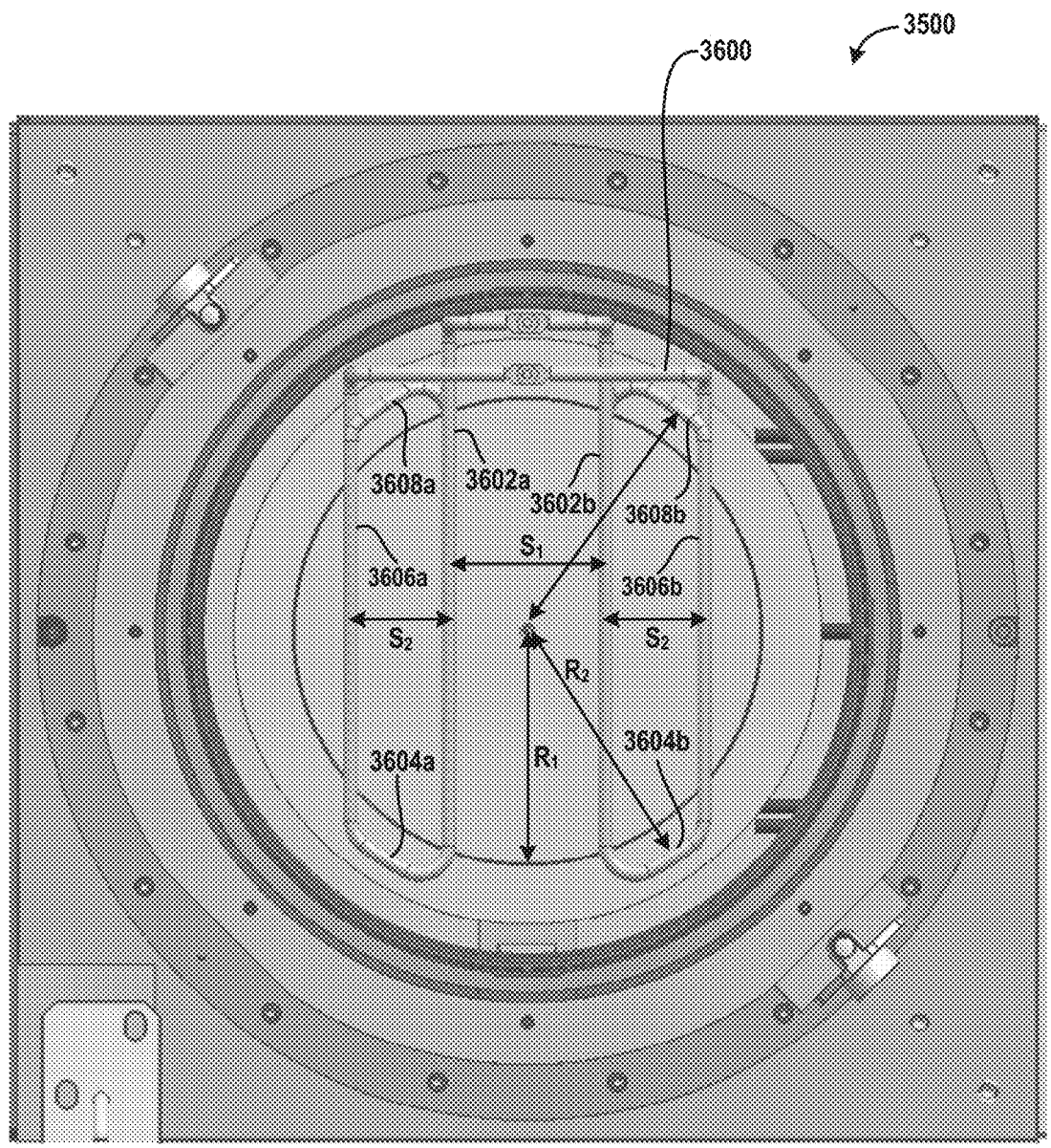
FIG. 36A illustrates an overhead view into a process chamber 3500 showing a configuration of an RF antenna 3600, in accordance with implementations of the disclosure.

FIG. 36A illustrates an overhead view into a process chamber 3500 showing a configuration of an RF antenna 3600, in accordance with implementations of the disclosure.

Figure 36B:
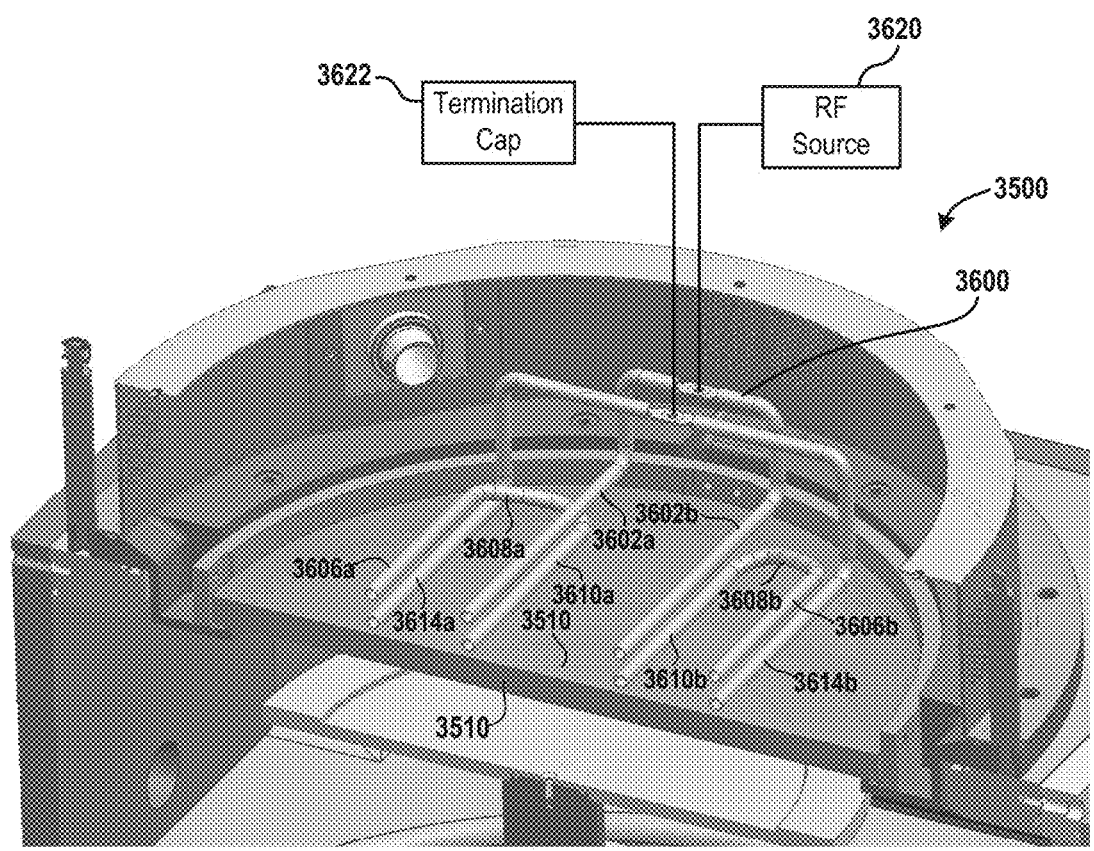
FIG. 36B illustrates a perspective cutaway view of the process chamber 3500 including the RF antenna 3600, in accordance with implementations of the disclosure.

FIG. 36B illustrates a perspective cutaway view of the process chamber 3500 including the RF antenna 3600, in accordance with implementations of the disclosure.

The RF antenna 3600 has a stacked configuration of conductive lines extending over the wafer region, such that in addition to the set of conductive lines shown and described in the RF antenna 3502, the RF antenna 3600 additionally includes a second set of parallel conductive lines that are disposed directly over the first set of conductive lines. That is, there is RF antenna 3600 includes a bottom set of coplanar parallel conductive lines, and an upper set of coplanar parallel conductive lines that are respectively aligned over the conductive lines of the bottom set as shown.

In the illustrated implementation the RF antenna 3600 includes an upper set of coplanar and parallel conductive lines including upper inner conductive lines 3602a and 3602b, and upper outer conductive lines 3606a and 3606b. The RF antenna 3600 further includes a lower set of coplanar and parallel conductive lines including upper inner conductive lines 3610a and 3610b, and upper outer conductive lines 3614a and 3614b.

The upper inner conductive line 3602a connects via a connecting segment 3604a to the upper outer conductive line 3606a, which connects via a connecting segment 3608a to the lower inner conductive line 3610a, which connects via an additional connecting segment (not shown, directly below connecting segment 3604a) to the lower outer conductive line 3614a. In this manner, these lines and segments form a looped structure that substantially defines one half of the RF antenna 3600. The other half of the RF antenna 3600 is similarly substantially defined by a similar looped structure, wherein the upper inner conductive line 3602b connects via a connecting segment 3604b to the upper outer conductive line 3606b, which connects via a connecting segment 3608b to the lower inner conductive line 3610b, which connects via an additional connecting segment (not shown, directly below connecting segment 3604b) to the lower outer conductive line 3614b.

In some implementations the wafer has a diameter of about 12 inches (about 30 cm) or a radius $R_1$ of about 6 inches (about 15 cm). Accordingly, the straight conductive lines may extend to or past the diameter of the wafer, so that the turns of the RF antenna are not substantially over the wafer. In some implementations the connecting segments are configured at a diameter of about 14 inches (about 35 cm) or a radius $R_2$ of about 7 inches (about 17.5 cm).

In the illustrated implementation, the upper inner conductive lines 3602a and 3602b are connected to an RF source 3620, and are thus at the RF feed side of the antenna structure. The lower outer conductive lines 3614a and 3614b are connected to a termination cap 3622, and are thus at the ground/return side of the antenna structure. In the illustrated implementation the ends of the upper inner conductive lines 3602a and 3602b, and the ends of the lower outer conductive lines 3614a and 3614b, are turned vertically upward out of the horizontal planes of the conductive lines to provide connection points for connection to the RF source 3620 and termination cap 3622.

It is recognized that in the RF antenna 3600 the looped ends (turnaround segments) may cause some transformer effect. Therefore, in some implementations, this effect can be reduced by bending the end loops up at an angle (e.g. approximately 90 degree angle). This will also reduce the end loops' current induction into the chamber. Thus in some implementations, the RF antenna 3600 includes conductive lines that are connected in series by raised end loop connectors. For example, the conductive lines 3602a, 3606a, 3610a, and 3614a are connected in series by connectors 3604a, 3608a, and an additional connector (not shown) below connector 3604a. The connectors can be configured as curved segments oriented along a plane that is substantially perpendicular to the horizontal plane(s) along which the conductive lines are oriented. Such connectors can define a current path, from one conductive line to another, that travels upward out of the plane of the conductive lines, and then travels downward back into the plane of the conductive lines. Similarly, the conductive lines 3602b, 3606b, 3610b, and 3614b are connected in series by connectors 3604b, 3608b, and an additional connector (not shown) below connector 3604b, and the connectors can be similarly configured and define a current path as described above.

It will be appreciated that that such connectors and the conductive lines can be configured to maintain a predefined separation between the various lines. For example, the upper conductive lines 3602a and 3606a may extend to certain lengths (e.g. past the wafer edge) at which the raised connector 3604a is formed. Whereas the lower conductive lines 3610a and 3614a, which are below the upper conductive lines 3602a and 3606a, may extend to lengths beyond those of the conductive lines 3602a and 3606a, at which the raised connector connecting the lower conductive lines is formed. In this way, a given spacing between the lines can be maintained while accommodating the raised end loop structure for both the upper and lower deck of the RF antenna.

In other implementations, each side of the RF antenna 3600 is independently powered, such that the upper inner conductive lines 3602a and 3602b are powered by separate RF sources. In some implementations, each side of the RF antenna 3600 is independently terminated, such that the lower outer conductive lines 3614a and 3614b are connected to separate termination caps.

Figure 36C:
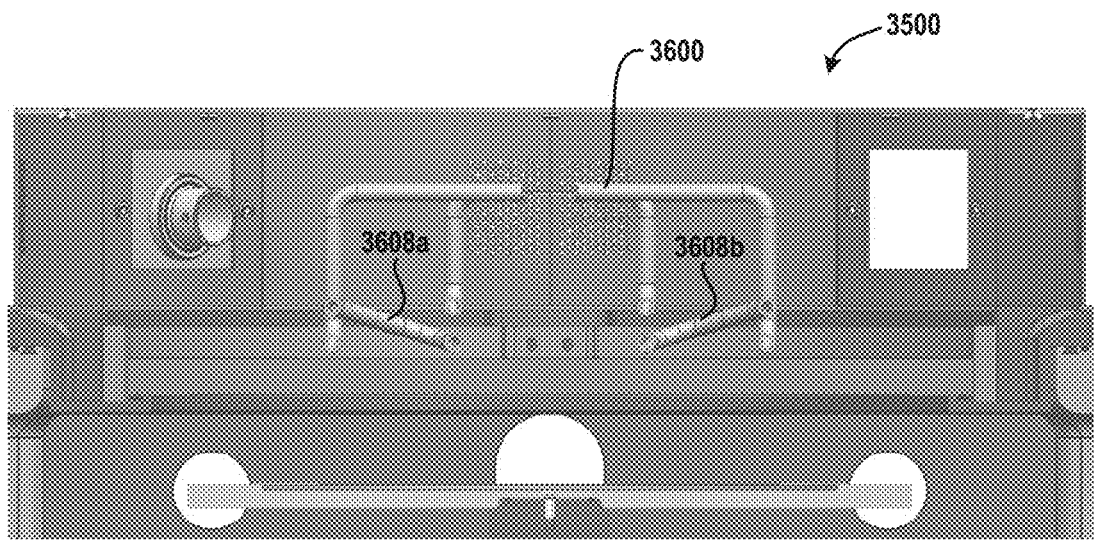
FIG. 36C illustrates a cutaway view of the process chamber 3500 along a plane perpendicular to the conductive lines of the RF antenna 3600, in accordance with implementations of the disclosure.
Figure 36D:
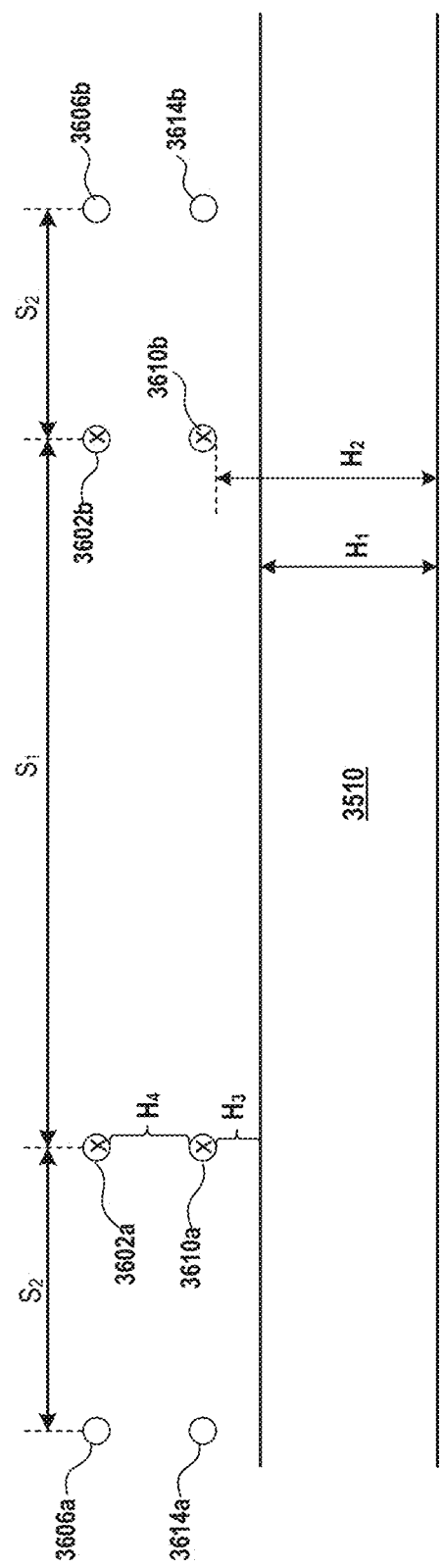
FIG. 36D conceptually illustrates a cross section view of a portion of the dielectric window 3610 and the RF antenna 3600, in accordance with implementations of the disclosure.

FIG. 36D conceptually illustrates a cross section view of a portion of the dielectric window 3510 and the RF antenna 3600, in accordance with implementations of the disclosure. The inner conductive lines 3602a and 3602b are horizontally separated at a pitch spacing $S_1$ as shown, which can be the same as that described above with respect to the RF antenna 3502. As the inner conductive lines 3602a and 3602b are vertically stacked directly over the inner conductive lines 3610a and 3610b, the same pitch spacing $S_1$ applies to inner conductive lines 3610a and 3610b. The inner conductive line 3602a is separated from the outer conductive line 3606a at a pitch spacing $S_2$, which can be the same as that described above with respect to RF antenna 3502. The same pitch spacing $S_2$ also applies to the separation of inner conductive line 3602b from outer conductive line 3606b, as well as to the separation of inner conductive line 3610a from outer conductive line 3614a, and the separation of inner conductive line 3610b from outer conductive line 3614b.

As shown, the dielectric window 3510 has a thickness $H_1$. In some implementations, the thickness $H_1$ is in the range of about 0.25 to 1.5 inch (about 0.6 to 3.8 cm); in some implementations, $H_1$ is in the range of about 0.5 to 1 inch (about 1.3 to 2.5 cm); in some implementations, $H_1$ is about 0.75 inch (about 2 cm). The vertical distance $H_2$ from the bottom of the dielectric window 3510 to the lower set of conductive lines (3610a, 3610b, 3614a, and 3614b) in some implementations can range from about 0.5 to 2 inches (about 1 to 5 cm). In some implementations the lower set of conductive lines are vertically separated from the top of the dielectric window 3510 by a vertical distance $H_3$. In some implementations, $H_3$ is in the range of about 0 (i.e. no separation, with conductive lines touching dielectric window) to 0.5 inch (about 0 to 1.2 cm); in some implementations, $H_3$ is in the range of about 0 to 0.25 inch (about 0 to 0.6 cm); in some implementations, $H_3$ is about 0.25 inch (about 0.6 cm). Generally, the closer the conductive lines to the dielectric window, the better the inductive coupling into the chamber, but also the greater the sputtering of the dielectric window.

The upper and lower conductive lines are vertically separated by a vertical distance $H_4$. In some implementations, $H_4$ is in the range of about ⅛ to 1 inch (about 0.3 to 2.5 cm); in some implementations, $H_4$ is in the range of about 0.25 to 0.75 inch (about 0.6 to 2 cm); in some implementations, $H_4$ is about 0.5 inch (about 1.3 cm). Broadly speaking, closer vertical spacing between the conductive lines provides for greater induction but also increased risk of arcing.

The double stack configuration of the RF antenna 3600 provides advantages over a single level configuration (e.g. as demonstrated by RF antenna 3502) in terms of ease of powering the RF antenna and induction efficiency for generating plasma. For with the single level configuration of RF antenna 3502, a high current is required to drive both sides of the RF antenna 3502. One possible solution is to use separate generators to drive each side of the RF antenna. Another possibility is to apply power at a high frequency (e.g. about 40 MHz). However, using additional generators or applying a high frequency requires additional and/or costly hardware, increasing expense.

The double stack configuration of the present implementation solves these problems by increasing the inductance of the RF antenna, thus reducing the current while increasing the voltage. Power loss (e.g. through inductive heating which wastes power) in inductively coupled plasma systems is proportional to the square of the current (follows $I^2R$). Thus, doubling the current, as required by the single level configuration of RF antenna 3502 which splits power into two halves, results in four times the loss. But by employing the double stack configuration of RF antenna 3600, it is possible to raise the inductance of the RF antenna 3600, to enable running at half the current of the single level RF antenna 3502. This produces a four-fold reduction in power loss (reduced by 75%) for RF antenna 3600, and provides better distribution of power and more efficient inductive coupling of power into the process chamber to generate the plasma.

With the single level configuration of RF antenna 3502, the current is higher, but the voltage is lower, so the danger of capacitive coupling is reduced. However, it is desirable to achieve some capacitive coupling for purposes of plasma ignition. Thus, sufficient voltage is sought to ignite the plasma, while less voltage is sought once running to provide for more efficient inductive power coupling. The double stack configuration of RF antenna 3600 can also provide solutions to this issue because the bottom level of the RF antenna can shield high voltage from the upper level. The termination capacitance can be tuned so that there is sufficient voltage to ignite the plasma, but once running under steady state, while the upper level is at a higher voltage, the lower level is at a lower voltage. Each turn of the RF antenna is like a voltage divider, so that there may be twice as much voltage on the top versus the bottom, and this allows for the high voltage to be kept away from the dielectric window 3610. High voltage in proximity of the dielectric window may sputter the dielectric window, and thus it is desirable to keep high voltage away from the dielectric window.

Figure 37A:
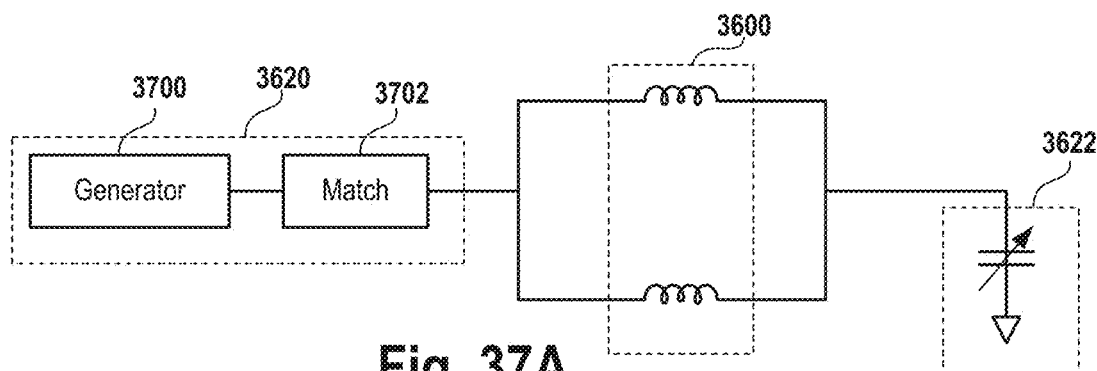
FIGS. 37A, 37B, 37C, and 37D schematically illustrate various configurations of powering and terminating the RF antenna, in accordance with implementations of the disclosure.

FIGS. 37A, 37B, 37C, and 37D schematically illustrate various configurations of powering and terminating the RF antenna, in accordance with implementations of the disclosure. FIG. 37A illustrates the RF antenna 3600 being powered by a single RF source 3620, and terminated by a single termination cap 3622. In the illustrated implementation, the RF antenna 3600 is schematically represented as a pair of inductors that split power from the RF source 3620, which includes a generator 3700 (e.g. oscillator) coupled to a match 3702. On the downstream side, both inductors of the RF antenna 3600 terminate to the termination cap 3622, which includes a variable capacitor coupled to ground.

Figure 37B:
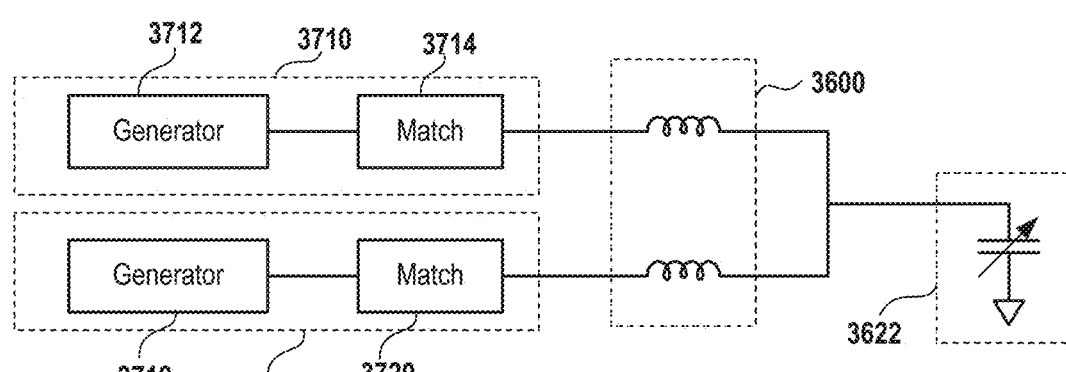

FIG. 37B illustrates the RF antenna 3600 wherein each half is powered by a separate RF source. More specifically, one coil (one inductor) of the RF antenna 3600 is powered by an RF source 3710, including a generator 3712 coupled to a match 3714. The other coil of the RF antenna 3600 is powered by an RF source 3716, including a generator 3718 coupled to a match 3720. In the illustrated implementation, both coils are connected to the same termination cap 3622, which includes a variable capacitor coupled to ground. It will be appreciated that the separate RF sources can be individually tuned to provide a desired power distribution through the two sides of the RF antenna 3600.

Figure 37C:
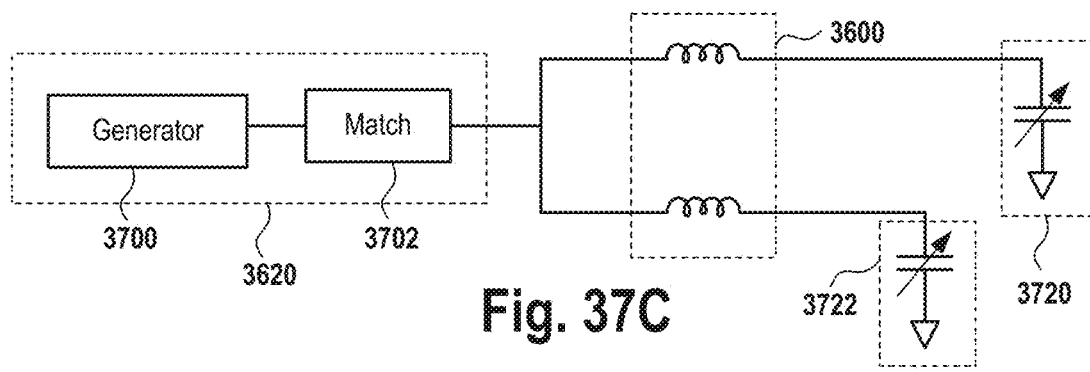

FIG. 37C illustrates the RF antenna 3600 being powered by a single RF source 3620, and terminated by separate termination caps 3720 and 3722. Each termination cap includes a variable capacitor coupled to ground. It will be appreciated that each termination cap can be adjusted/tuned to provide for balanced distribution of voltage/current through the two inductor halves of the RF antenna 3600.

Figure 37D:
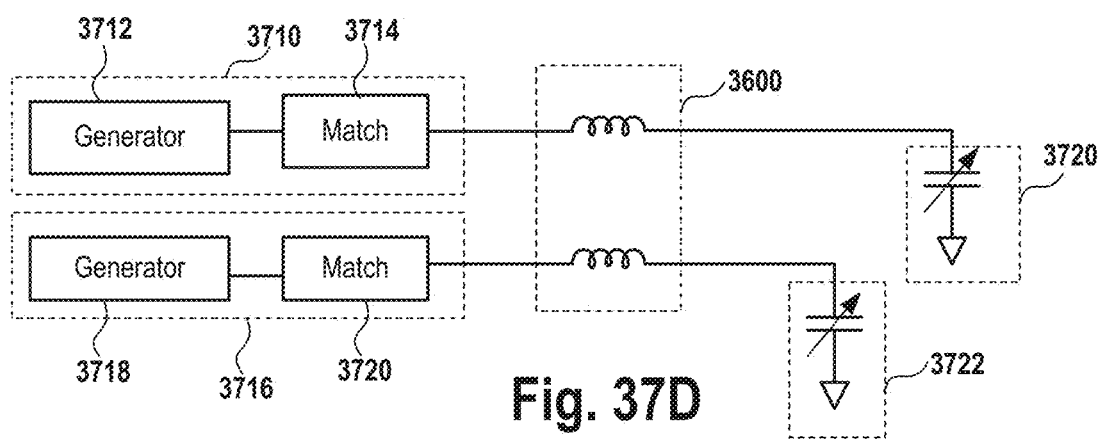

FIG. 37D illustrates the RF antenna 3600 being powered by separate RF sources 3710 and 3716, and terminated by separate termination caps 3720 and 3722. In this configuration, both the upstream and downstream sides of each inductor half of the RF antenna 3600 can be tuned to provide optimal power distribution.

It will be appreciated that the RF power applied to the antenna can be tuned to a desired state. For example, in some implementations the RF power is configured to achieve running under a balanced condition, so as to minimize capacitive coupling (thereby minimizing sputtering of the dielectric window). In such a state, the RF power is tuned so that a node (zero-voltage condition) exists at approximately halfway around the turn of the coil that is nearest the dielectric window. In the case of a single stack design as described with reference to FIGS. 35A-35C, the RF power would be tuned so that nodes exist along the connecting portions 3508a and 3508b. Whereas in the case of a double stack design as described with reference to FIGS. 36A-36C, the RF power would be tuned so that nodes exist along the connecting segments that are below the connecting segments 3604a and 3604b (not shown, as noted above). It is noted that when capacitive coupling is minimized, plasma ignition may become more difficult. Therefore in some implementations the RF power may be tuned to permit an amount of capacitive coupling sufficient to achieve plasma ignition under desired conditions.

Figure 38A:
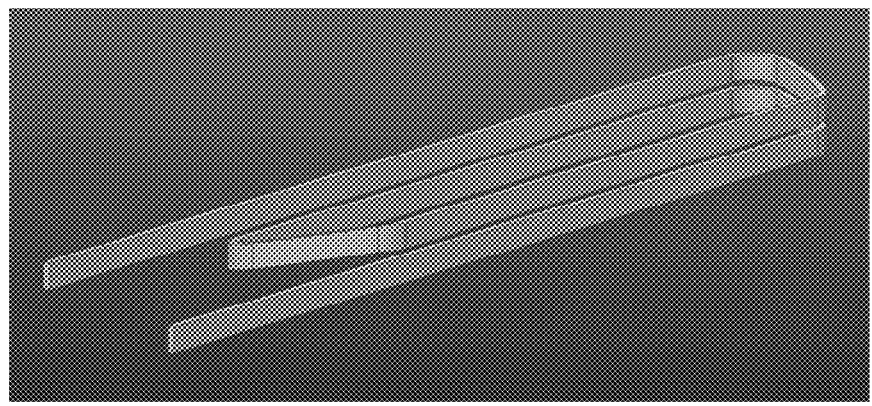
FIG. 38A illustrates a portion of an RF antenna, such as one of the halves/sides of the RF antenna 3600, that is formed as a continuous bent sheet/strip.

It will be appreciated that the antenna lines can be formed to have various kinds of cross-sectional shapes, in accordance with implementations of the disclosure. While various segments have been described, it will be appreciated that each half of the RF antenna 3600 can be formed from a single continuous length of conductive material that is bent/formed to have the desired antenna shape (e.g. double stacked shape having a double looped structure). FIG. 38A illustrates a portion of an RF antenna, such as one of the halves/sides of the RF antenna 3600, that is formed as a continuous bent sheet/strip. In the illustrated implementation, the portions consists of a single strip of conductive material that has been bent to the desired shape, such that the cross-sectional shape is a vertically oriented (height greater than width) substantially rectangular shape.

Figure 38B:
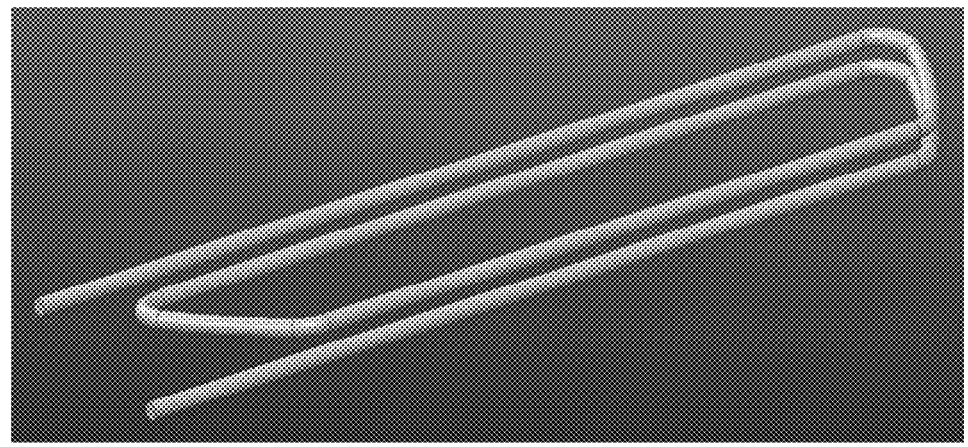
FIG. 38B illustrates a portion of an RF antenna formed as a continuous bent tube, in accordance with implementations of the disclosure.

FIG. 38B illustrates a portion of an RF antenna formed as a continuous bent tube, in accordance with implementations of the disclosure.

Figure 38C:
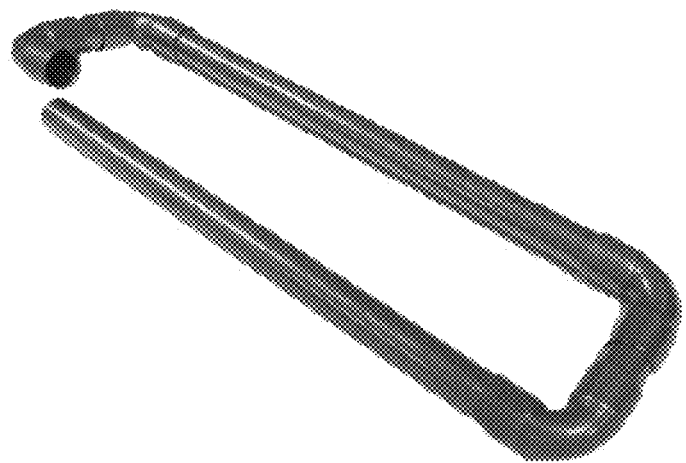
FIG. 38C illustrates a portion of an RF antenna formed from a plurality of tubular fittings, such as a plurality straight tubular fittings and a plurality of curved tubular fittings, in accordance with implementations of the disclosure.

FIG. 38C illustrates a portion of an RF antenna formed from a plurality of tubular fittings, such as a plurality straight tubular fittings and a plurality of curved tubular fittings, in accordance with implementations of the disclosure.

Figure 39A:
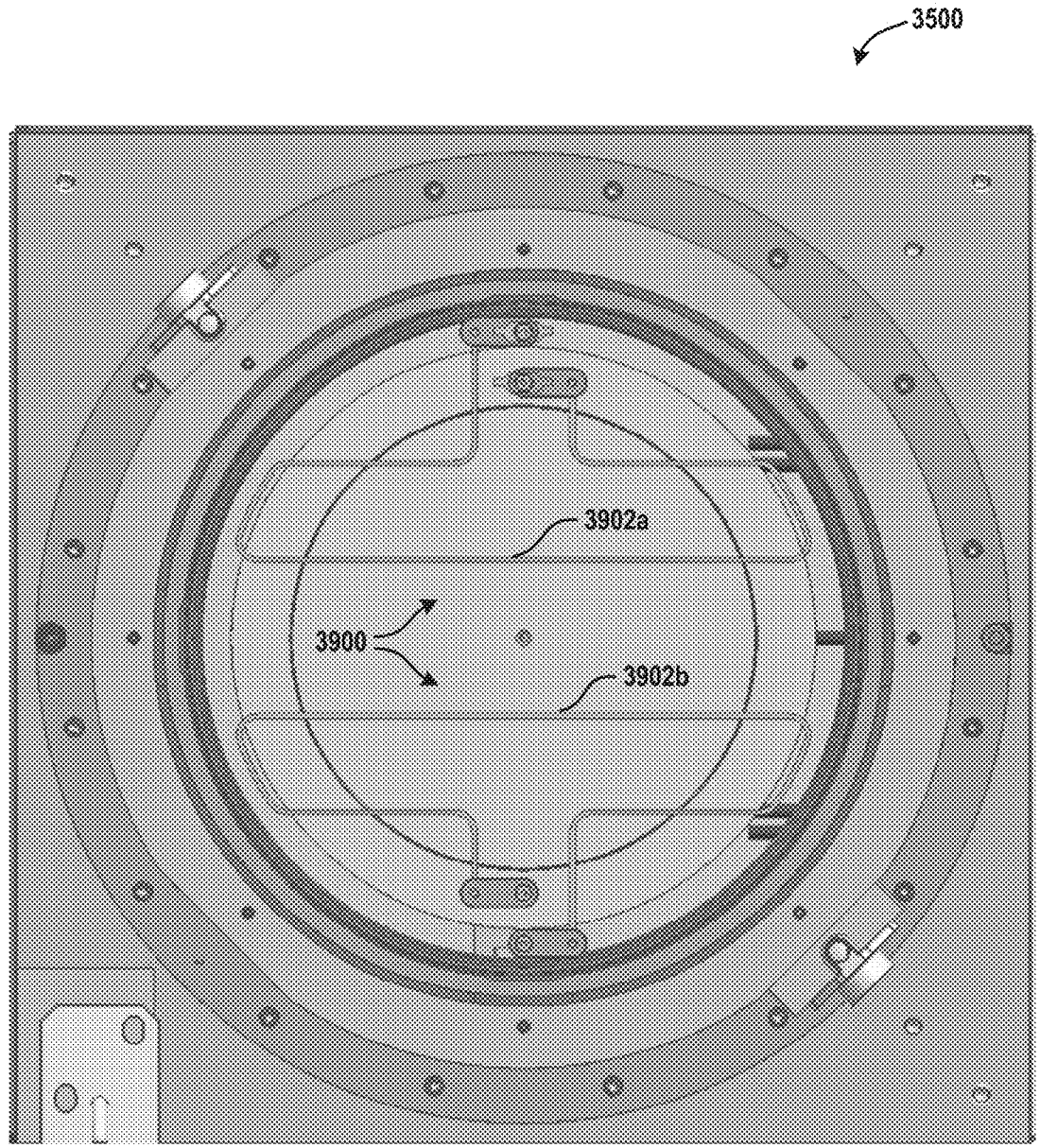
FIGS. 39A, 39B, and 39C illustrate overhead, perspective cutaway, and side cross-sectional views an RF antenna that is powered from the sides, in accordance with implementations of the disclosure.
Figure 39B:
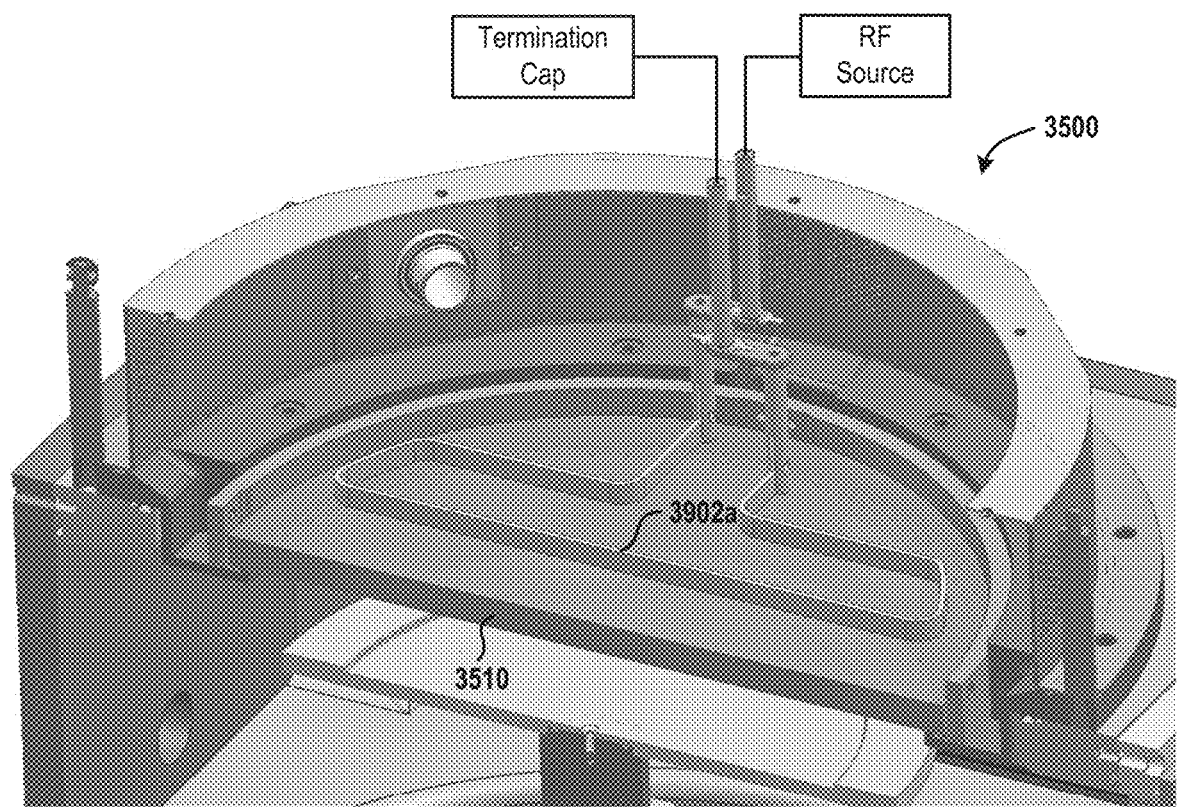
Figure 39C:
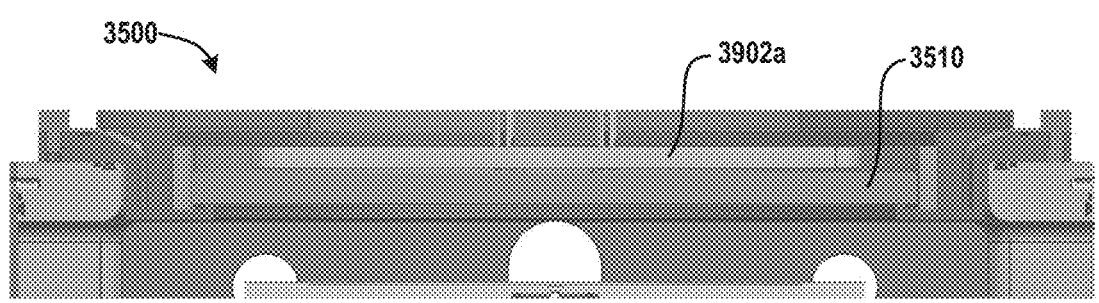

FIGS. 39A, 39B, and 39C illustrate overhead, perspective cutaway, and side cross-sectional views an RF antenna that is powered from the sides, in accordance with implementations of the disclosure. In the illustrated implementation, the RF antenna 3900 is similar in structure to the RF antenna 3502 described above, including two portions/sides/halves 3902a and 3902b, with each antenna portion including inner and outer conductive lines that are parallel and oriented along the same horizontal plane, extending over the wafer and to the edges of the wafer region. However, in the RF antenna 3900, each outer conductive line is not continuous through the middle, but actually consists of two segments that are respectively connected to the RF source and to the termination cap/ground. The outer ends of these segments are connected, via connectors, to the adjacent inner conductive line, thereby forming a loop (from RF source to termination cap). Thus, current flow from the RF source begins from the side, through a side connector to one of the segments of the outer conductive line, through a connector to the inner conductive line, through another connector to the other segment of the outer conductive line, and through another side connector to a termination cap. It will be appreciated that though each half has been described as consisting of various segments, each half of the RF antenna 3900 can be formed from a single length of conductive material, such as a tube or sheet/strip.

While the RF antenna 3900 as shown and described consists of a single level structure, it will be appreciated that in other implementations, the RF antenna 3900 can have a double stack structure similar to that of RF antenna 3600 described above, with each half formed as a double looped structure with upper and lower conductive lines that are directly above/below one another, while also being powered/grounded from the side.

Figure 40:
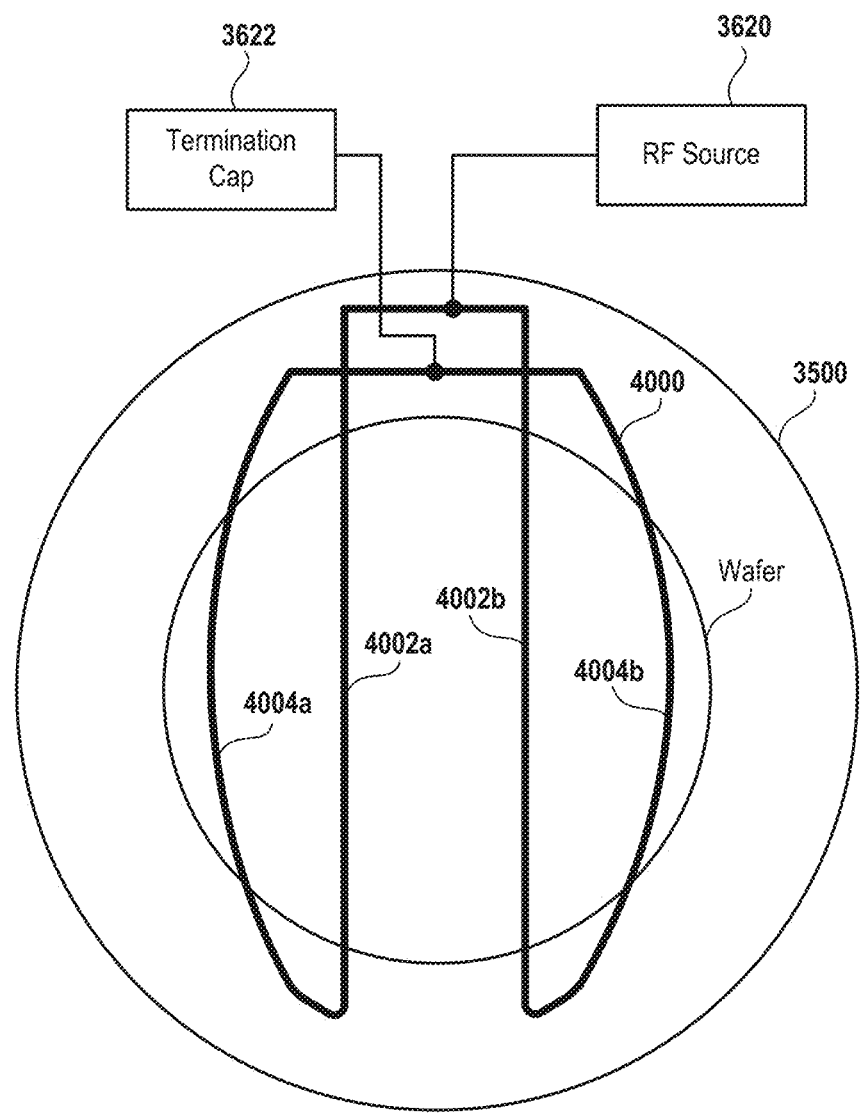
FIG. 40 conceptually illustrates an overhead view of an RF antenna having curved outer conductive lines, in accordance with implementations of the disclosure.

FIG. 40 conceptually illustrates an overhead view of an RF antenna having curved outer conductive lines, in accordance with implementations of the disclosure. In the illustrated implementation, the RF antenna 4000 includes inner conductive lines 4002a and 4002b, and outer conductive lines 4004a and 4004b. The inner conductive lines 4002a and 4002b are substantially straight, while the outer conductive lines 4004a and 4004b have are substantially curved outward along the horizontal plane. In some implementations the RF antenna 4000 can have a double stack configuration including two loops that are vertically aligned.

Figure 41:
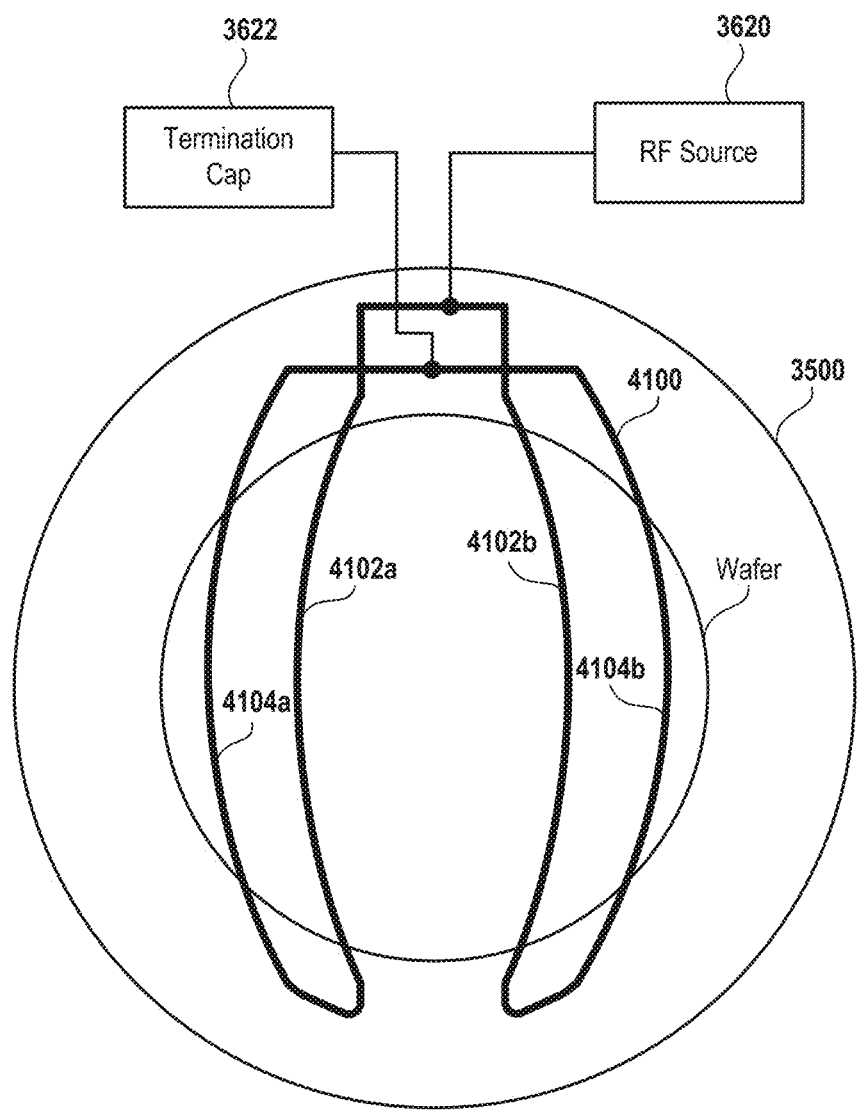
FIG. 41 conceptually illustrates an overhead view of an RF antenna having curved inner and outer conductive lines, in accordance with implementations of the disclosure.

FIG. 41 conceptually illustrates an overhead view of an RF antenna having curved inner and outer conductive lines, in accordance with implementations of the disclosure. In the illustrated implementation, the RF antenna 4100 includes inner conductive lines 4102a and 4102b, and outer conductive lines 4104a and 4104b. The inner conductive lines 4102a and 4102b, as well as the outer conductive lines 4104a and 4104b have are substantially curved outward along the horizontal plane. In some implementations the RF antenna 4100 can have a double stack configuration including two loops that are vertically aligned.

Figure 42:
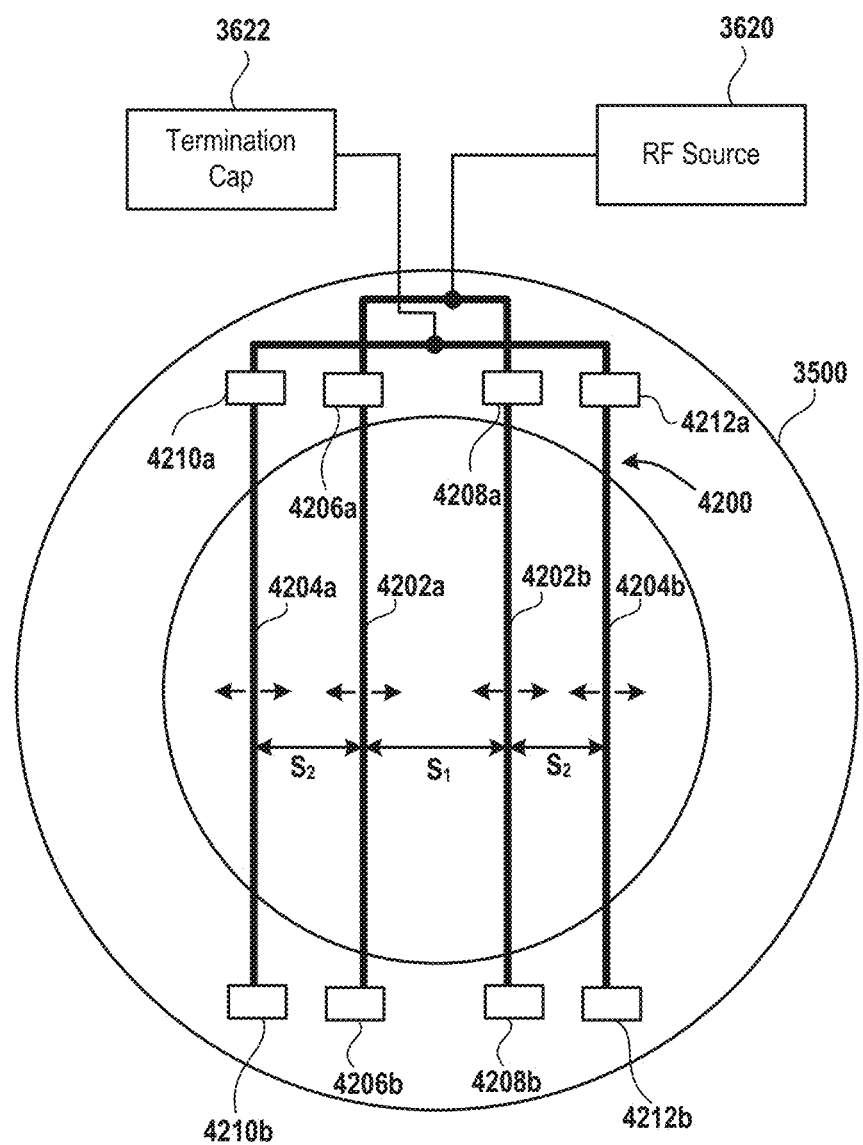
FIG. 42 conceptually illustrates an overhead view of an RF antenna having adjustable line spacing, in accordance with implementations of the disclosure.

FIG. 42 conceptually illustrates an overhead view of an RF antenna having adjustable line spacing, in accordance with implementations of the disclosure. As shown, the RF antenna 4200 includes inner conductive lines 4202a and 4202b, as well as outer conductive lines 4204a and 4204b. The inner and outer conductive lines are configured to be horizontally movable, so that the spacing between the lines is adjustable. In some implementations, an adjustment mechanism is provided at each end of the conductive lines to enable horizontal movement of the conductive lines. In the illustrated implementation, adjusters 4206a and 4206b are configured to enable horizontal adjustment of the conductive line 4202a; adjusters 4208a and 4208b are configured to enable horizontal adjustment of the conductive line 4202b; adjusters 4210a and 4210b are configured to enable horizontal adjustment of the conductive line 4204a; adjusters 4212a and 4212b are configured to enable horizontal adjustment of the conductive line 4204b.

The adjusters can include movement mechanisms (e.g. electric motors, stepper motors, servos, etc.) for moving the conductive lines. Further, the adjusters can include flexible conductive materials, such as cabling or flexible fittings, to accommodate the movement of the conductive lines. This may also ensure that the RF path length of the antenna does not substantially change when the conductive lines are moved to different positions.

It will be appreciated that as the conductive lines are moved, so the spacing between the conductive lines changes. Thus, the spacing $S_1$ between the inner conductive lines 4202a and 4202b is adjustable, as is the spacing $S_2$ between the inner and outer conductive lines 4202a and 4204a, and between the inner and outer conductive lines 4202b and 4204b. In some implementations, by adjusting the layout of the conductive lines, the spacing between the inner and outer conductive lines 4202a and 4204a can differ from that between the inner and outer conductive lines 4202*b* and 4204*b*. By enabling adjustment of the positioning of the conductive lines, it is possible to adjust/tune the spacing of the lines to achieve optimal plasma generation and process performance for given processes.

Figure 43:
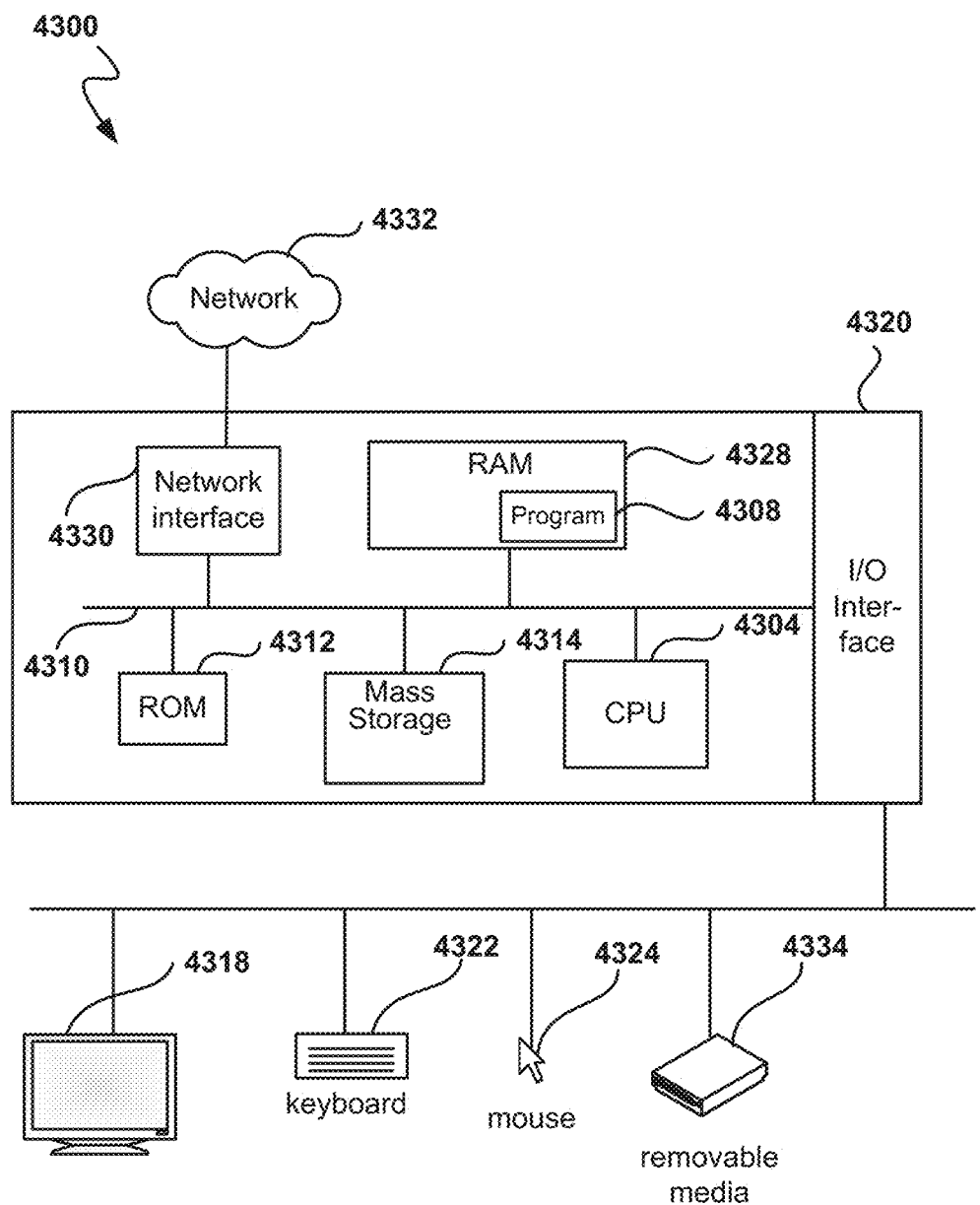
FIG. 43 is a simplified schematic diagram of a computer system for implementing implementations of the present disclosure.

FIG. 43 is a simplified schematic diagram of a computer system for implementing implementations of the present disclosure. It should be appreciated that the methods described herein may be performed with a digital processing system, such as a conventional, general-purpose computer system. Special purpose computers, which are designed or programmed to perform only one function may be used in the alternative. The computer system 4300 includes a central processing unit (CPU) 4304, which is coupled through bus 4310 to random access memory (RAM) 4328, read-only memory (ROM) 4312, and mass storage device 4314. System controller program 4308 resides in random access memory (RAM) 4328, but can also reside in mass storage 4314.

Mass storage device 4314 represents a persistent data storage device such as a floppy disc drive or a fixed disc drive, which may be local or remote. Network interface 4330 provides connections via network 4332, allowing communications with other devices. It should be appreciated that CPU 4304 may be embodied in a general-purpose processor, a special purpose processor, or a specially programmed logic device. Input/Output (I/O) interface 4320 provides communication with different peripherals and is connected with CPU 4304, RAM 4328, ROM 4312, and mass storage device 4314, through bus 4310. Sample peripherals include display 4318, keyboard 4322, cursor control 4324, removable media device 4334, etc.

Display 4318 is configured to display the user interfaces described herein. Keyboard 4322, cursor control (mouse) 4324, removable media device 4334, and other peripherals are coupled to I/O interface 4320 to communicate information in command selections to CPU 4304. It should be appreciated that data to and from external devices may be communicated through I/O interface 4320. The implementations can also be practiced in distributed computing environments where tasks are performed by remote processing devices that are linked through a wire-based or wireless network.

Implementations may be practiced with various computer system configurations including hand-held devices, microprocessor systems, microprocessor-based or programmable consumer electronics, minicomputers, mainframe computers and the like. The implementations can also be practiced in distributed computing environments where tasks are performed by remote processing devices that are linked through a network.

With the above implementations in mind, it should be understood that the implementations can employ various computer-implemented operations involving data stored in computer systems. These operations are those requiring physical manipulation of physical quantities. Any of the operations described herein that form part of the implementations are useful machine operations. The implementations also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more implementations can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Accordingly, the disclosure of the example implementations is intended to be illustrative, but not limiting, of the scope of the disclosures, which are set forth in the following claims and their equivalents. Although example implementations of the disclosures have been described in some detail for purposes of clarity of understanding, it will be apparent that certain changes and modifications can be practiced within the scope of the following claims. In the following claims, elements and/or steps do not imply any particular order of operation, unless explicitly stated in the claims or implicitly required by the disclosure.

The invention claimed is:

1. A plasma process system, comprising:
    a chamber configured to receive a substrate for processing;
    an RF antenna that is configured, when powered, to inductively generate plasma in a process region of the chamber, said RF antenna including,
    a first array of parallel substantially straight conductive lines that are oriented along a first plane, the first array including a first conductive line, a second conductive line, a third conductive line, and a fourth conductive line, the conductive lines of the first array being positioned so as to be disposed over the substrate when present in the chamber for plasma processing;
    wherein the first and second conductive lines are adjacent, wherein the second and third conductive lines are adjacent, and wherein the third and fourth conductive lines are adjacent;
    wherein the RF antenna further includes, a second array of parallel substantially straight conductive lines that are oriented along a second plane that is above the first plane, the second array including a fifth conductive line, a sixth conductive line, a seventh conductive line, and an eighth conductive line, the conductive lines of the second array being positioned so as to be disposed over the substrate when present in the chamber for plasma processing;
    wherein the fifth conductive line is aligned over the first conductive line, the sixth conductive line is aligned over the second conductive line, the seventh conductive line is aligned over the third conductive line, and the eighth conductive line is aligned over the fourth conductive line;

wherein each of the conductive lines has a first end and a second end, such that the first ends of the conductive lines are on a same first side of the first or second array, and the second ends of the conductive lines are on a same second side of the first or second array opposite the first side of the first or second array;

wherein the second end of the first conductive line is connected to the second end of the second conductive line so as to define a first segment that includes the first and second conductive lines connected to each other in series;

wherein the second end of the third conductive line is connected to the second end of the fourth conductive line so as to define a second segment that includes the third and fourth conductive lines connected to each other in series;

wherein the first end of the second conductive line connects to the first end of the fifth conductive line, and the second end of the fifth conductive line connects to the second end of the sixth conductive line, so that the first, second, fifth, and sixth conductive lines are connected in series and form a first looped structure;

wherein the first end of the third conductive line connects to the first end of the eighth conductive line, and the second end of the eighth conductive line connects to the second end of the seventh conductive line, so that the fourth, third, eighth, and seventh conductive lines are connected in series and form a second looped structure;

wherein the first ends of the first and fourth conductive lines are connected to an RF power source;

wherein the first ends of the sixth and seventh conductive lines are connected to ground;

wherein when the RF antenna is powered by the RF power source, current flow in the adjacent first and second conductive lines occurs in an opposite direction, current flow in the adjacent second and third conductive lines occurs in a same direction, current flow in the adjacent third and fourth conductive lines occurs in an opposite direction.

2. The RF antenna of claim 1, wherein the first segment is not connected to the second segment, so that conductive lines of the first segment are not connected to conductive lines of the second segment.

3. The RF antenna of claim 1, wherein adjacent conductive lines of a given segment are connected to each other in series by an end connector.

4. The RF antenna of claim 3, wherein the end connector is configured to produce a change in direction of current flow by enabling current flow between the adjacent conductive lines of the given segment.

5. The RF antenna of claim 4, wherein each given segment has a unitary structure formed as a single piece that includes the end connector and the adjacent conductive lines of the given segment.

6. The RF antenna of claim 1,
wherein the current flow in the adjacent first and second conductive lines occurring in opposite directions defines a first local counter current inductive array;
wherein the current flow in the adjacent third and fourth conductive lines occurring in opposite directions defines a second local counter current inductive array.

7. The RF antenna of claim 1, wherein the conductive lines are configured to occupy an area that covers a surface of the substrate when present in the chamber.

8. The RF antenna of claim 7, wherein the area occupied by the conductive lines is a substantially circular area.

9. The RF antenna of claim 1, wherein the conductive lines have a vertical thickness in the range of approximately 0.1 to 1 inch.

10. The RF antenna of claim 1, wherein the conductive lines have a horizontal width in the range of approximately 0.1 to 0.5 inches.

11. The RF antenna of claim 1, wherein the first and second conductive lines are spaced at approximately 2 to 3 inches, wherein the second and third conductive lines are spaced at approximately 3 to 4 inches, and wherein the third and fourth conductive lines are spaced at approximately 2 to 3 inches.

* * * * *